US012336213B2

(12) United States Patent
Chen et al.

(10) Patent No.: US 12,336,213 B2
(45) Date of Patent: Jun. 17, 2025

(54) MULTI-GATE SEMICONDUCTOR DEVICE AND METHOD FOR FORMING THE SAME

(71) Applicant: Taiwan Semiconductor Manufacturing Company, Ltd., Hsinchu (TW)

(72) Inventors: I-Sheng Chen, Taipei (TW); Tzu-Chiang Chen, Hsinchu (TW); Cheng-Hsien Wu, Hsinchu (TW); Ling-Yen Yeh, Hsinchu (TW); Carlos H. Diaz, Los Altos Hills, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 6 days.

(21) Appl. No.: 18/164,965

(22) Filed: Feb. 6, 2023

(65) Prior Publication Data
US 2023/0187552 A1 Jun. 15, 2023

Related U.S. Application Data

(62) Division of application No. 17/011,274, filed on Sep. 3, 2020, now Pat. No. 11,575,046, which is a division
(Continued)

(51) Int. Cl.
*H10D 30/62* (2025.01)
*B82Y 10/00* (2011.01)
(Continued)

(52) U.S. Cl.
CPC ............. *H10D 30/62* (2025.01); *B82Y 10/00* (2013.01); *H01L 21/76877* (2013.01);
(Continued)

(58) Field of Classification Search
CPC ............. H01L 29/785; H01L 21/76877; H01L 21/823431; H01L 21/823821; H01L 27/088; H01L 27/0886; H01L 27/0924; H01L 29/0847; H01L 29/401; H01L 29/66484; H01L 29/66545; H01L 29/6656; H01L 29/775; H01L 29/78696; H01L 21/82345; H01L 21/823842; H01L 21/82385; H01L 29/66795; B82Y 10/00; H10D 30/62; H10D 30/024; H10D 30/6735; H10D 30/6757; H10D 62/116; H10D 62/121; H10D 64/017; H10D 64/021;
(Continued)

(56) References Cited

U.S. PATENT DOCUMENTS 9,929,235 B1* 3/2018 Yang ................ H10D 30/62
2015/0137271 A1* 5/2015 Cai .................. H01L 29/66545
257/411
(Continued)

*Primary Examiner* — Thanhha S Pham
(74) *Attorney, Agent, or Firm* — Birch, Stewart, Kolasch & Birch, LLP

(57) ABSTRACT

A multi-gate semiconductor device includes a plurality of nanostructures vertically stacked over a substrate, a gate dielectric layer wrapping around the plurality of nanostructures, a gate conductive structure over the gate dielectric layer, and a first insulating spacer alongside the gate conductive structure and over the plurality of nanostructures. The first insulating spacer is in direct contact with the gate conductive structure and the gate dielectric layer.

19 Claims, 41 Drawing Sheets

Related U.S. Application Data of application No. 16/380,135, filed on Apr. 10, 2019, now Pat. No. 10,770,592, which is a division of application No. 15/793,521, filed on Oct. 25, 2017, now Pat. No. 10,269,965.

(51) Int. Cl.

| | | |
|---|---|---|
| *H01L 21/768* | (2006.01) | |
| *H10D 30/01* | (2025.01) | |
| *H10D 30/43* | (2025.01) | |
| *H10D 30/67* | (2025.01) | |
| *H10D 62/10* | (2025.01) | |
| *H10D 62/13* | (2025.01) | |
| *H10D 64/01* | (2025.01) | |
| *H10D 84/01* | (2025.01) | |
| *H10D 84/03* | (2025.01) | |
| *H10D 84/83* | (2025.01) | |
| *H10D 84/85* | (2025.01) | |
| *H10D 88/00* | (2025.01) | |

(52) U.S. Cl.
CPC ......... *H10D 30/014* (2025.01); *H10D 30/023* (2025.01); *H10D 30/024* (2025.01); *H10D 30/43* (2025.01); *H10D 30/6735* (2025.01); *H10D 30/6757* (2025.01); *H10D 62/116* (2025.01); *H10D 62/121* (2025.01); *H10D 62/151* (2025.01); *H10D 64/01* (2025.01); *H10D 64/017* (2025.01); *H10D 64/021* (2025.01); *H10D 84/0158* (2025.01); *H10D 84/0193* (2025.01); *H10D 84/038* (2025.01); *H10D 84/83* (2025.01); *H10D 84/834* (2025.01); *H10D 84/853* (2025.01); *H10D 88/00* (2025.01); *H10D 88/01* (2025.01); *H10D 84/0128* (2025.01); *H10D 84/014* (2025.01); *H10D 84/0177* (2025.01); *H10D 84/0179* (2025.01)

(58) Field of Classification Search
CPC .......... H10D 84/0158; H10D 84/0193; H10D 84/834; H10D 84/853
See application file for complete search history.

(56) References Cited

U.S. PATENT DOCUMENTS

| | | |
|---|---|---|
| 2017/0141112 A1 | 5/2017 | Ching et al. |
| 2017/0154973 A1* | 6/2017 | Ching ............... H01L 29/78696 |
| 2017/0170023 A1* | 6/2017 | Chung ................. H01L 23/485 |
| 2018/0083113 A1 | 3/2018 | Balakrishnan et al. |
| 2018/0190829 A1* | 7/2018 | Song ................. H01L 29/42392 |

* cited by examiner

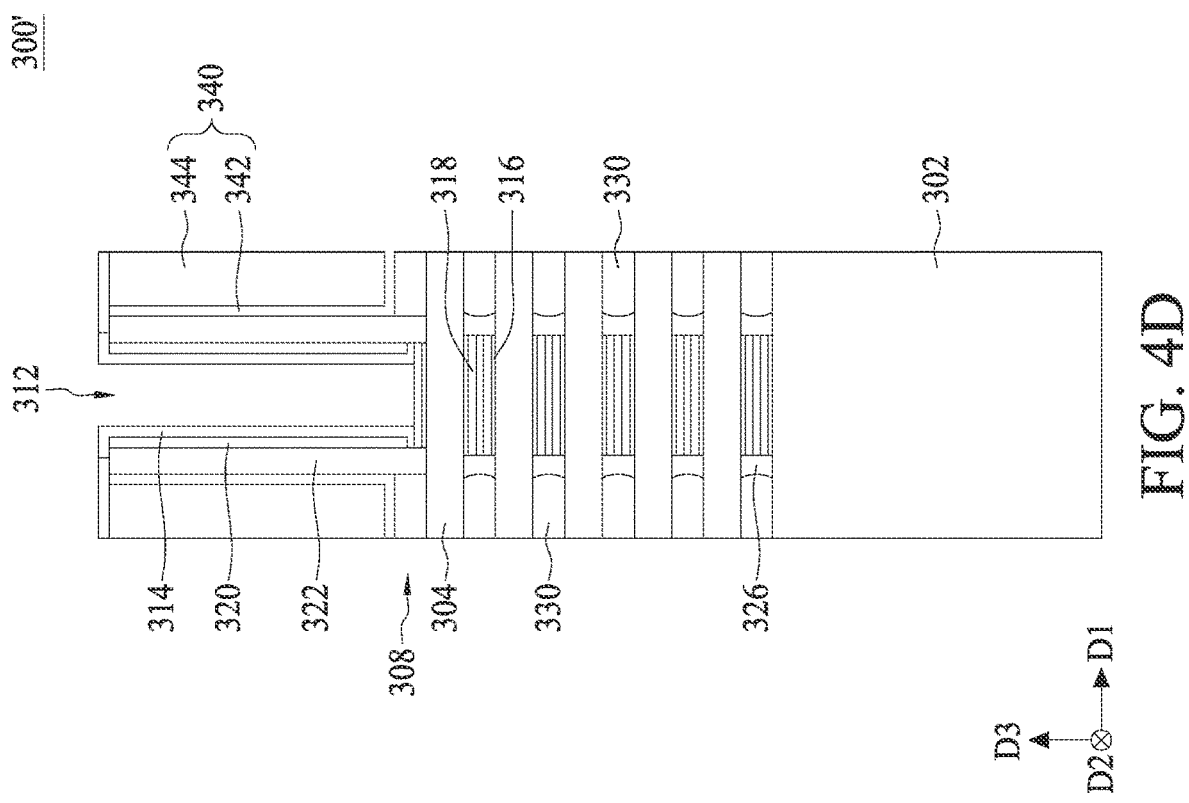
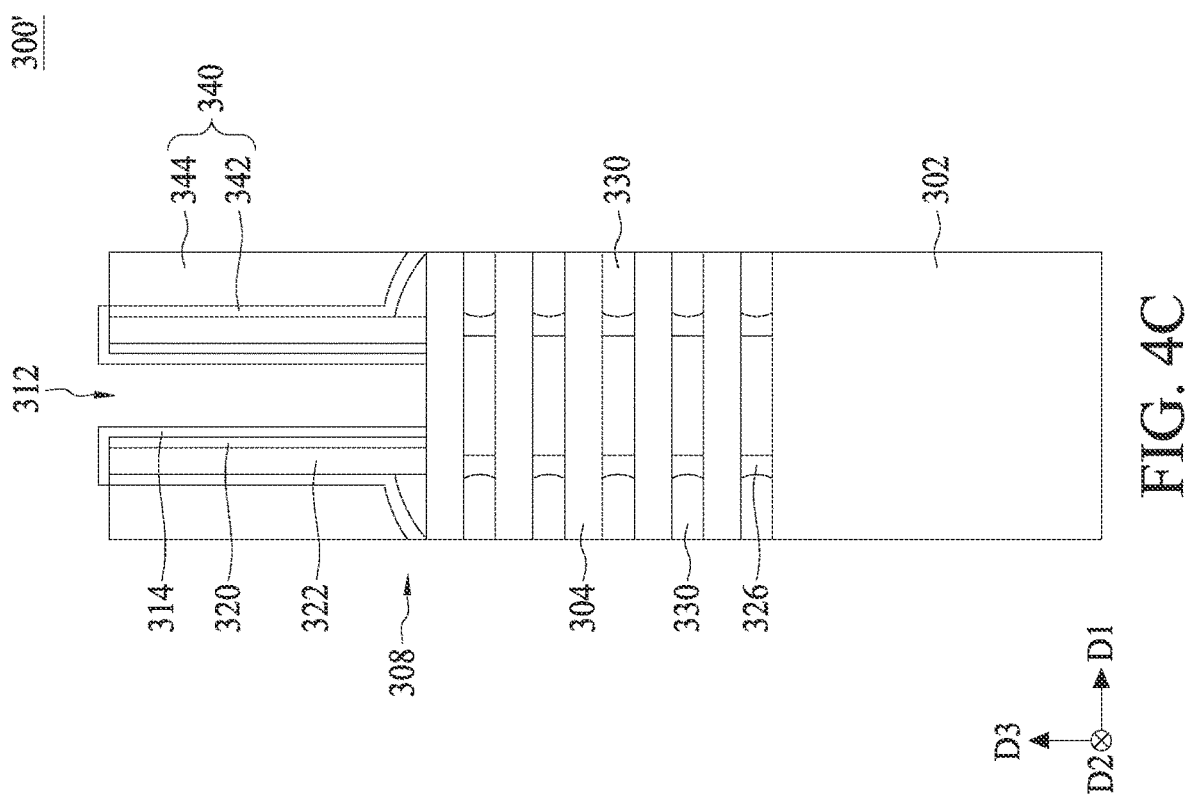

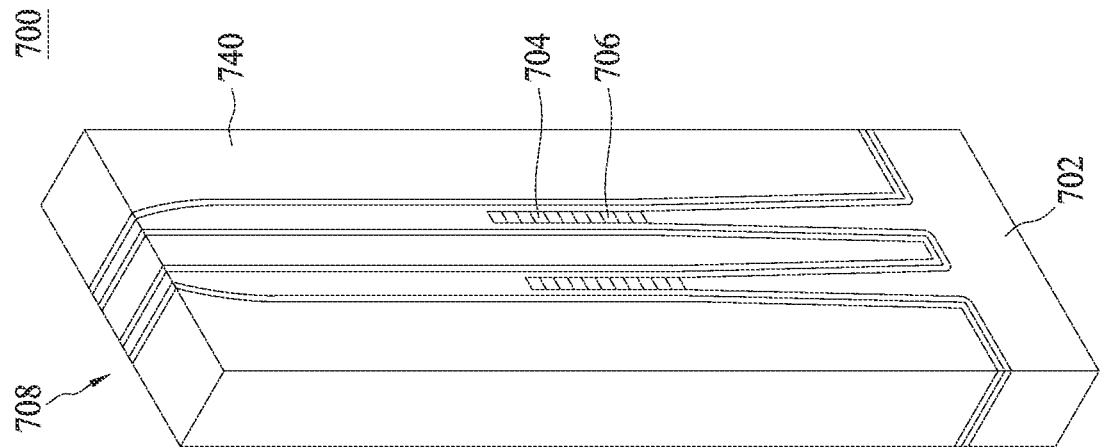
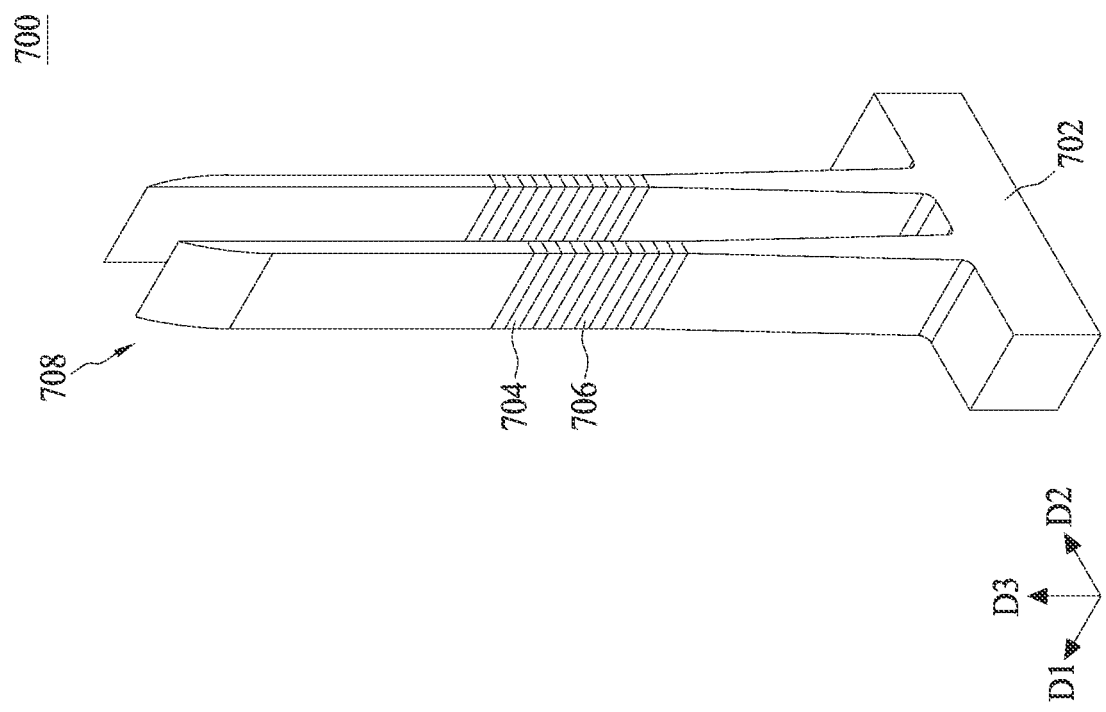
FIG. 10A
FIG. 10B

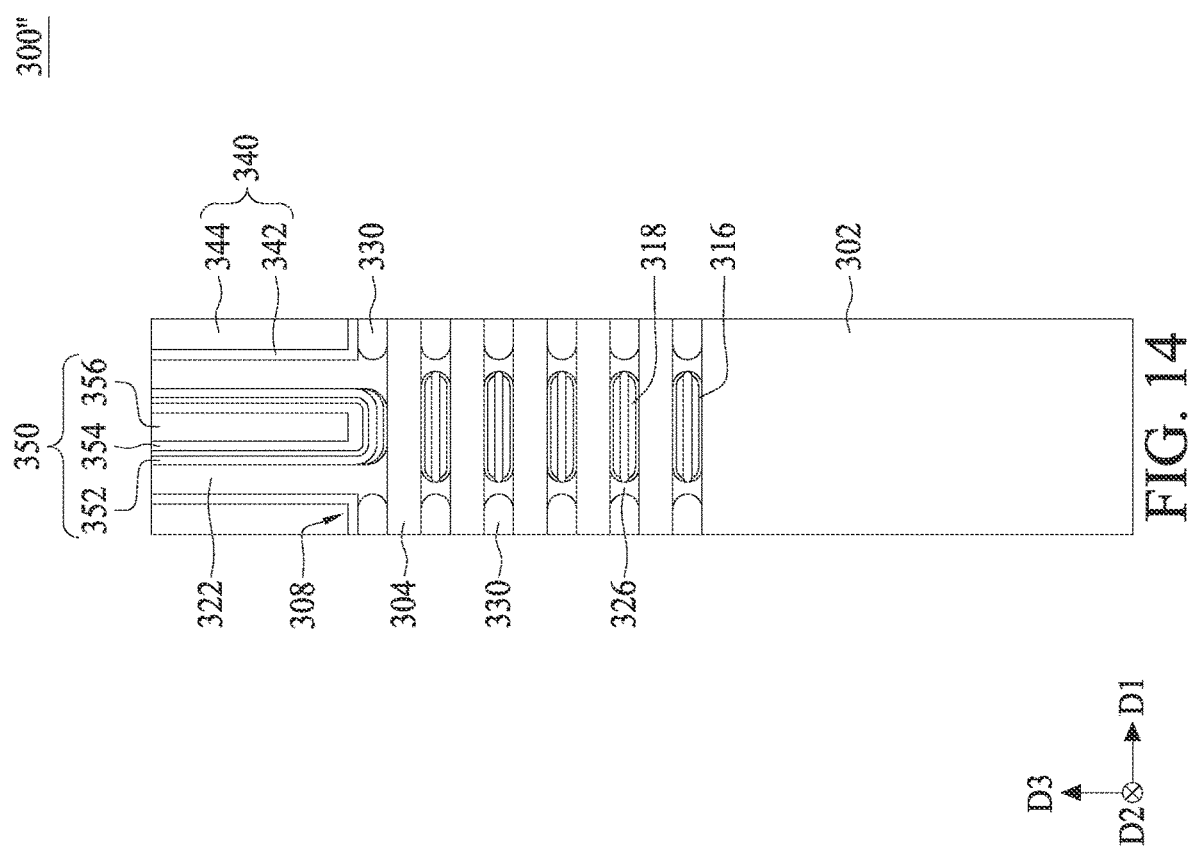

MULTI-GATE SEMICONDUCTOR DEVICE AND METHOD FOR FORMING THE SAME

PRIORITY CLAIM AND CROSS-REFERENCE

This application is a divisional application of U.S. patent application Ser. No. 17/011,274, filed on Sep. 3, 2020, entitled of "MULTI-GATE SEMICONDUCTOR DEVICE AND METHOD FOR FORMING THE SAME," which is a divisional application of U.S. patent application Ser. No. 16/380,135, filed on Apr. 10, 2019 (now U.S. Pat. No. 10,770,592) and entitled of "MULTI-GATE SEMICONDUCTOR DEVICE AND METHOD FOR FORMING THE SAME," which is a divisional application of U.S. patent application Ser. No. 15/793,521, filed on Oct. 25, 2017 (now U.S. Pat. No. 10,269,965) and entitled of "MULTI-GATE SEMICONDUCTOR DEVICE AND METHOD FOR FORMING THE SAME," which is incorporated herein by reference in its entirety.

BACKGROUND

As the semiconductor industry has progressed into nanometer technology process nodes in pursuit of higher device density, higher performance, and lower costs, challenges from both fabrication and design issues have resulted in the development of three-dimensional designs, such as multi-gate field effect transistor (FET) including a fin FET (FinFET) and a gate-all-around (GAA) FET. In a FinFET, a gate electrode is adjacent to three side surfaces of a channel region with a gate dielectric layer interposed therebetween. Because the gate structure surrounds the fin on three surfaces, the transistor essentially has thee gates controlling the current through the fin or channel region. However, the fourth side that is the bottom part of the channel region is far away from gate electrode and this is not under close gate control. Different from FinFET, in a GAA FET all side surfaces of the channel region are surrounded by the gate electrode, which allows for fuller depletion in the channel region and results in less short-channel effects due to a steeper sub-threshold current swing (SS) and smaller drain induced barrier lower (DIBL).

Although existing GAA FET devices and methods of fabricating GAA FET devices have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A through FIG. 4D illustrate operations for forming the gate dielectric layer according to aspects of the present disclosure in one or more embodiments.

FIG. 12 through FIG. 14 illustrate a multi-gate semiconductor device at various fabrication stages constructed according to aspects of the present disclosure in one or more embodiments.

DETAILED DESCRIPTION

Figure 1:
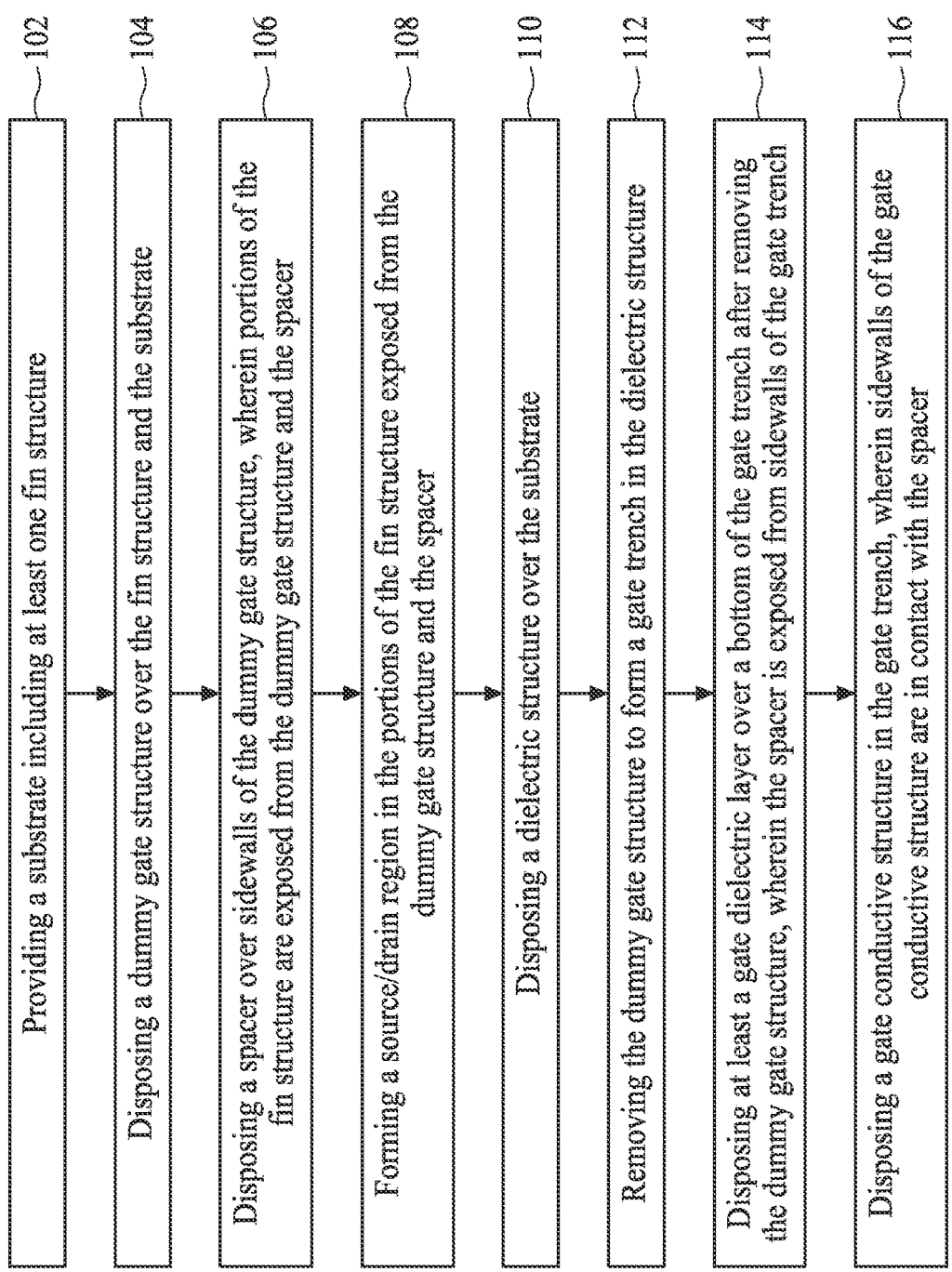
FIG. 1 shows a flow chart representing a method for forming a multi-gate semiconductor device according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms.

These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a dummy layer is formed over a substrate and patterned using a photolithography process. Spacers are formed alongside the patterned dummy layer using a self-aligned process. The dummy layer is then removed, and the remaining spacers may then be used to pattern the GAA structure.

It is also noted that the present disclosure presents embodiments in the form of multi-gate transistors or fin-type multi-gate transistors referred to herein as FinFET devices. The FinFET devices may be GAA devices, Omega-gate (a-gate) devices, Pi-gate (H-gate) devices, dual-gate devices, tri-gate devices, bulk devices, silicon-on-insulator (SOI) devices, and/or other configurations. One of ordinary skill may recognize other examples of semiconductor devices that may benefit from aspects of the present disclosure.

FIG. 1 is a flow chart representing a method for forming a multi-gate semiconductor device 10 according to aspects of the present disclosure. The method for forming the multi-gate semiconductor device 10 includes an operation 102, providing a substrate including at least one fin structure. The method for forming the multi-gate semiconductor device 10 further includes an operation 104, disposing a dummy gate structure over the fin structure and the substrate. The method for forming the multi-gate semiconductor device 10 further includes an operation 106, disposing a spacer over sidewalls of the dummy gate structure, wherein portions of the fin structure are exposed from the dummy gate structure and the spacer. The method for forming the multi-gate semiconductor device 10 further includes an operation 108, forming a source/drain region in the portions of the fin structure exposed from the dummy gate structure and the spacer. The method for forming the multi-gate semiconductor device 10 further includes an operation 110, disposing a dielectric structure over the substrate. The method for forming the multi-gate semiconductor device 10 further includes an operation 112, removing the dummy gate structure to form a gate trench in the dielectric structure. The method for forming the multi-gate semiconductor device 10 further includes an operation 114, disposing at least a gate dielectric layer over a bottom of the gate trench after removing the dummy gate structure, wherein the spacer is exposed from sidewalls of the gate trench. The method for forming the multi-gate semiconductor device 10 further includes an operation 116, disposing a gate conductive structure in the gate trench, wherein sidewalls of the gate conductive structure are in contact with the spacer. The method for forming the multi-gate semiconductor device 10 will be further described according to one or more embodiments. It should be noted that the operations of the method for forming the multi-gate semiconductor device 10 may be rearranged or otherwise modified within the scope of the various aspects. It is further noted that additional processes may be provided before, during, and after the method 10, and that some other processes may only be briefly described herein. Thus other implementations are possible within the scope of the various aspects described herein.

Figure 2:
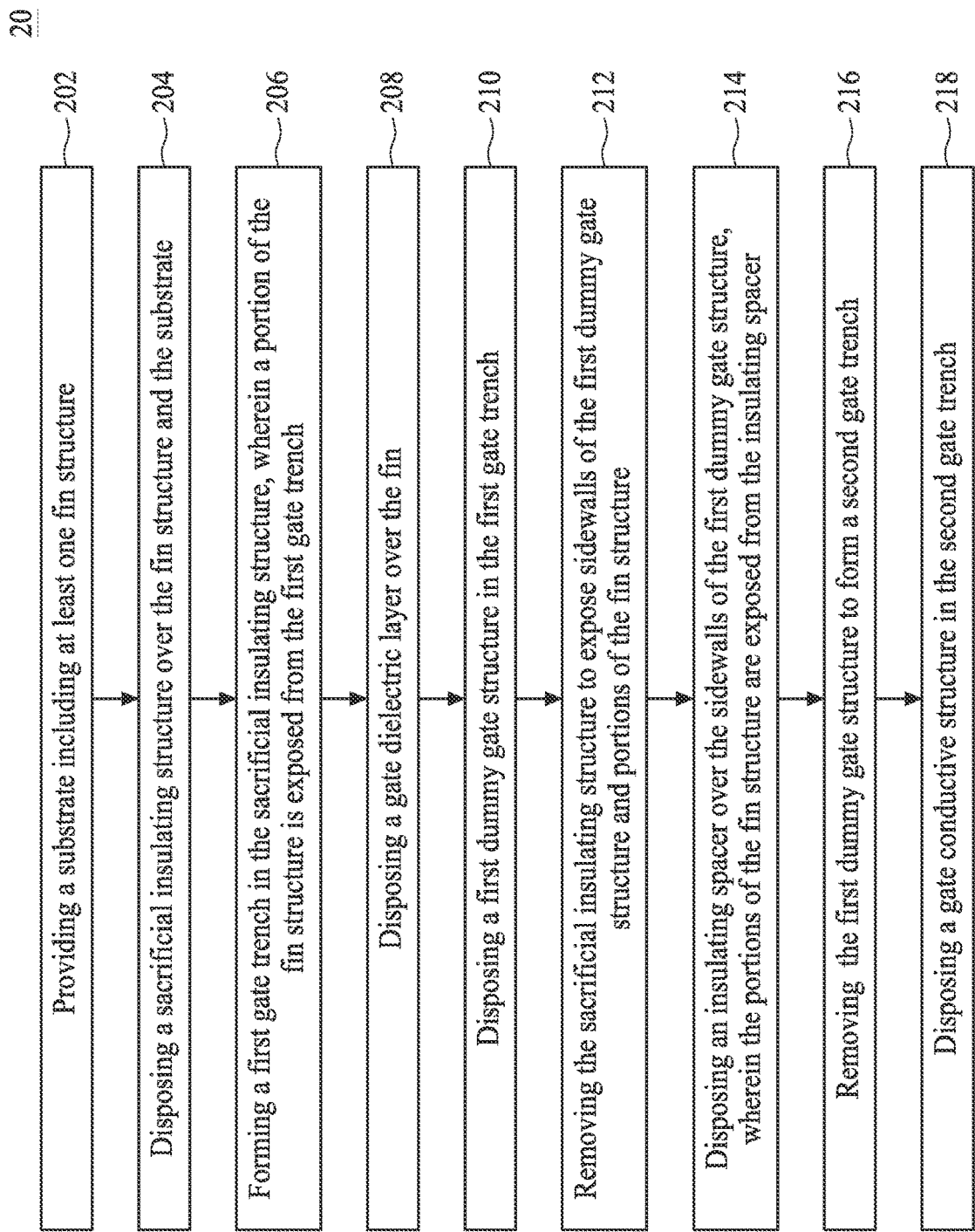
FIG. 2 shows a flow chart representing a method for forming a multi-gate semiconductor device according to aspects of the present disclosure.

FIG. 2 is a flow chart representing a method for forming a multi-gate semiconductor device 20 according to aspects of the present disclosure. The method for forming the multi-gate semiconductor device 20 includes an operation 202, providing a substrate including at least one fin structure. The method for forming the multi-gate semiconductor device 20 further includes an operation 204, disposing a sacrificial insulating structure over the fin structure and the substrate. The method for forming the multi-gate semiconductor device 20 further includes an operation 206, forming a first gate trench in the sacrificial insulating structure, wherein a portion of the fin structure is exposed from the first gate trench. The method for forming the multi-gate semiconductor device 20 further includes an operation 208, disposing a gate dielectric layer over the fin structure and sidewalls of the first gate trench. The method for forming the multi-gate semiconductor device 20 further includes an operation 210, disposing a first dummy gate structure in the first gate trench. The method for forming the multi-gate semiconductor device 20 further includes an operation 212, removing the sacrificial insulating structure and a portion of the gate dielectric layer to exposed sidewalls of the first dummy gate structure and the fin structure. The method for forming the multi-gate semiconductor device 20 further includes an operation 214, disposing an insulating spacer over the sidewalls of the first dummy gate structure, wherein portions of the fin structure are exposed from the insulating spacer. The method for forming the multi-gate semiconductor device 20 further includes an operation 216, removing the first dummy gate structure to form a second gate trench. The method for forming the multi-gate semiconductor device 20 further includes an operation 218, disposing a gate conductive structure in the second gate trench. The method for forming the multi-gate semiconductor device 20 will be further described according to one or more embodiments. It should be noted that the operations of the method for forming the multi-gate semiconductor device 20 may be rearranged or otherwise modified within the scope of the various aspects. It is further noted that additional processes may be provided before, during, and after the method 20, and that some other processes may only be briefly described herein. Thus other implementations are possible within the scope of the various aspects described herein.

Figure 3B:
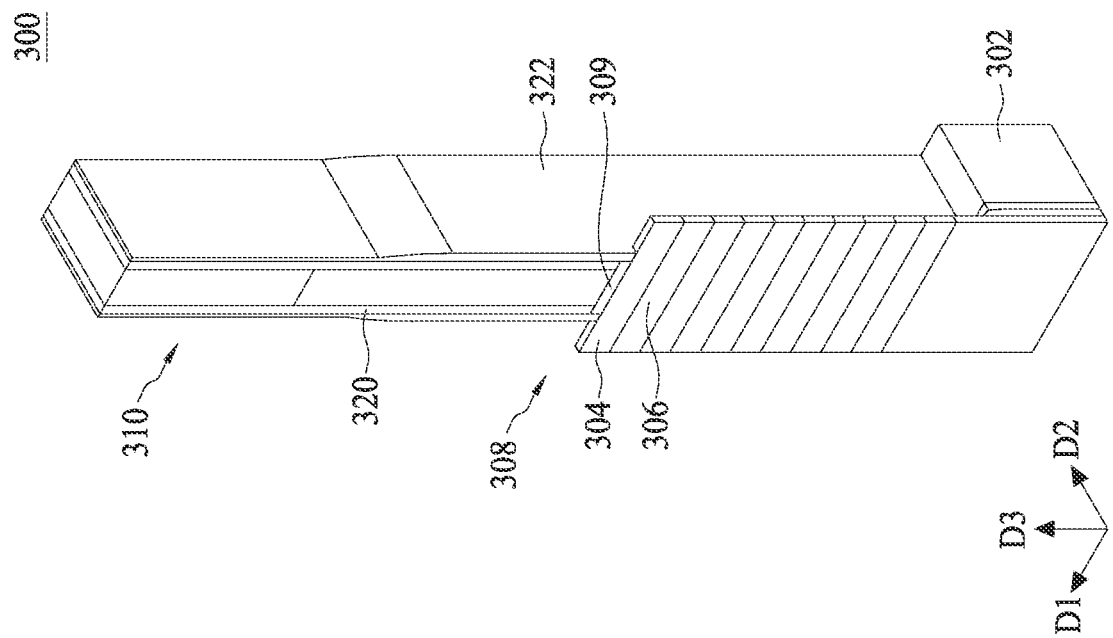
FIG. 3A through FIG. 3N illustrate a multi-gate semiconductor device at various fabrication stages constructed according to aspects of the present disclosure in one or more embodiments.
Figure 3A:
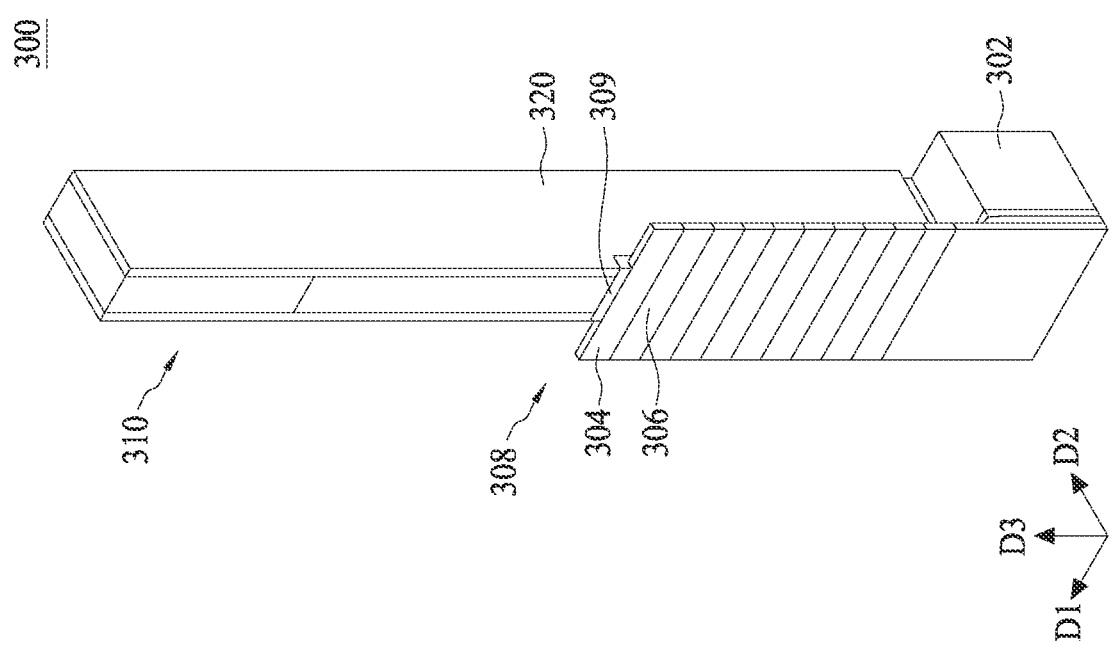
Figure 3D:
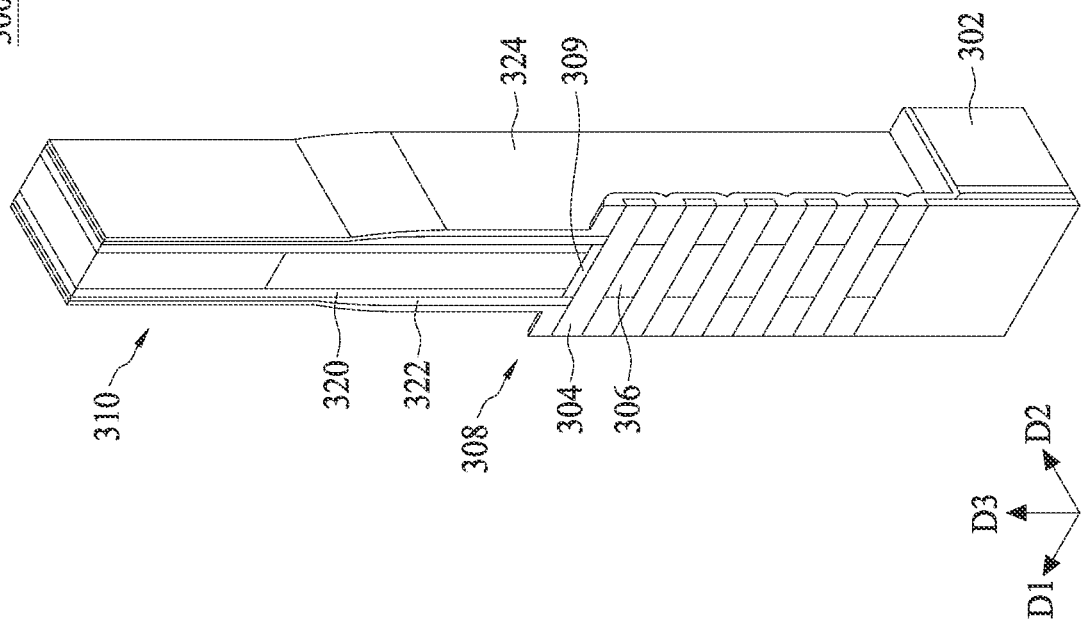
Figure 3C:
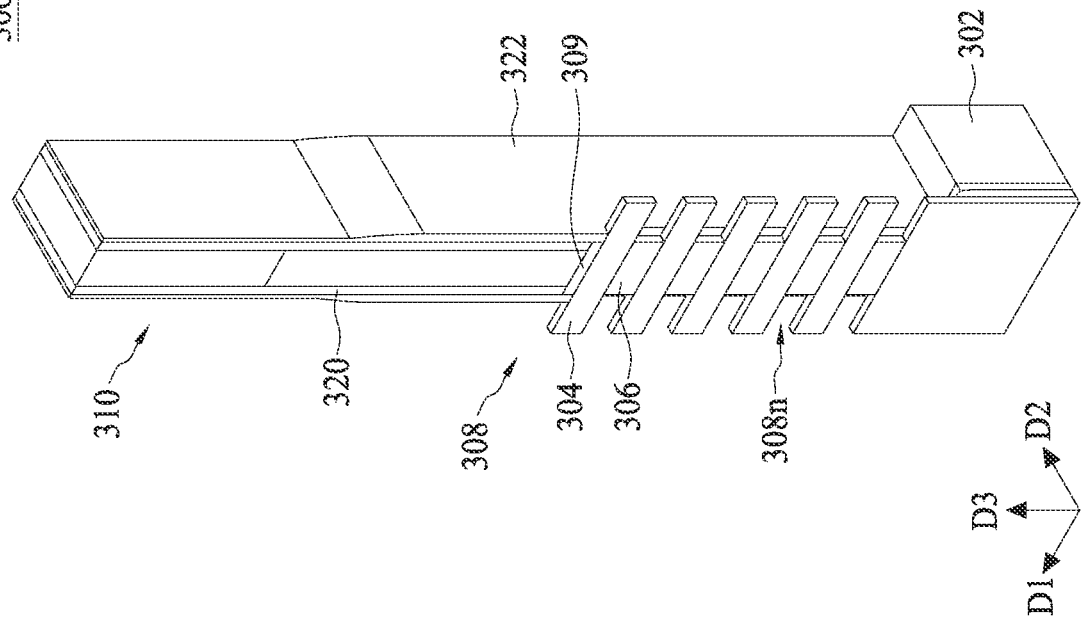
Figure 3F:
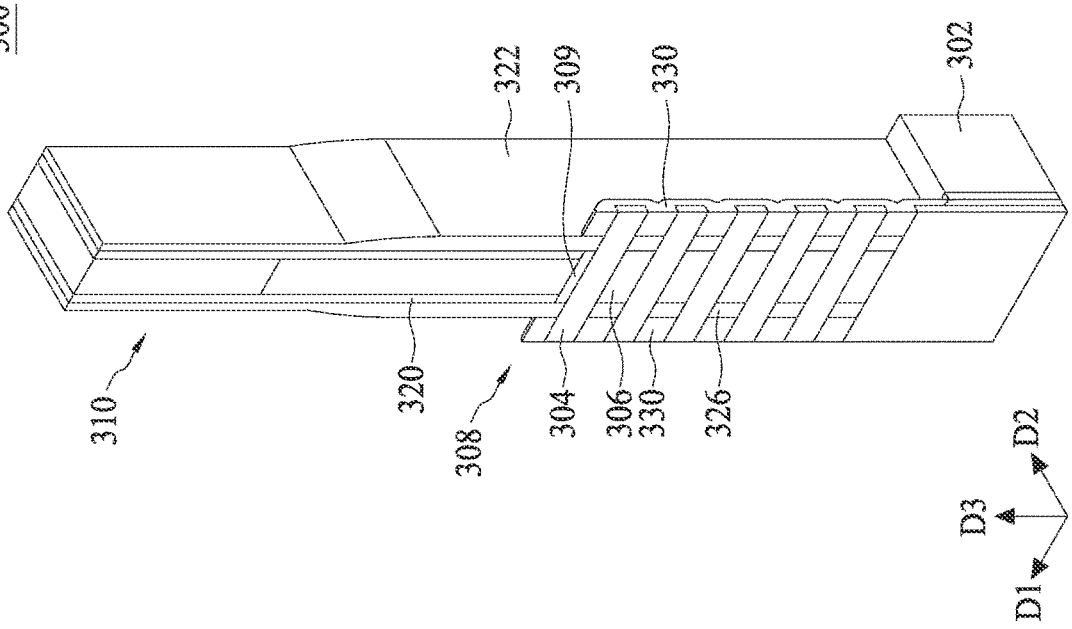
Figure 3E:
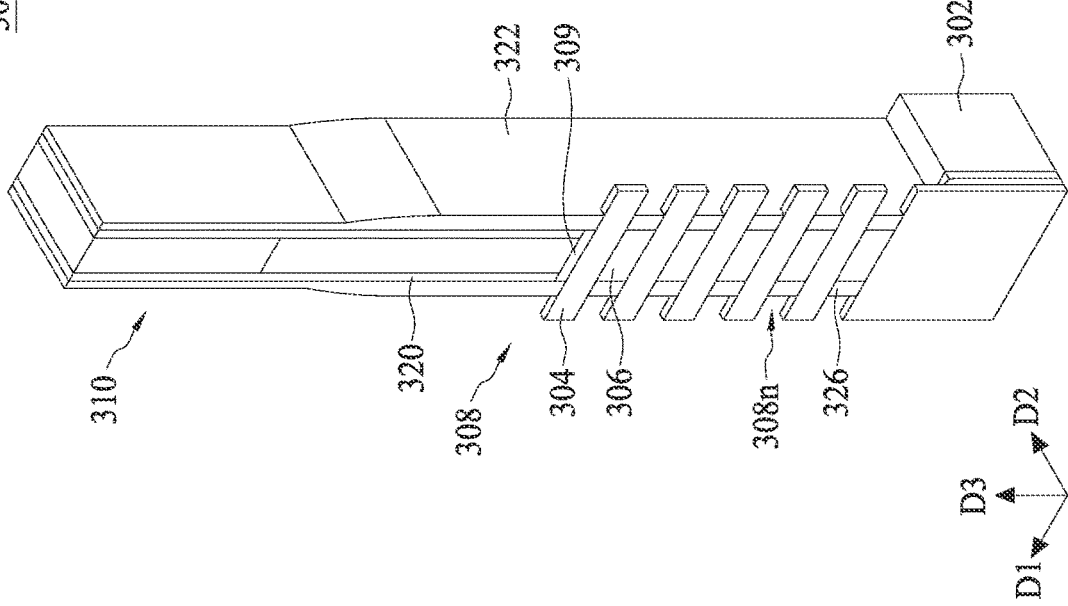
Figure 3H:
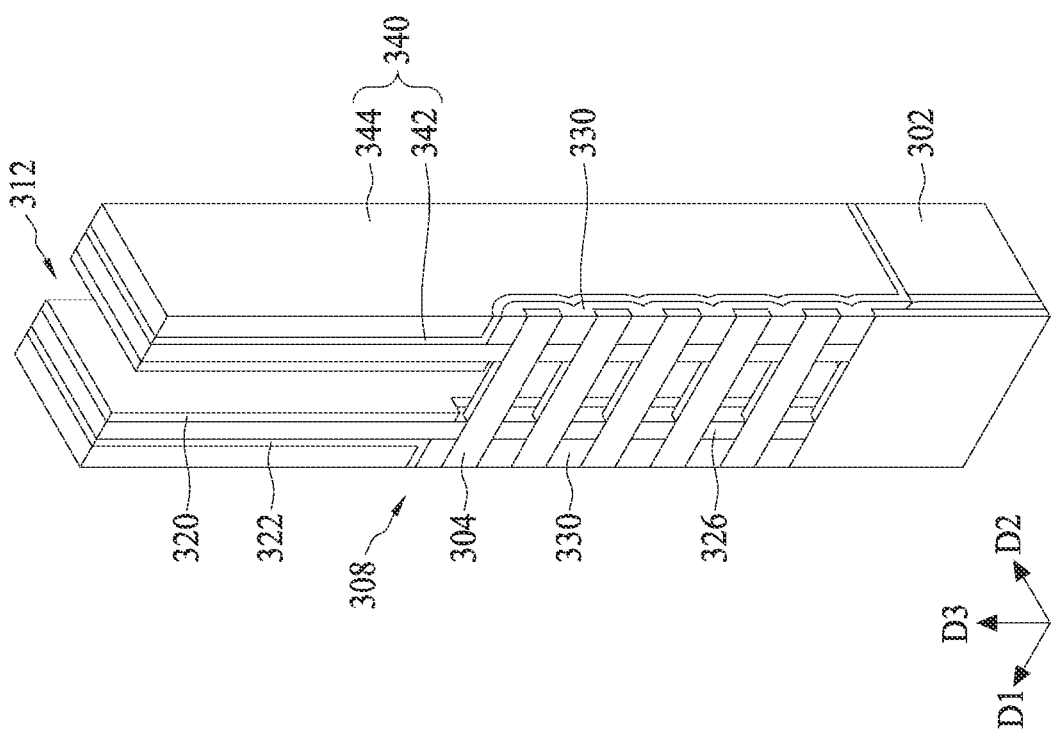
Figure 3G:
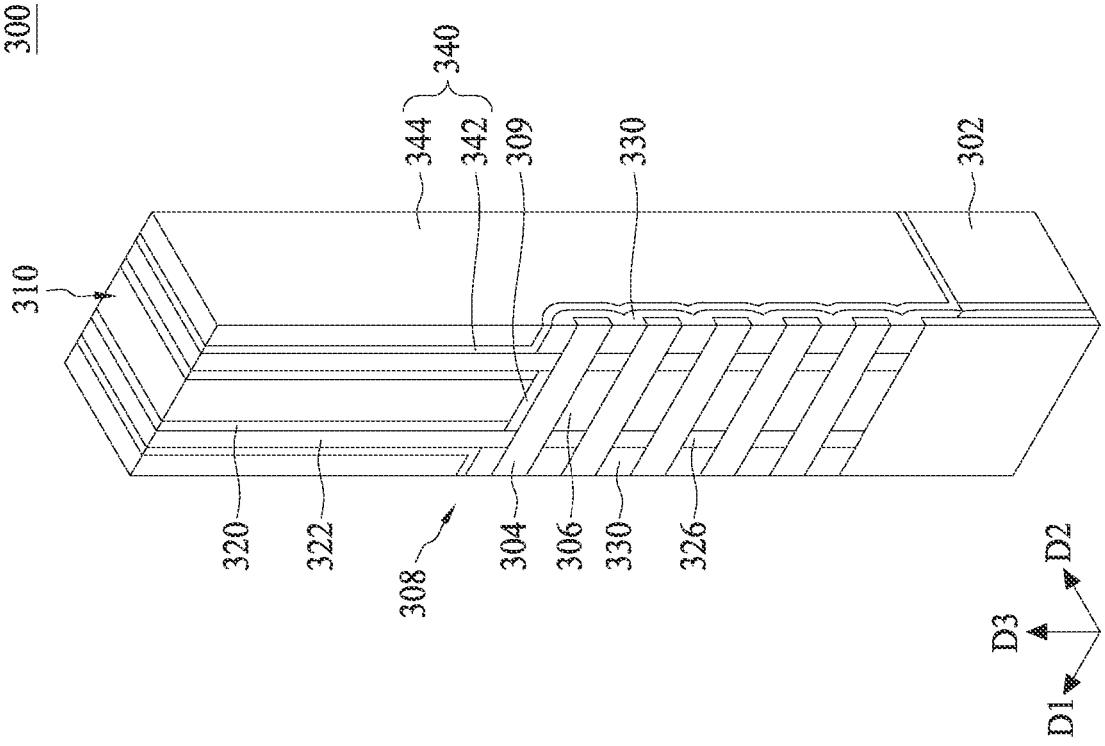
Figure 3J:
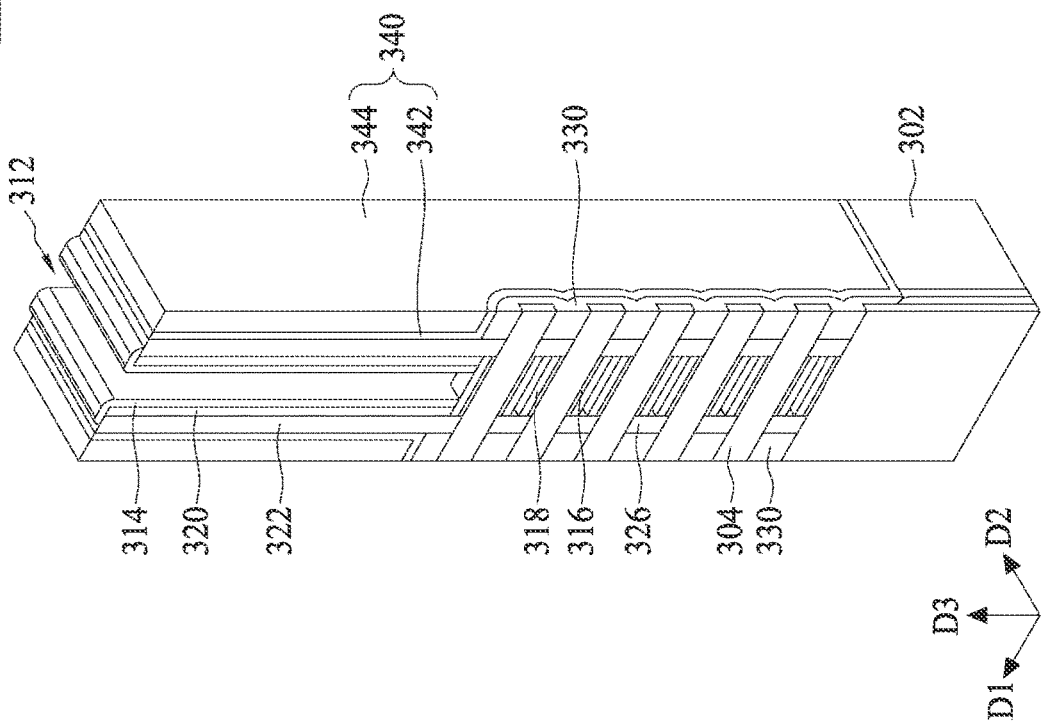
Figure 3I:
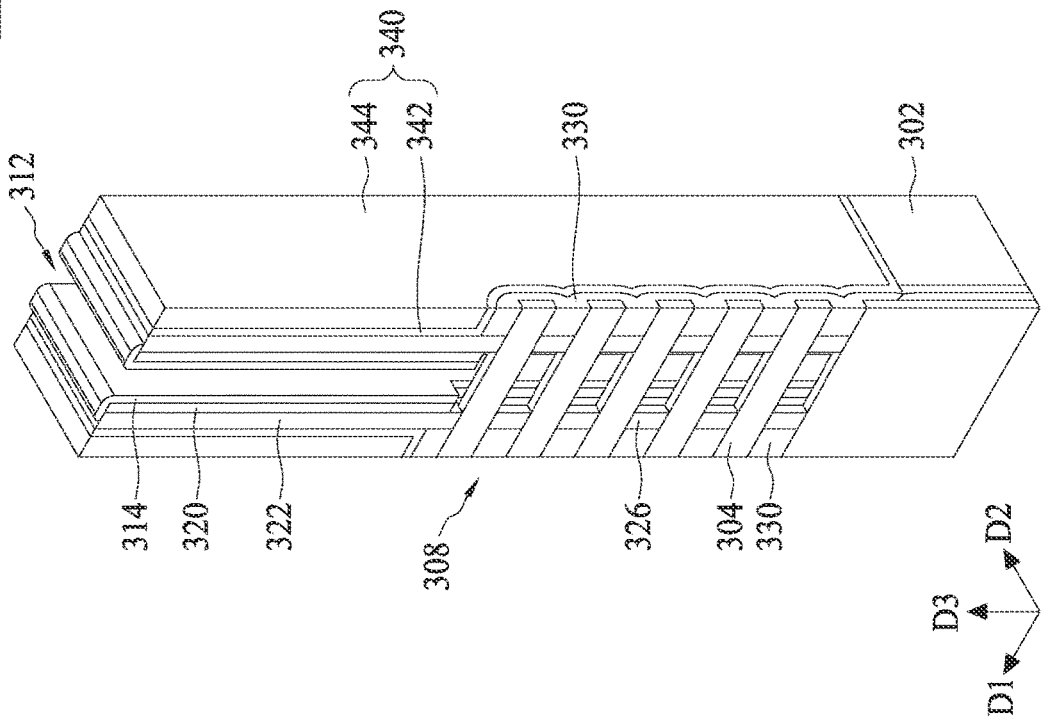
Figure 3L:
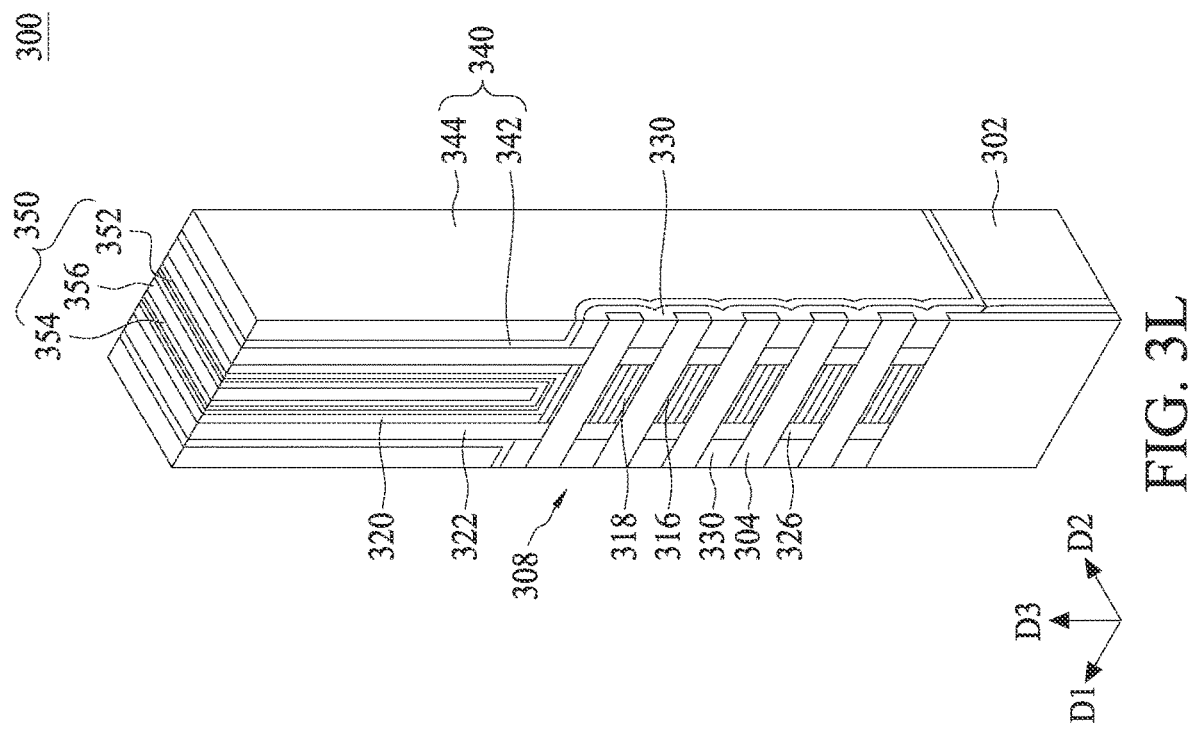
Figure 3K:
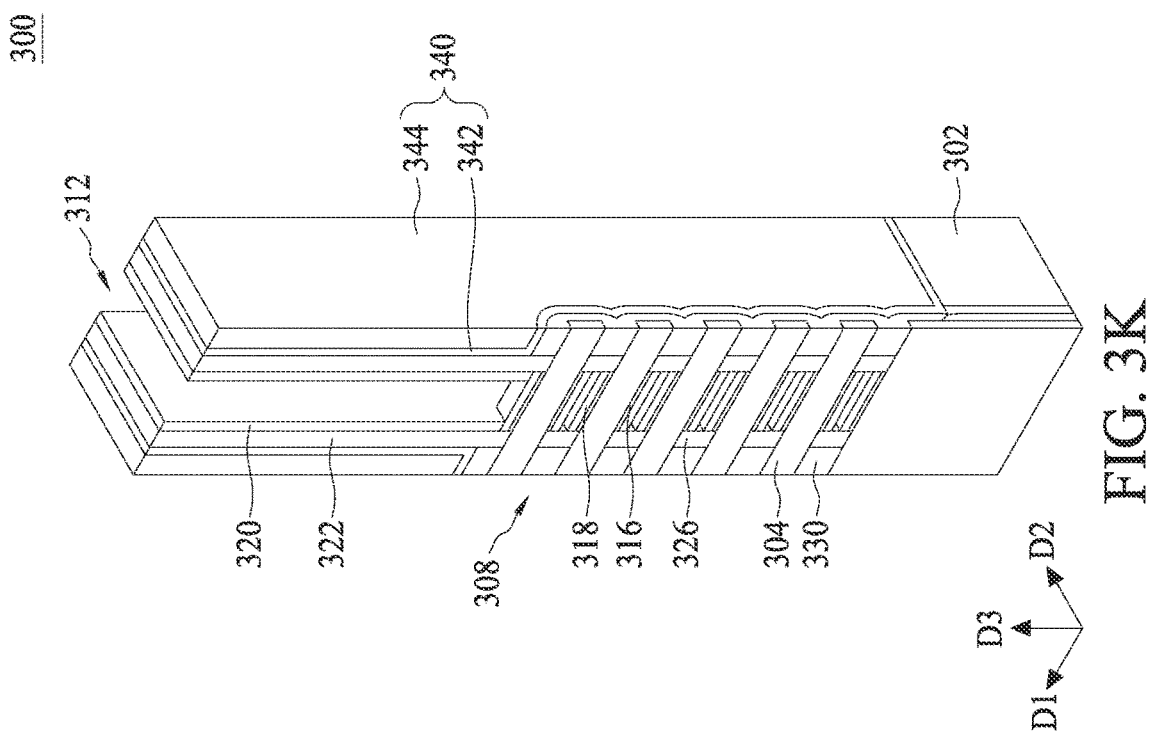
Figure 3N:
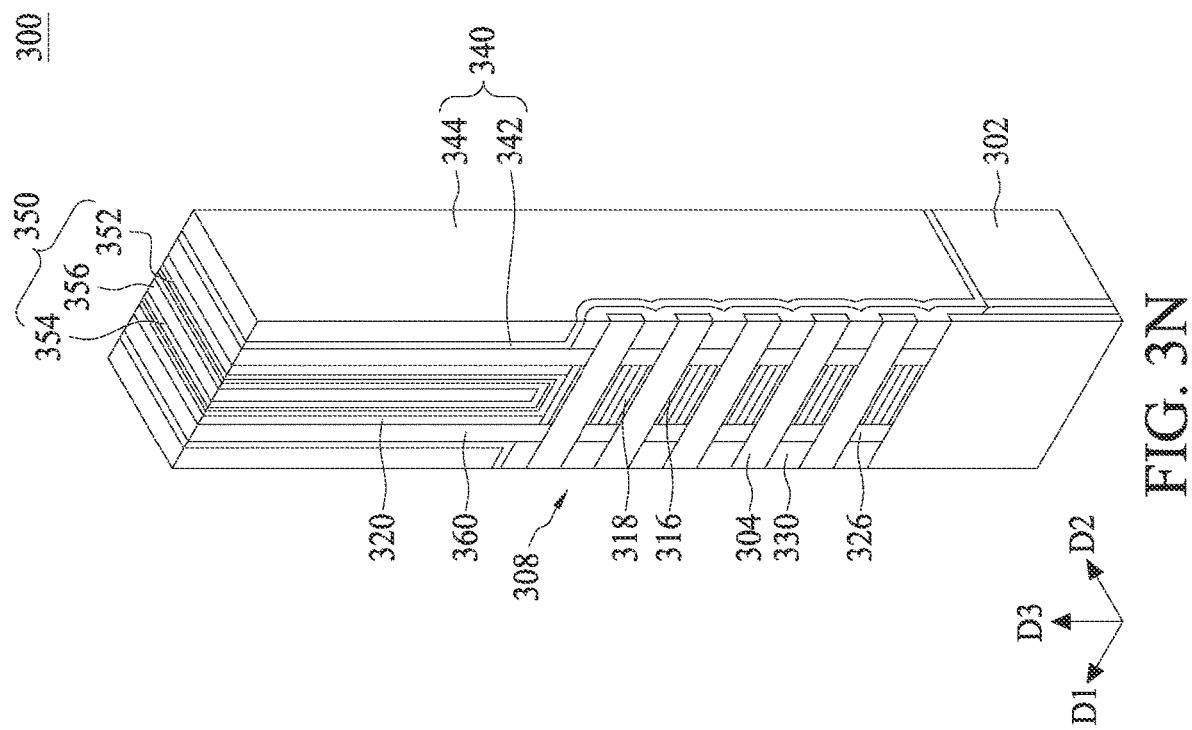

FIG. 3A through FIG. 3N are drawings illustrating a multi-gate semiconductor device 300 at various fabrication stages constructed according to aspects of the present disclosure in one or more embodiments. Referring to FIG. 3A, a substrate 302 is provided. In some embodiments, the substrate 302 may be a semiconductor substrate such as a silicon substrate. The substrate 302 may also include other semiconductors such as germanium (Ge), silicon carbide (SiC), silicon germanium (SiGe), or diamond. Alternatively, the substrate 302 may include a compound semiconductor and/or an alloy semiconductor. The substrate 302 may include various layers, including conductive or insulating layers formed on a semiconductor substrate. The substrate 302 may include various doping configurations depending on design requirements as is known in the art. For example, different doping profiles (e.g., n wells, p wells) may be formed on the substrate 302 in regions designed for different device types (e.g., n-type field effect transistors (NFET), p-type field effect transistors (PFET)). The suitable doping may include ion implantation of dopants and/or diffusion processes. The substrate 302 typically has isolation features (e.g., shallow trench isolation (STI) features) (not shown) interposing the regions providing different device types. Further, the substrate 302 may optionally include an epitaxial layer (epi-layer), may be strained for performance enhancement, may include a SOI structure, and/or have other suitable enhancement features. A stack including semiconductor layers are formed over the substrate 302. In some embodiments, a strain relaxed buffer (SRB) layer (not shown) can be formed over the substrate 302. The SRB layer may be different in composition from the substrate 302 in order to create lattice strain at the interface with the substrate 302. For example, in some embodiments, the substrate 302 includes silicon and is substantially free of germanium while the SRB layer includes SiGe.

Still referring to FIG. 3A, a stack including semiconductor layers are formed over the substrate 302. In embodiments that include an SRB layer disposed on the substrate 302, the stack of semiconductor layers may be disposed on the SRB layer. The stack of semiconductor layers may include alternating layers of different compositions. For example, in some embodiments, the stack includes semiconductor layers 304 of a first composition alternating with semiconductor layers 306 of a second composition. By way of example, growth of the layers of the stack may be performed by a molecular beam epitaxy (MBE) process, a metalorganic chemical vapor deposition (MOCVD) process, and/or other suitable epitaxial growth processes. Although five semiconductor layers 304 and five semiconductor layers 306 are shown, it is understood that the stack may include any number of layers of any suitable composition with various examples including between 2 and 10 semiconductor layer 304 and between 2 and 10 semiconductor layers 306. As explained below, the different compositions of the layers in the stack (e.g., semiconductor layers 304 and semiconductor layers 306) may be used to selectively process some of the layers. Accordingly, the compositions may have different oxidation rates, etchant sensitivity, and/or other differing properties. The semiconductor layers 304 and 306 may have thicknesses chosen based on device performance considerations. In some embodiments, the semiconductor layers 304 are substantially uniform in thickness, and the semiconductor layers 306 are substantially uniform in thickness.

In some embodiments, either of the semiconductor layers 304 and 306 may include Si. In some embodiments, either of the semiconductor layers 304 and 306 may include other materials such as Ge, a compound semiconductor such as SiC, gallium arsenide (GaAs), gallium phosphide (GaP), indium phosphide (InP), indium arsenide (InAs), and/or indium antimonide (InSb), an alloy semiconductor such as SiGe, GaAsP, AlInAs, AlGaAs, InGaAs, GaInP, and/or GaInAsP, or combinations thereof. In some embodiments, the semiconductor layers 304 and 306 may be undoped or substantially dopant-free, where for example, no doping is performed during the epitaxial growth process. Alternatively, the semiconductor layers 306 may be doped. For example, the semiconductor layers 304 or 306 may be doped with a p-type dopant such as boron (B), aluminum (Al), In, and Ga for forming a p-type channel, or an n-type dopant such as P, As, Sb, for forming an n-type channel.

Referring back to FIG. 3A, at least one fin structure 308 is formed over the substrate 302 from the stack of semiconductor layers 304/306. The fin structure 308 may be fabricated using suitable operations including photolithography and etch operations. In some embodiments, forming the fin structure 308 may further include a trim process to decrease the width and/or the height of the fin structure 308. The trim process may include wet or dry etching processes. The height and width of the fin structure 308 may be chosen based on device performance considerations. Further, the fin structure 308 can be extended along a first direction D1 as shown in FIG. 3A. Accordingly, the substrate 302 including the at least one fin structure 308 is provided according to operation 102. Further, in some embodiments, a liner 309 can be formed over the fin structure 308 and the substrate 302.

Still referring to FIG. 3A, a dummy gate structure 310 is disposed over the fin structure 308 and the substrate 302 according to operation 104. The dummy gate structure 310 may be replaced at a later processing stage by a high-K dielectric layer (HK) and metal gate electrode (MG) as discussed below. In some embodiments, the dummy gate structure 310 is formed over the substrate 302 and extended along a second direction D2, which is not parallel with the first direction D1. Additionally, the first direction D1 and the second direction D2 are in the same plane. The dummy gate structure 310 is at least partially disposed over the fin structure 308, and a portion of the fin structure 308 underlying the dummy gate structure 310 may be referred to as the channel region. The dummy gate structure 310 may also define a source/drain region of the fin structure 308, for example, as portions of the fin structure 308 adjacent to and on opposing sides of the channel region. In some embodiments, the dummy gate structure 310 can include at least a polysilicon layer and a patterned hard mask for defining the dummy gate structure.

Referring to FIGS. 3A and 3B, a spacer 320/322 is disposed over sidewalls of the dummy gate structure 310, and portions of the fin structure 308 are exposed from the dummy gate structure 310 and the spacer 320/322 according to operation 106. In some embodiments, the spacer 320 includes a conductive material and the spacer 322 includes an insulating material. For example but not limited to, the spacer 320 can include metal or metal nitride. In some embodiments, a conductive layer is conformally disposed over the dummy gate structure 310, the fin structure 308 and the substrate 302. And a suitable etching operation such as dry etching operation is performed to remove portions of the conductive layer to form the spacer 320. As shown in FIG. 3A, the sidewalls of the dummy gate structure 310 is covered by the spacer 320 while the portions of the fin structure 308 and the substrate 302 are exposed from the spacer 320. In some embodiments, portions of the liner 309 can be removed after forming the spacer 320. Next, an insulating layer is conformally formed over the spacer 320, the dummy gate structure 310 and the exposed fin structure 308. In some embodiments, the insulating layer includes one or more insulating material such as silicon nitride (SiN), silicon oxide (SiO), silicon carbide (SiC), silicon oxycarbide (SiOC), silicon oxycarbon nitride (SiOCN), other materials, or a combination thereof. And suitable etching operation such as dry etching operation is performed to remove portions of the insulating layer to form the spacer 322 over the spacer 320 as shown in FIG. 3B. Briefly speaking, the portions of the fin structure 308 are exposed from the dummy gate structure 310 and the spacer 320/322 according to operation 106 as shown in FIG. 3B. However, in some embodiments, formation of the spacer 320 can be ignored. That is, the insulating spacer 322 is formed to cover the sidewalls of the dummy gate structure 310.

Referring to FIG. 3C, then, portions of the fin structure 308 exposed from the spacer 320/322, such as portions of the semiconductor layers 306 in the fin structure 308 exposed from the spacer 320/322 are removed in some embodiments. Thereby a plurality of notches 308n is formed in the fin structure 308 as shown in FIG. 3C. In some embodiments, the semiconductor layers 304 are exposed from a top and a bottom of the notch 308n while the semiconductor layer 306 is exposed from a sidewall of the notch 308n. Referring to FIG. 3D, another insulating layer 324 is formed over the substrate 302. In some embodiments, the insulating layer 324 includes one or more insulating material such as SiN, SiO, SiC, SiOC, SiOCN, other materials, or a combination thereof. Further, the insulating material is different from the insulating material for forming the spacer 322 in some embodiments.

Subsequently, a suitable etching operation is performed to remove portions of the insulating layer 324, and thus a plurality of inner spacers 326 is formed in the notches 308n as shown in FIG. 3E. And the portions of the fin structure 308 are exposed again from the top and the bottom of the notches 308n while the inner spacers 326 are exposed from the sidewalls of the notches 308n. In other words, the semiconductor layers 306 are enclosed by the semiconductor layers 304 and the inner spacers 326 while the semiconductor layers 304 are exposed.

Referring to FIG. 3F, a source/drain region 330 is formed in the portions of the fin structure 308 exposed from the dummy gate structure 310 and the spacers 320/322/326 according to operation 108. As shown in FIG. 3F, the source/drain region 330 wraps the exposed portions of the fin structure 308, that are the exposed portions of the semiconductor layers 304. In some embodiments, the source/drawn regions 330 may be formed by performing an epitaxial growth operation that provides an epitaxy material wrapping the exposed portions of the semiconductor layer 304 of the fin structure 308. In various embodiments, the source/drain regions 330 may include Ge, Si, GaAs, AlGaAs, SiGe, GaAsP, SiP, or other suitable material. In some embodiments, the source/drain regions 330 may be in-situ doped during the epi process. For example, in some embodiments, the source/drain regions 330 may be doped with boron. In some embodiments, the source/drain regions 330 may be doped with carbon to form Si:C source/drain regions, phosphorous to form Si:P source/drain regions, or both carbon and phosphorous to form SiCP source/drain regions. In some embodiments, the source/drain regions 330 are not in-situ doped, and instead an implantation process is performed to dope the source/drain regions 330.

Referring to FIG. 3G, a dielectric structure 340 is disposed over the substrate 302 according to operation 110. In some embodiments, the dielectric structure 340 can include an etch-stop layer (e.g., a contact etch stop layer (CESL)) 342 and various dielectric layers (e.g., an inter-layer dielectric (ILD) layer) 344 formed on the substrate 302 after forming the source/drain regions 310. In some embodiments, the CESL 342 includes a SiN layer, a SiCN layer, a SiON layer, and/or other materials known in the art. In some embodiments, the ILD layer 344 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, in an embodiment, after the CESL 342 and the ILD layer 344 are deposited, a planarization process, such as a chemical mechanical planarization (CMP) operation, may be performed to form the dielectric structure 340 and to expose a top surface of the dummy gate structure 310 as shown in FIG. 3G. In some embodiments, the planarization is performed to expose at least a top surface of the polysilicon layer of the dummy gate structure 310.

Referring to FIG. 3H, the dummy gate structure 310 is then removed to form a gate trench 312 in the dielectric structure 340 according to operation 112. As shown in FIG. 3H, the spacer 320 is exposed from sidewalls of the gate trench 312, and the fin structure 308 is exposed from the gate trench 312. Further, the liner layer 309 disposed over the fin structure 308 is removed subsequently. Next, the semiconductor layers 306 exposed from the gate trench 312 are removed. Accordingly, a plurality of wires including the semiconductor layers 304 is obtained as shown in FIG. 3H. In some embodiments, the wires including the semiconductor layers 304 serves as channel regions. In some embodiments, the wires can be slightly etched to obtain various desirable dimensions and shapes, and the various desired dimensions and shapes may be chosen based on device performance considerations.

Figure 12:
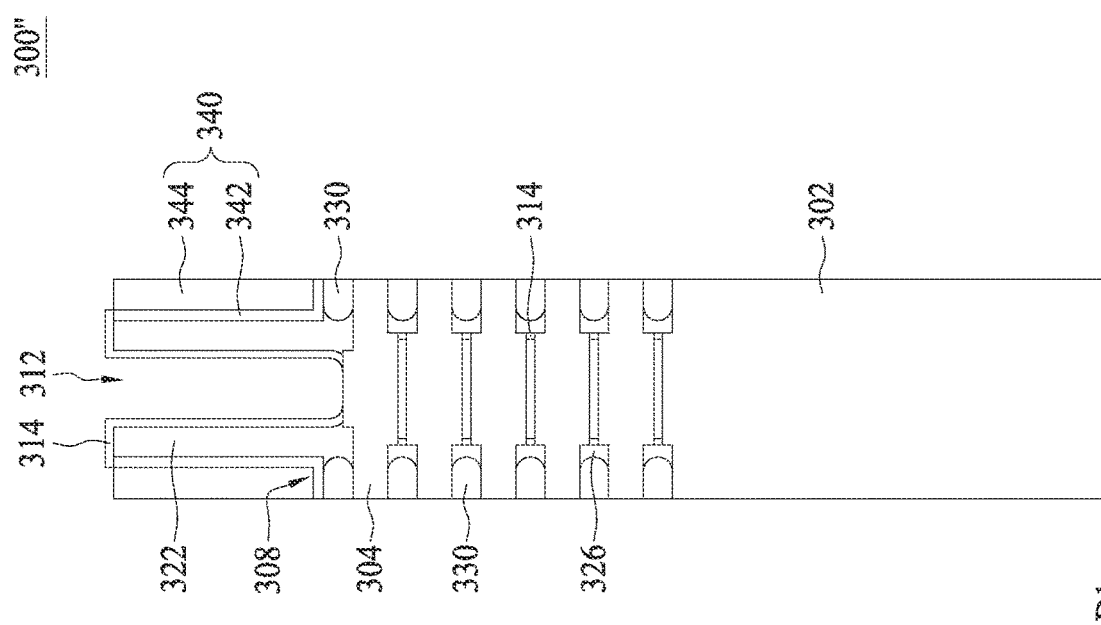

Referring to FIG. 3I, a barrier layer 314, such as a self-assembled monolayer (SAM) is formed over the sidewalls of the gate trench 312. The SAM includes a head group, which is one end of the molecule. Selection of the head group will depend on the application of the SAM. In some embodiment, the SAM over the spacer 320 including conductive material may include the head group having organosulfur compound. In some embodiment, the SAM over the spacer 320 may include thiol head group such as mono(di)thiols. In some embodiment, the SAM over the inner spacer 326 including insulating material may include silane head group such as octyltrichlorosilane (OTS) or n-octadecyltrichlorosilane (ODTS). In some embodiment, the SAM over the inner spacer 326 may include Hexamethyldisilazane (HMDS). As shown in FIG. 3I, the material of the barrier layer 314 can be chosen such that the barrier layer 314 is selectively formed to cover the spacer 320 exposed from the gate trench 312 while the inner spacer 326 and at least a portion of fin structure 308, such as a portion of each semiconductor layer 304, are exposed from the gate trench 312. However, in those embodiments that the spacer 320 is ignored, the insulating spacer 322 and the inner spacer 326 may be exposed from the gate trench 312. In those embodiments, the material of the barrier layer 314 can be chosen such that the barrier layer 314 is selectively formed to cover the spacer 322 and the inner spacer 326 exposed from the gate trench 312 while the at least a portion of fin structure 308 is exposed from the gate trench 312, as shown in FIG. 12.

Referring to FIG. 3J, an interfacial layer (IL) 316 is formed over the semiconductor layers 304 exposed from the barrier layer 314. In some embodiments, the IL 316 may include an oxide-containing material such as SiO or SiON. In some embodiments, the IL 316 wraps around the exposed semiconductor layers 304. More importantly, since the spacer 320 is covered by the barrier layer 314, a surface not suitable for forming dielectric material is rendered by the barrier layer 314. Accordingly, the IL 316 wraps around the exposed semiconductor layers 304 while the barrier layer 314 sill still exposed from the gate trench 312 after forming the IL 316.

Still referring to FIG. 3J, after forming the IL 316, a gate dielectric layer 318 is formed. As mentioned above, since the spacer 320 is covered by the barrier layer 314, a surface not suitable for forming the dielectric material is rendered by the barrier layer 314. Accordingly, the gate dielectric layer 318 wraps around the exposed semiconductor layers 304 and over the IL 316 while the barrier layer 314 sill still exposed from the gate trench 312 after forming the gate dielectric layer 318. In some embodiments, the gate dielectric layer 318 includes a high-k dielectric material having a high dielectric constant, for example, greater than that of thermal silicon oxide (~3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), hafnium oxynitride ($HfOxNy$), other suitable metal-oxides, or combinations thereof.

Figure 13:
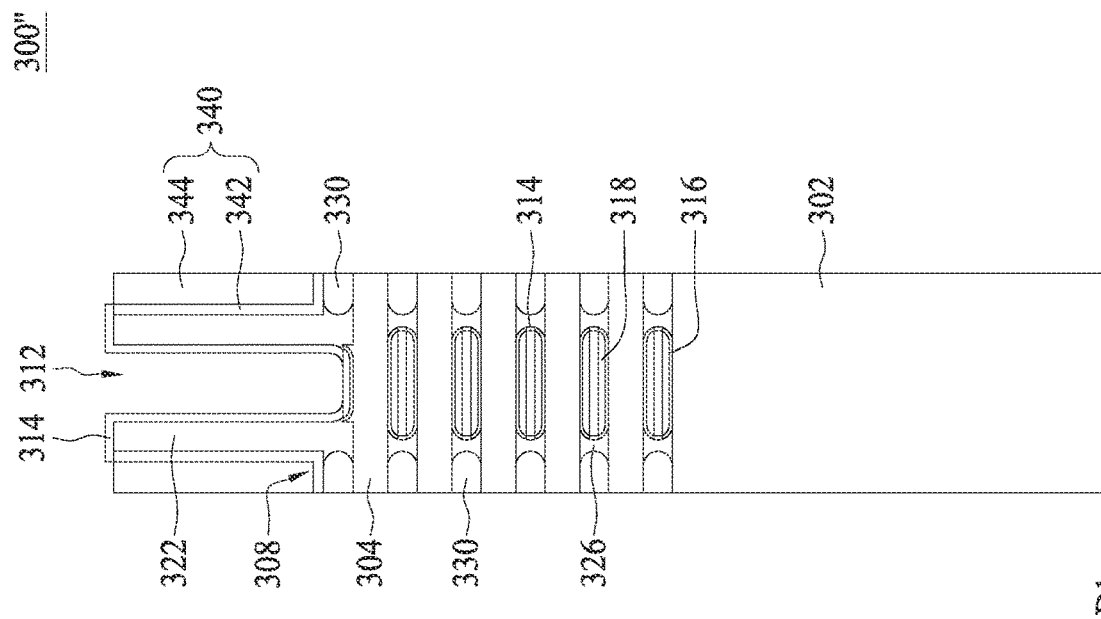

However, in those embodiments that the spacer 320 is ignored, the IL 316 and the gate dielectric layer 318 are formed over the fin structures 304 exposed from the gate trench 312. As mentioned above, since the spacer 322 and the inner spacer 326 are covered by the barrier layer 314, a surface not suitable for forming the dielectric material is rendered by the barrier layer 314 as shown in FIG. 13.

Referring to FIG. 3K, after forming the gate dielectric layer 318, the barrier layer 314 is removed from the gate trench 312. In some embodiments, the barrier layer 314 can be removed by, for example but not limited to, tetramethylammonium hydroxide (TMAH), ammonia solution, or cyclic oxidation-DHF clean. Consequently, the gate dielectric layer 318 is disposed over a bottom of the gate trench 312 and the semiconductor layers 304, while the spacer 320 is exposed again from the sidewalls of the gate trench 312 according to operation 114. In some embodiments, the spacer 320 can be removed after removing the barrier layer 314, but the disclosure is not limited to this.

Referring to FIG. 3L, a gate conductive structure 350 is then disposed in the gate trench 312 according to operation 116. In some embodiments, the gate conductive structure 350 is formed on the gate dielectric layer 318. More importantly, sidewalls of the gate conductive structure 350 are in contact with the spacer 320 as shown in FIG. 3L. In some embodiments, the gate conductive structure 350 can include at least a barrier metal layer 352, a work functional metal layer 354 and a gap-filling metal layer 356. The barrier metal layer 352 can include, for example but not limited to, TiN. The work function metal layer 354 can include a single layer of TiN, TaN, TaAlC, TiC, TaC, Co, Al, TiAl, HfTi, TiSi, TaSi or TiAlC, or a multilayer of two or more of these materials, but not limited to this. For the n-channel FET, one or more of TaN, TaAlC, TiN, TiC, Co, TiAl, HfTi, TiSi and TaSi is used as the work function metal layer 354, and for the p-channel FET, one or more of TiAlC, Al, TiAl, TaN, TaAlC, TiN, TiC and Co is used as the work function metal layer 354. In some embodiments, the gap-filling metal layer 326 layers of conductive material, such as Al, Cu, AlCu, or W, but is not limited by the above-mentioned materials. Accordingly, the multi-gate semiconductor device 300 is obtained as shown in FIG. 3L.

Figure 3M:
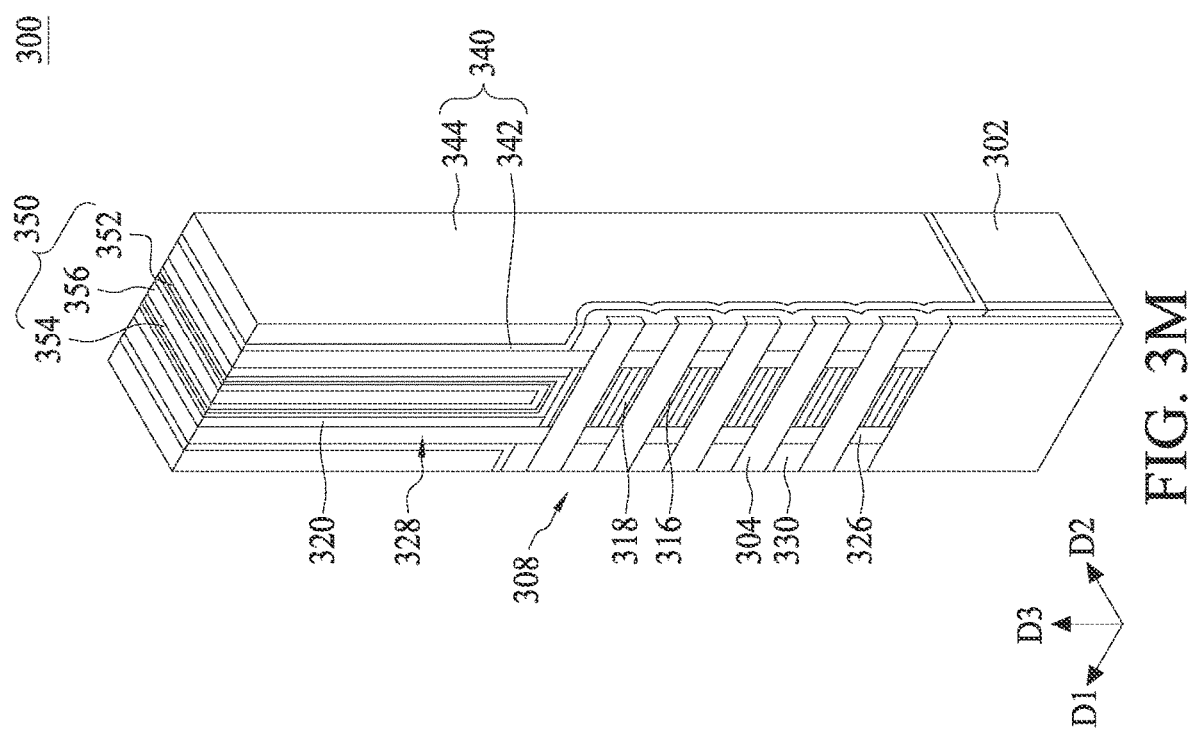

In some embodiments, the spacer 322 can be removed after disposing the gate conductive structure 350, and thus a spacer trench 328 is formed between the spacer 320 and the dielectric structure 340 as shown in FIG. 3M. Subsequently, the spacer trench 328 can be sealed to form an air spacer 360 as shown in FIG. 3N. It should be noted that the air spacer 360 can be selectively formed to further reduce the Miller capacitance between the gate electrodes and drain areas of the FET.

In some embodiments that the spacer 320 is ignored, the spacer 322 is exposed in the gate trench 312 after removing barrier layer 314. The gate conductive structure 350 is then formed in the gate trench 312. Accordingly, the gate conductive structure 350, such as the barrier metal layer 352 is contact with the spacer 322 as shown in FIG. 14.

FIG. 4A through FIG. 4D depict operations for forming the gate dielectric layer according aspects of the present disclosure in one or more embodiments. It should be noted that elements the same in FIGS. 3A-3N and FIGS. 4A-4D are designated by the same numerals and formed by similar operations. Further, elements the same in FIGS. 3A-3N and FIGS. 4A-4D can include same materials. Therefore, details for forming those elements are omitted in the interest of brevity, and the differences are provided as following description. Additionally, FIGS. 4A-4G are cross-sectional views of a semiconductor device 300' taken along the first direction D1.

Figure 4B:
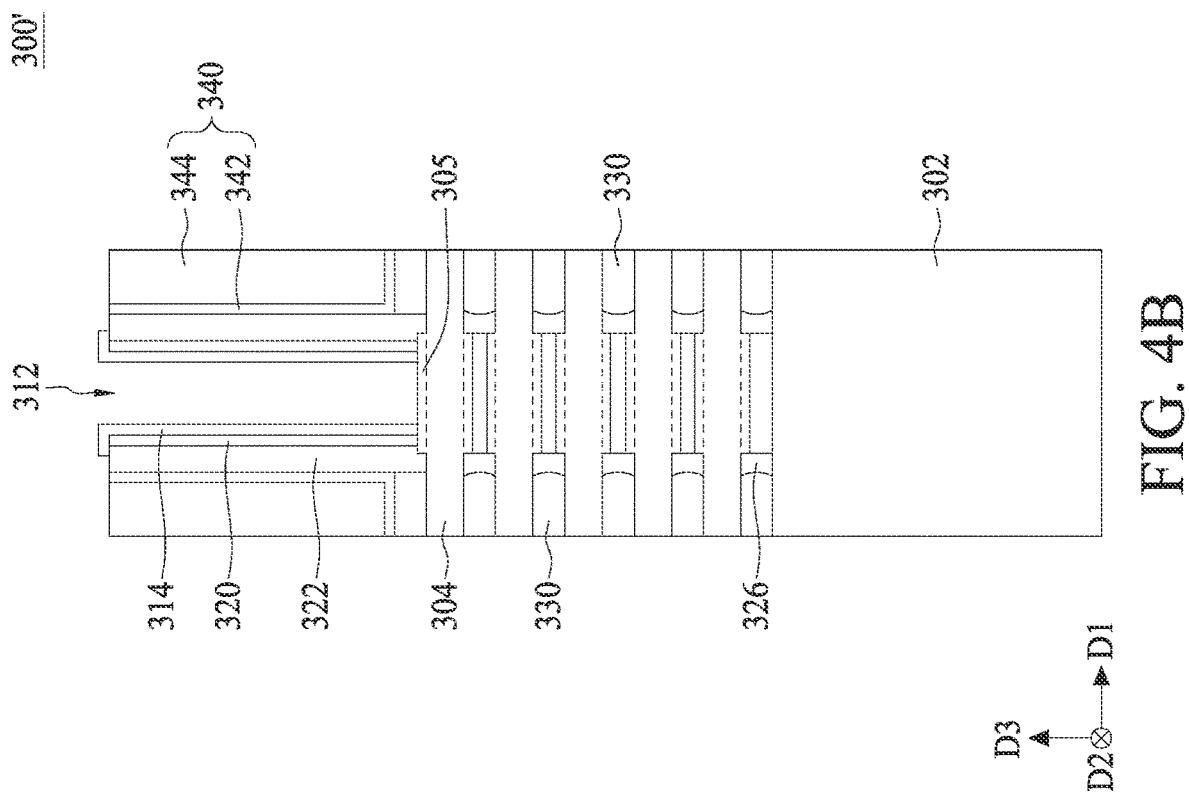
Figure 4A:
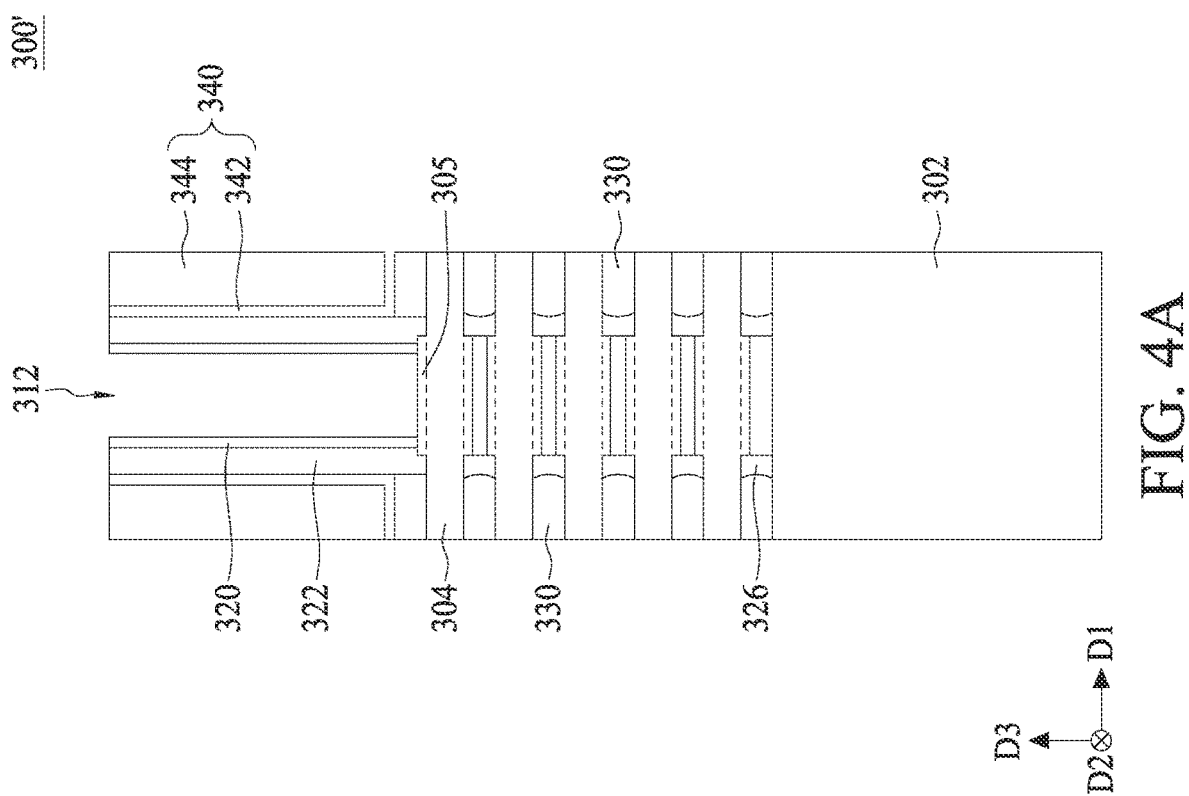

As shown in FIG. 4A, after removing the dummy gate structure 310 to form the gate trench 312 in the dielectric structure 340 according to operation 112, and after removing the semiconductor layers 306 to form the wires, semiconductor re-growth operation can be performed. Consequently, semiconductor layers 305 are formed over the exposed semiconductor layers 304. The semiconductor layers 305 wrapping the wires/the semiconductor layers 304 respectively, as shown in FIG. 4A. In some embodiments, the semiconductor layers 304 and the semiconductor layers 305 can include the same semiconductor material. In some embodiments, the semiconductor layers 304 and the semiconductor layers 305 can include different semiconductor materials. Additionally, the spacer 320 and the inner spacer 326 are exposed from the sidewalls of the gate trench 312, as shown in FIG. 4A.

Referring to FIG. 4B, a barrier layer 314 such as a SAM is formed over the spacer 320. Consequently, the spacer 320 that is exposed from the sidewalls of the gate trench 312 is now covered by the barrier layer 314 while the inner spacer 326 is still exposed. Referring to FIG. 4C, the semiconductor layers 305 are removed after forming the barrier layer 314. Consequently, the semiconductor layers 304 of the fin structure 308 are exposed again as shown in FIG. 4C.

Referring to FIG. 4D, an interfacial layer (IL) 316 and a gate dielectric layer 318 are then sequentially formed over the exposed semiconductor layers 304. The IL 316 and the gate dielectric layer 318 are formed to wrap the semiconductor layers 304 but not the sidewalls of the gate trench 312 because the barrier layer 314 provides a surface less suitable for forming dielectric material. Thereafter, the barrier layer 314 is removed from the gate trench 312. Accordingly, the gate dielectric layer 318 is disposed over a bottom of the gate trench 312 and the semiconductor layers 304, while the spacer 320/326 are exposed from the sidewalls of the gate trench 312 according to operation 114. And operations such as 116 can be performed to form the gate conductive 350 structure as mentioned above.

FIG. 5A through FIG. 5J illustrates a multi-gate semiconductor device 400 at various fabrication stages constructed according to aspects of the present disclosure in one or more embodiments. It should be noted that elements the same in FIGS. 3A-3N and FIGS. 5A-5J are designated by the same numerals. Further, elements the same in FIGS. 3A-3N and FIGS. 5A-5J can include same materials, thus those details for the materials are omitted in the interest of brevity.

Figure 5B:
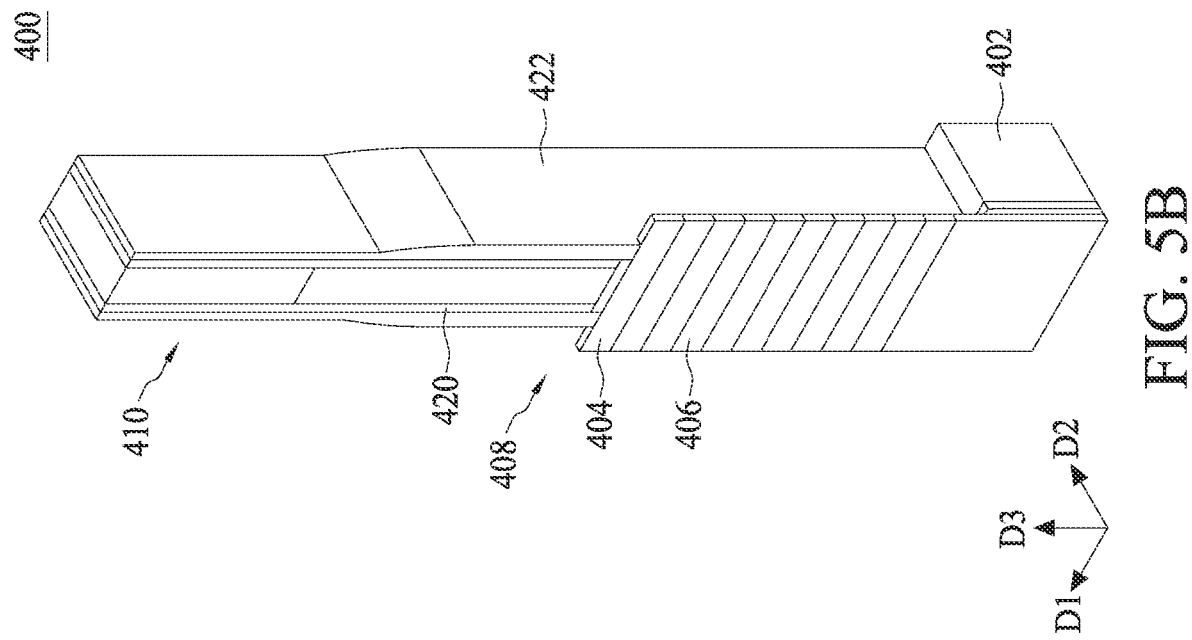
FIG. 5A through FIG. 5J illustrate a multi-gate semiconductor device at various fabrication stages constructed according to aspects of the present disclosure in one or more embodiments.
Figure 5A:
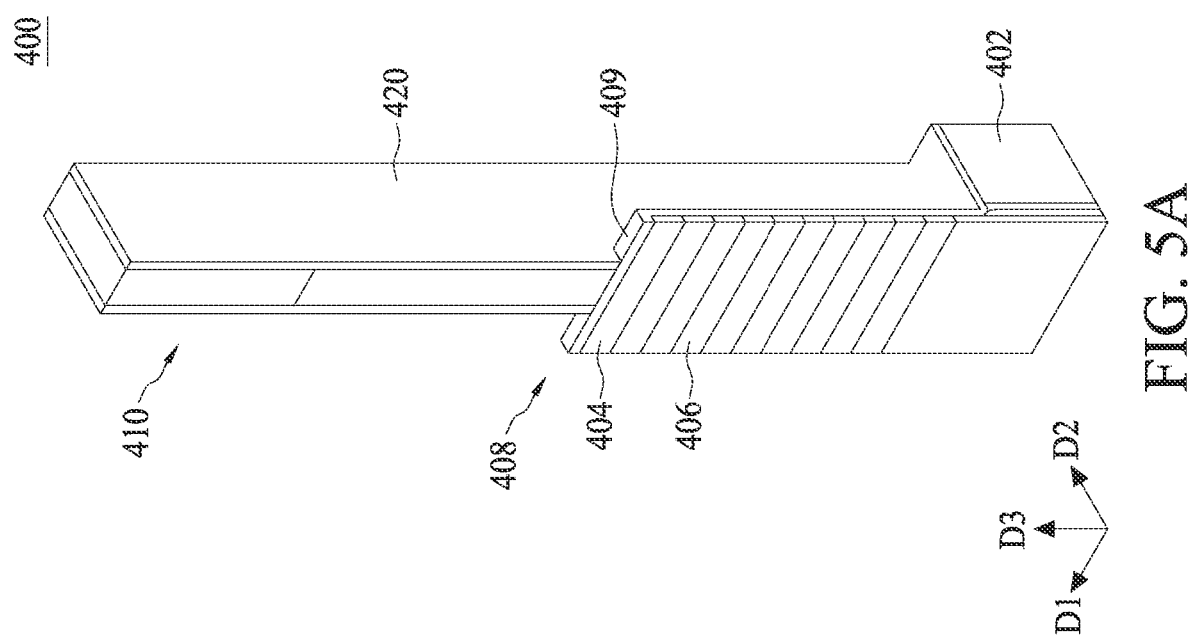

Referring to FIG. 5A, a substrate 402 is provided. In some embodiments, a SRB layer (not shown) can be formed over the substrate 402. A fin structure 408 including semiconductor layers is formed over the SRB layer or the substrate 402. The fin structure 408 may include alternating layers of different compositions. For example, in some embodiments, the fin structure 408 includes semiconductor layers 404 of a first composition alternating with semiconductor layers 406 of a second composition. As mentioned above, the different compositions of the layers in the fin structure 408 (e.g., semiconductor layers 404 and semiconductor layers 406) may be used to selectively process some of the layers. Accordingly, the compositions may have different oxidation rates, etchant sensitivity, and/or other differing properties. The semiconductor layers 404 and 406 may have thicknesses chosen based on device performance considerations. As mentioned above, height and width of the fin structure 408 may be chosen based on device performance considerations. Further, the fin structure 408 can be extended along a first direction D1 as shown in FIG. 5A. Accordingly, the substrate 402 including the at least one fin structure 408 is provided according to operation 102. Further, in some embodiments, a liner 409 can be formed over the fin structure 408 and the substrate 402 as shown in FIG. 5A.

Referring to FIGS. 5A and 5B, a dummy gate structure 410 is disposed over the fin structure 408 and the substrate 402 according to operation 104. In some embodiments, the dummy gate structure 410 is formed over the substrate 402 and is extended along a second direction D2, which is not parallel with the first direction D1. Additionally, the first direction D1 and the second direction D2 are in the same plane. The dummy gate structure 410 is at least partially disposed over the fin structure 408. As mentioned above, the dummy gate structure 410 can include at least a polysilicon layer and a patterned hard mask for defining the dummy gate structure. Thereafter, a spacer 420/422 is disposed over sidewalls of the dummy gate structure 410, and portions of the fin structure 408 are exposed from the dummy gate structure 410 and the spacer 420/422 according to operation 106. In some embodiments, both of the spacer 420 and the spacer 422 include an insulating materials. However, the spacer 420 and the spacer 422 include insulating materials different from each other. For example but not limited to, the spacer 420 includes SiO while the spacer 422 include SiN, but not limited to this. In some embodiments, an insulating layer is conformally disposed over the dummy gate structure 410, the fin structure 408 and the substrate 402. And a suitable etching operation such as dry etching operation is performed to remove portions of the insulating layer to form the spacer 420. As shown in FIG. 5A, the sidewalls of the dummy gate structure 410 is covered by the spacer 420 while portions of the fin structure 408 and the substrate 402 are exposed from the dummy gate structure 410 and the spacer 420. Further, liner 409 is exposed from the dummy gate structure 410 and the spacer 420.

Referring to FIG. 5B, after forming the spacer 420, another insulating layer is conformally formed over the spacer 420, the dummy gate structure 410 and the exposed fin structure 408 and followed by suitable etching operation such as dry etching operation. Consequently, portions of the insulating layer are removed to form the spacer 422. As shown in FIG. 5B, the spacer 420 over the sidewalls of the dummy gate structure 410 is now covered by the spacer 422 while the portions of the fin structure 408 and the substrate 402 are exposed from the spacer 422. In some embodiments, the liner 409 can be removed during or after forming the spacer 422. Briefly speaking, the portions of the fin structure 408 are exposed from the dummy gate structure 410 and the spacer 420/422 according to operation 106 as shown in FIG. 5B.

Figure 5D:
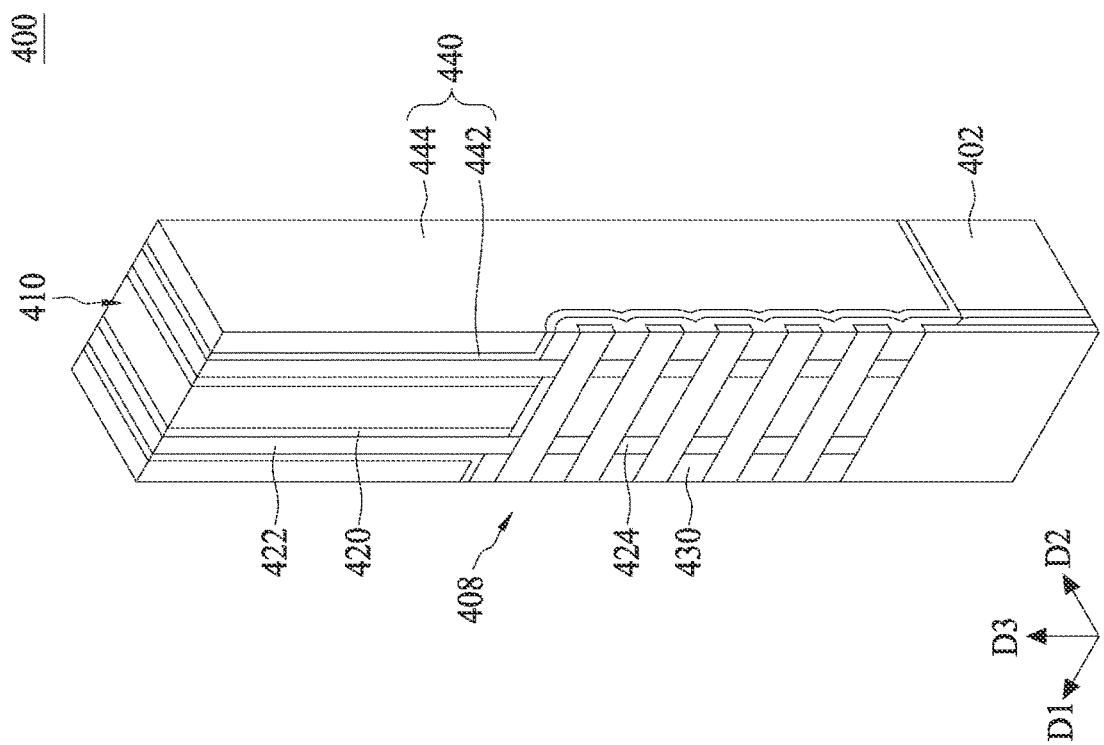
Figure 5C:
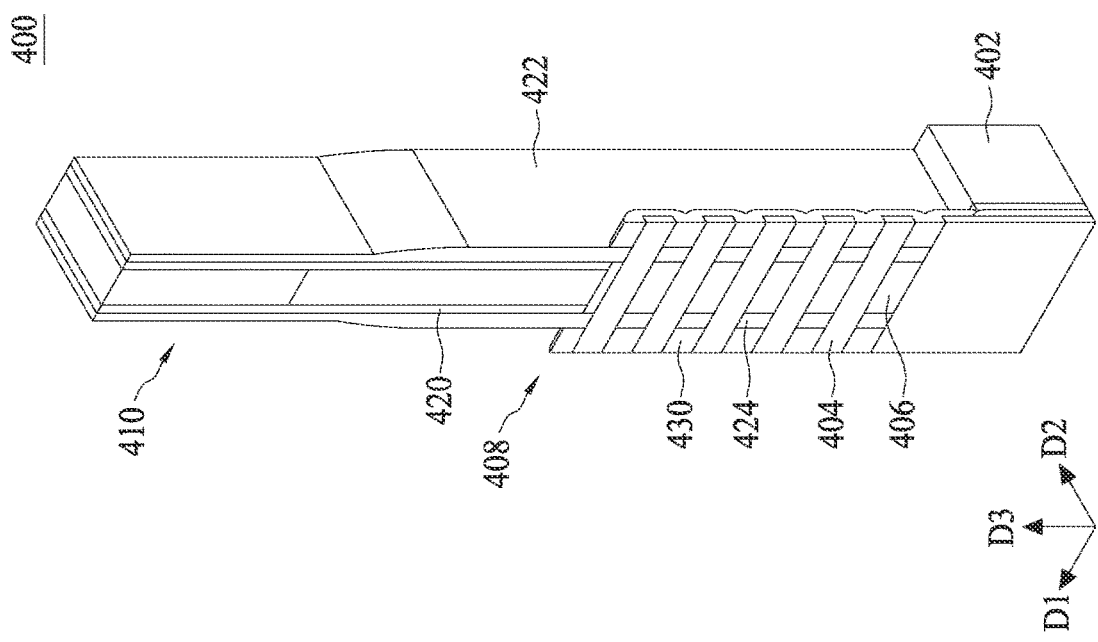

Referring to FIG. 5C, the portions of the fin structure 408 exposed from the spacer 420/422, that are portions of the semiconductor layers 406 in the fin structure 408 exposed from the spacer 420/422 are removed in some embodiments. Thereby a plurality of notches (not shown) is formed in the fin structure 408 as shown in FIG. 3C. In some embodiments, a plurality of inner spacers 424 is respectively disposed in the notches. Since the operations for forming the inner spacers 424 are similar to those shown in FIGS. 3C-3D, details are omitted for brevity. Next, a source/drain region 430 is formed in the portions of the fin structure 408 exposed from the dummy gate structure 410 and the spacers 420/422/424 according to operation 108. As shown in FIG. 5C, the source/drain region 430 wraps the exposed portions of the fin structure 408, that are the exposed portions of the semiconductor layers 404.

Referring to FIG. 5D, a dielectric structure 440 is then disposed over the substrate 402 according to operation 110. As mentioned above, the dielectric structure 440 can include an etch-stop layer (e.g., CESL 442) and various dielectric layers (e.g., an ILD layer) 444. In some embodiments, after the CESL 442 and the ILD layer 444 are deposited, a planarization operation, such as a CMP operation, may be performed to form the dielectric structure 440 and to expose a top surface of the dummy gate structure 410 as shown in FIG. 5D. In some embodiments, the planarization operation is performed to expose at least a top surface of the polysilicon layer of the dummy gate structure.

Figure 5F:
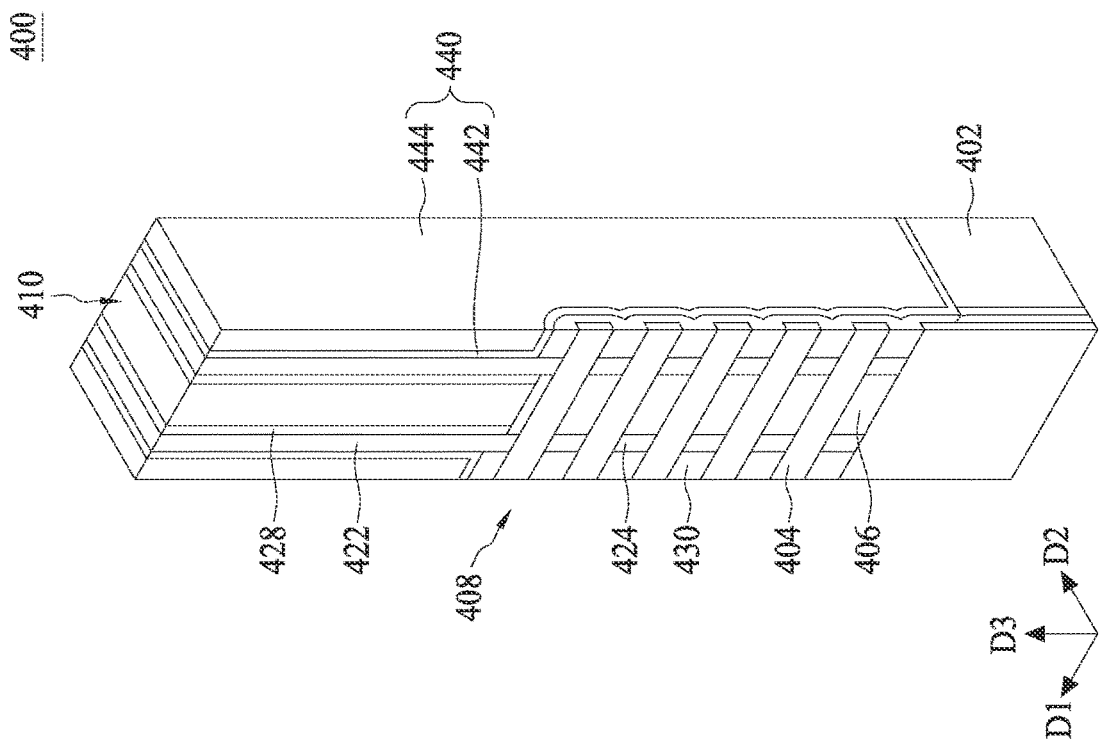
Figure 5E:
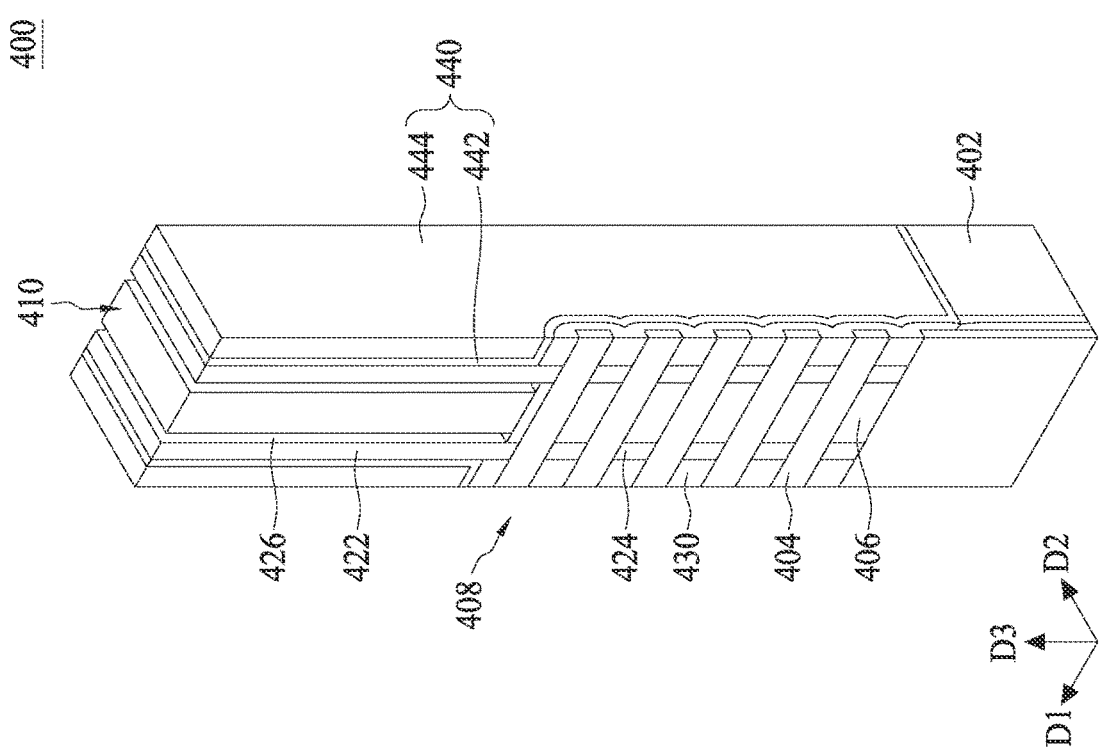

Referring to FIGS. 5E-5F, the spacer 420 is removed to form a spacer trench 426 and followed by forming a spacer 428 in the spacer trench 426 in some embodiments. The spacer 428 includes a conductive material. For example but not limited to, the spacer 428 can include metal or metal nitride. In other words, the insulating spacer 420 is replaced with the conductive spacer 428 in some embodiments.

Figure 5H:
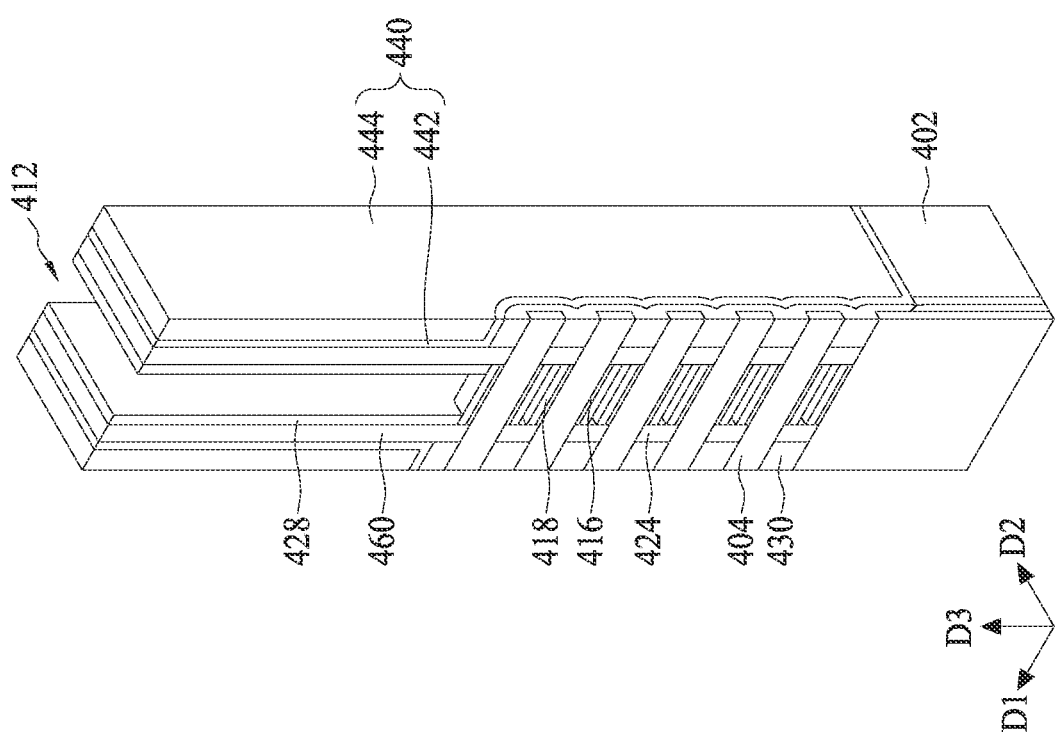
Figure 5G:
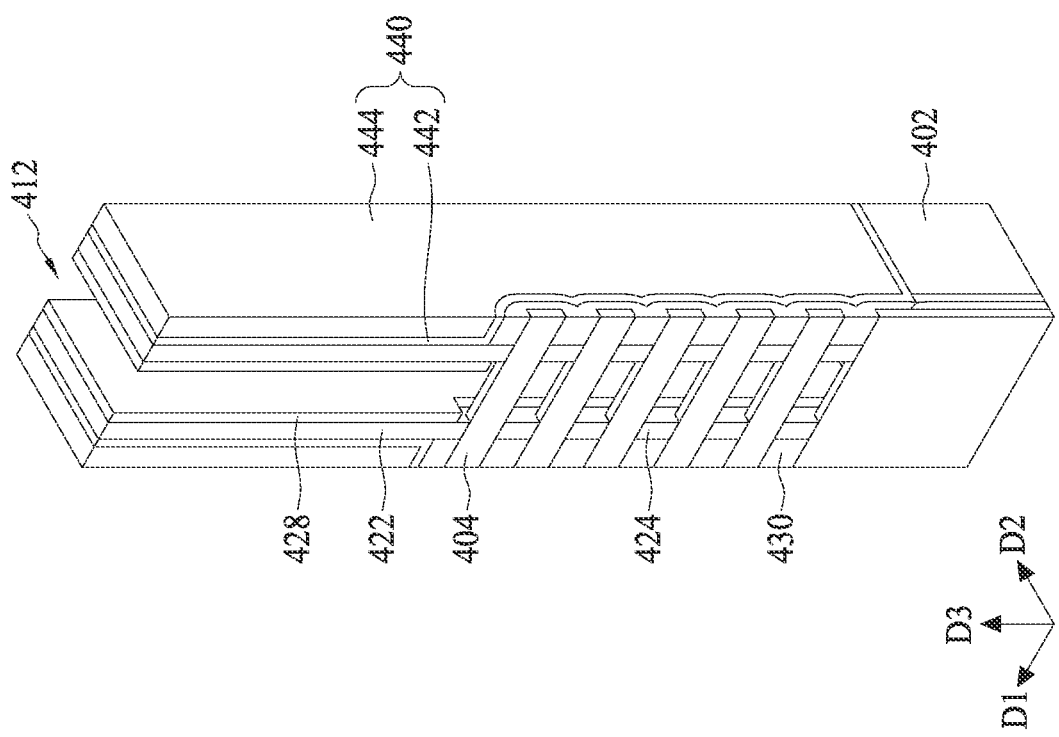

Referring to FIG. 5G, the dummy gate structure 410 is removed to form a gate trench 412 in the dielectric structure 440 after forming the spacer 428 according to operation 112. As shown in FIG. 5G, the spacer 428 is exposed from sidewalls of the gate trench 412, and the fin structure 408 is exposed from the gate trench 412. Further, the liner 409 disposed over the fin structure 408 can be removed subsequently. Next, the semiconductor layers 406 exposed from the gate trench 412 are removed. Accordingly, a plurality of wires including the semiconductor layers 404 is obtained as shown in FIG. 5G. In some embodiments, the wires including the semiconductor layers 404 serves as channel regions. In some embodiments, the wires can be slightly etched to obtain various desirable dimensions and shapes, and the various desired dimensions and shapes may be chosen based on device performance considerations.

Referring to FIG. 5H, a barrier layer such as the aforementioned SAM can be formed over the sidewalls of the gate trench 412, and followed by sequentially forming an IL 416 and a gate dielectric layer 418. Since operations for forming the barrier layer, the IL 416 and the gate dielectric later 418 are similar to those shown in FIGS. 3I-3K or FIGS. 4A-4D, those details are omitted for brevity. And the barrier layer is removed after forming the gate dielectric layer 418.

Figure 5J:
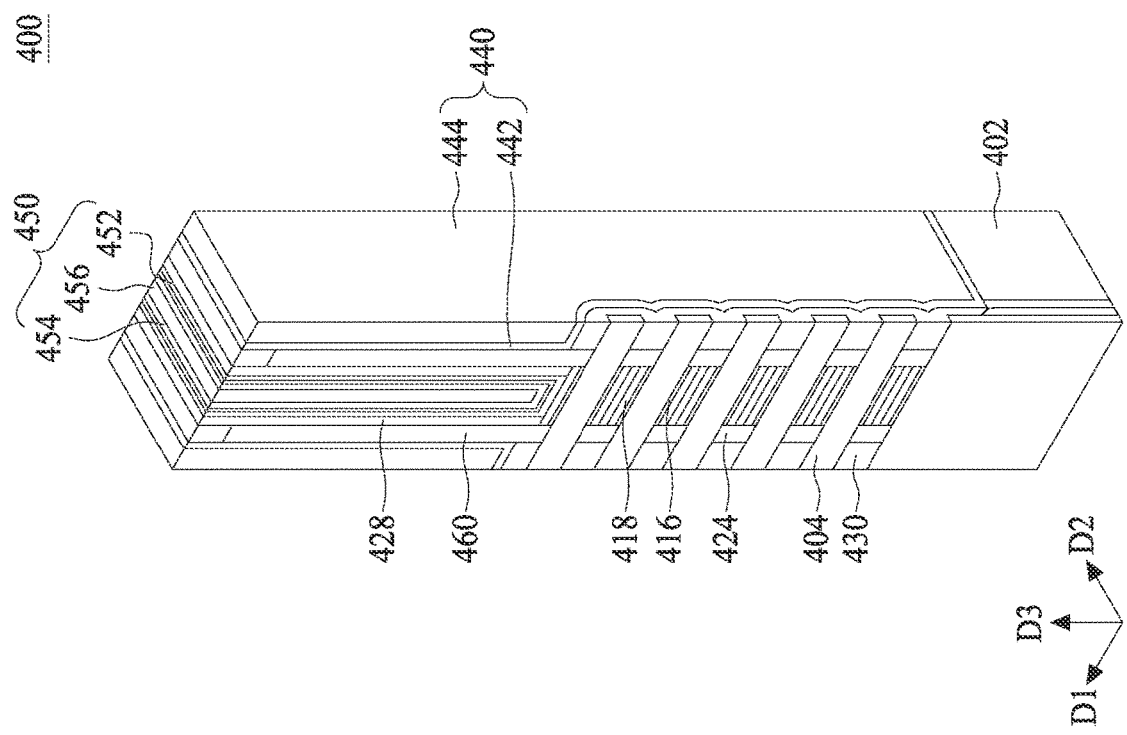
Figure 5I:
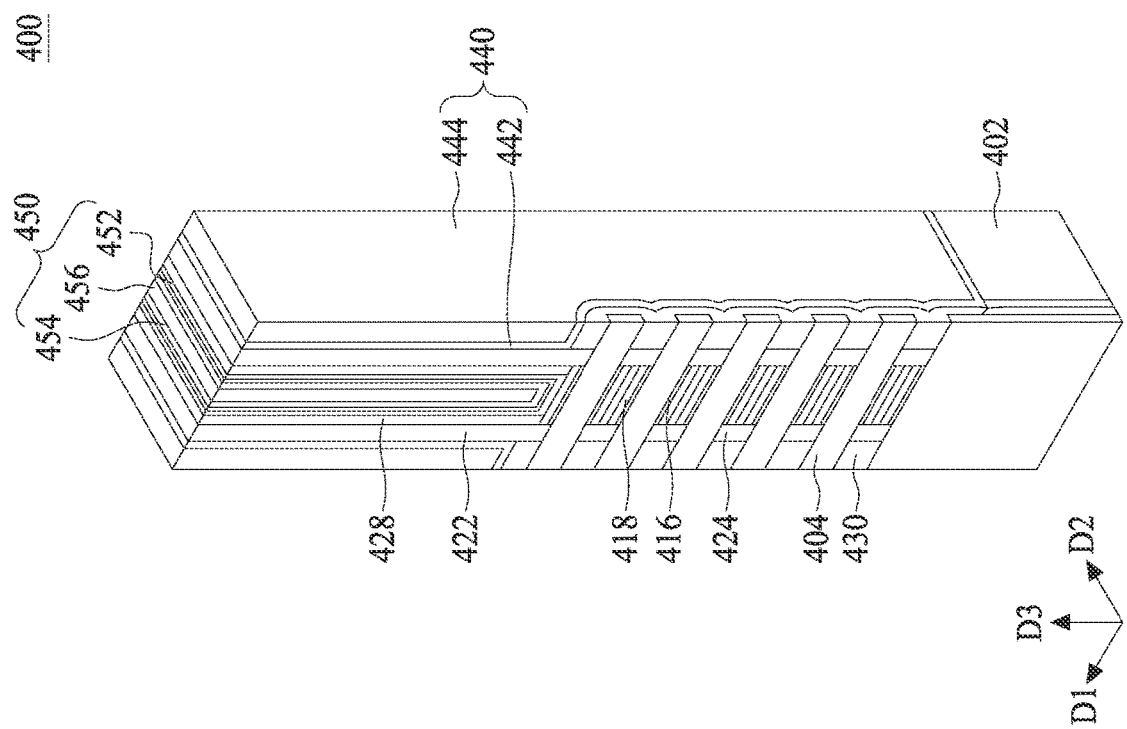

Referring to FIG. 5I a gate conductive structure 450 is then disposed in the gate trench 412 according to operation 116. In some embodiments, the gate conductive structure 450 is formed on the gate dielectric layer 418 to surround each semiconductor layers 404. In some embodiments, the gate conductive structure 450 can include at least a barrier metal layer 452, a work functional metal layer 454 and a gap-filling layer 456. Accordingly, the multi-gate semiconductor device 400 is obtained as shown in FIG. 5I. More importantly, sidewalls of the gate conductive structure 450 are in contact with the spacer 428.

In some embodiments, the spacer 422 can be removed after disposing the gate conductive structure 450, and thus a spacer trench (not shown) is formed between the spacer 428 and the dielectric structure 440. Subsequently, the spacer trench can be sealed to form an air spacer 460 as shown in FIG. 5J. As mentioned above, the air spacer 460 can be selectively formed to further reduce the Miller capacitance between the gate electrodes and drain areas of the FET.

Figures 6B, 6C, 6D, 6E:
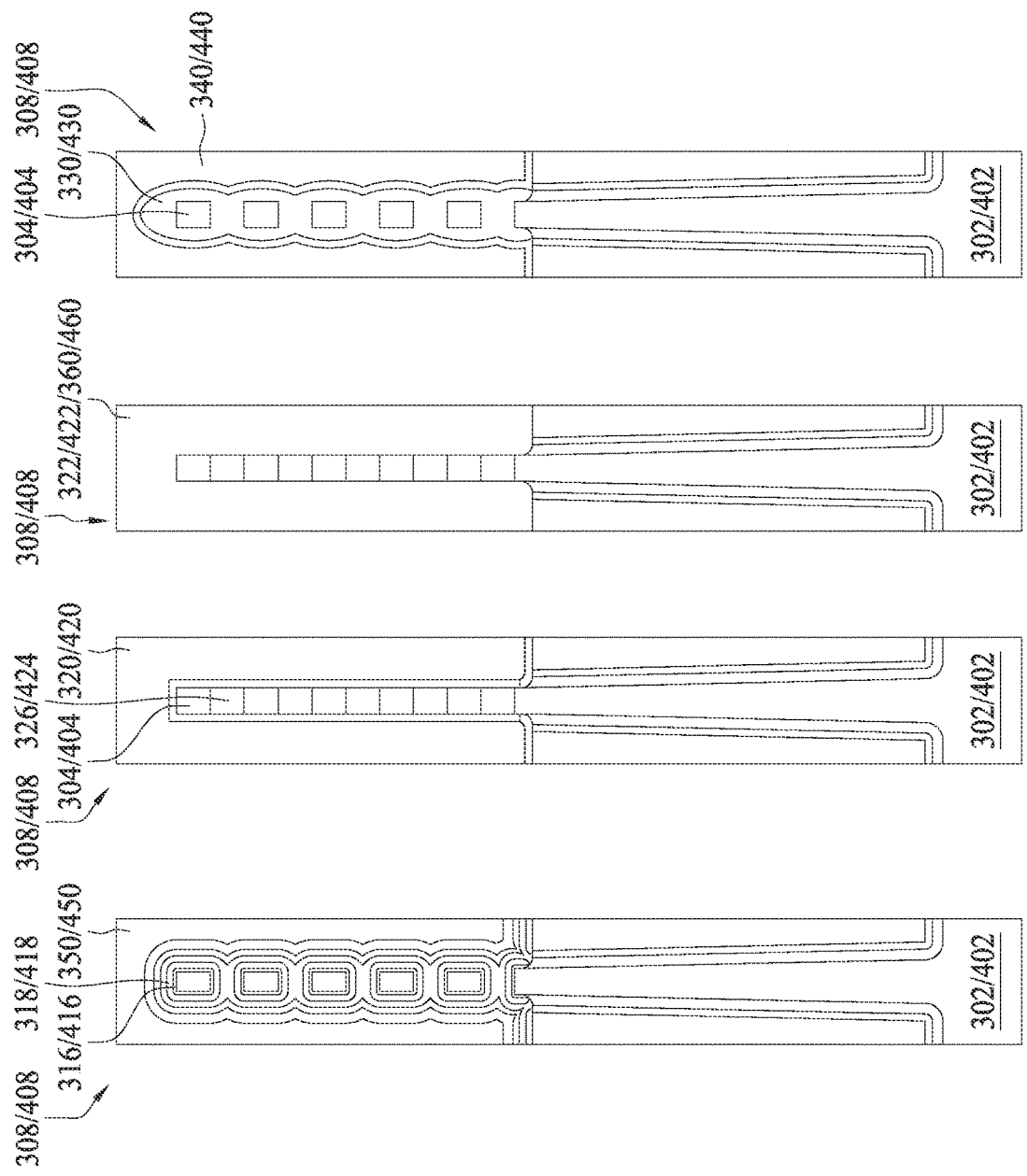
FIG. 6A through FIG. 6E are cross-sectional views of the multi-gate semiconductor device according to aspects of the present disclosure in one or more embodiments.
Figure 6A:
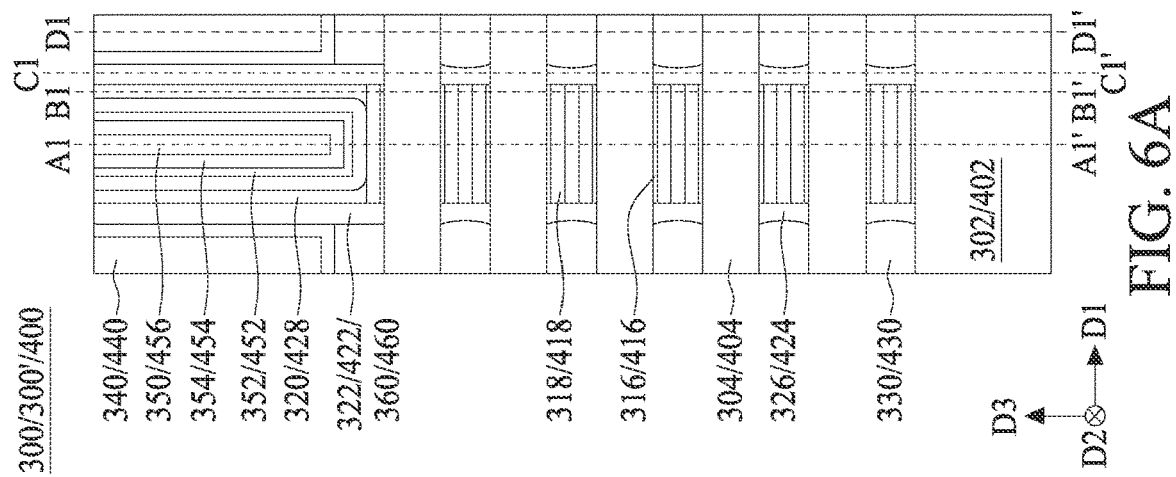

FIG. 6A through FIG. 6E are cross-sectional views of the multi-gate semiconductor device 300, 300' and 400 according to aspects of the present disclosure in one or more embodiments. FIG. 6A is a cross-sectional views of the semiconductor device 300, 300' and 400 taken along the first direction D1, FIG. 6B is a cross-sectional view taken along line A1-A1' of FIG. 6A, FIG. 6C is a cross-sectional view taken along line B1-B1' of FIG. 6A, FIG. 6D is a cross-sectional view taken along line C1-C1' of FIG. 6A, and FIG. 6E is a cross-sectional view taken along line D1-D1' of FIG. 6A. Referring to FIGS. 6A-6E, a multi-gate semiconductor device 300, 300' and 400 can be provided. The multi-gate semiconductor device 300, 300' and 400 includes the substrate 302/402, the fin structure 308/408 such as the stacked wire structure disposed over the substrate 302/402, a gate wrapping the stacked wire structure, and spacer disposed over two sidewalls of the gate. As shown in FIGS. 6A-6E, the gate includes the gate conductive structure 350/450 and the gate dielectric layer 318/418 sandwiched between the gate conductive structure 350/450 and the stacked wire structure. As shown in FIG. 6B, portions of the semiconductor layers 304/404 are sequentially wrapped by the IL 316/416, the gate dielectric layer 318/418, and the barrier metal layer 352/452 of the gate conductive structure 350/450. As shown in FIGS. 6C-6D, another portions of the semiconductor layers 304/404 are spaced apart from each other by the inner spacer 326/424. As shown in FIG. 6E, still another portions of the 304/404 are wrapped by the source/drain region 330/430.

More importantly, the sidewalls of the gate conductive structure 350/450, such as the barrier metal layer 352/452, are in contact with the spacer 320/428, and the spacer 320/428 includes the conductive material as shown in FIGS. 6A and 6B. In some embodiments, the multi-gate semiconductor device 300/300'/400 further includes the insulating spacer 322/422, and the conductive spacer 320/428 is sandwiched between the insulating spacer 322/422 and the gate conductive structure 350/450. In some embodiments, the multi-gate semiconductor device 300/300'/400 further includes the air spacer 360/460 for further reducing Miller capacitance.

FIG. 7A through FIG. 7K illustrates a multi-gate semiconductor device at various fabrication stages constructed according to aspects of the present disclosure in one or more embodiments. It should be noted that elements the same in FIGS. 3A-3N and FIGS. 7A-7K can include same materials, thus those details for the materials are omitted in the interest of brevity.

Figure 7B:
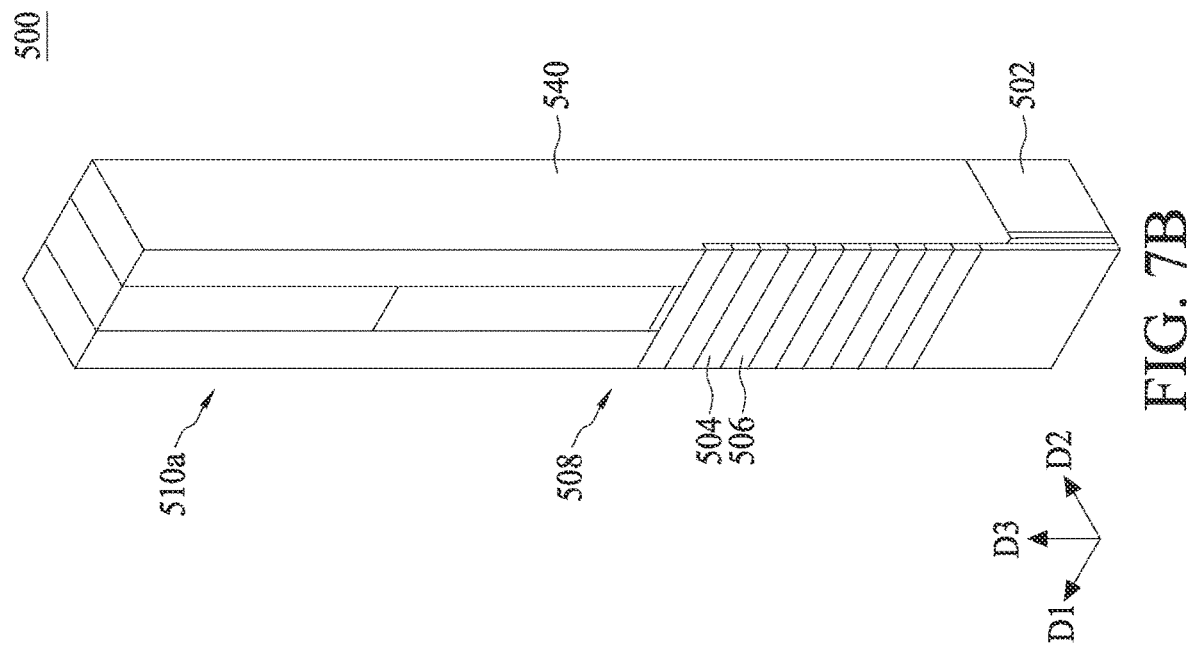
FIG. 7A through FIG. 7K illustrate a multi-gate semiconductor device at various fabrication stages constructed according to aspects of the present disclosure in one or more embodiments.
Figure 7A:
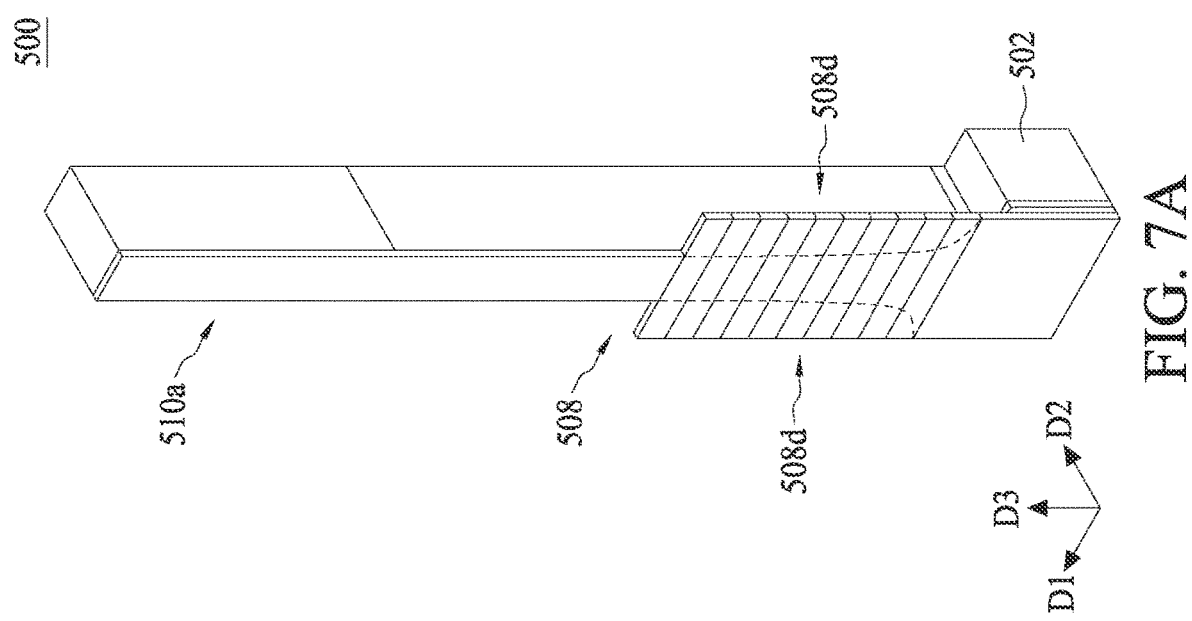

Referring to FIG. 7A, a substrate 502 is provided. In some embodiments, a SRB layer (not shown) can be formed over the substrate 502. A fin structure 508 including semiconductor layers is formed over the substrate 502 or the SRB layer. The fin structure 508 may include alternating layers of different compositions. For example, in some embodiments, the fin structure 508 includes semiconductor layers 504 of a first composition alternating with semiconductor layers 506 of a second composition. As mentioned above, the different compositions of the layers in the fin structure 508 (e.g., semiconductor layers 504 and semiconductor layers 506) may be used to selectively process some of the layers. Accordingly, the compositions may have different oxidation rates, etchant sensitivity, and/or other differing properties. Further, the fin structure 508 can be extended along a first direction D1 as shown in FIG. 7A. Accordingly, the substrate 502 including the at least one fin structure 508 is provided according to operation 202. Further, in some embodiments, a liner (not shown) can be formed over the fin structure 508 and the substrate 502.

Still referring to FIG. 7A, a dummy gate structure 510a is disposed over the fin structure 508 and the substrate 502. In some embodiments, the dummy gate structure 510a is formed over the substrate 502 and is extended along a second direction D2, which is not parallel with the first direction D1. Additionally, the first direction D1 and the second direction D2 are in the same plane. The dummy gate structure 510a at least partially disposed over the fin structure 508, and thus portions of the fin structure 508 are exposed from the dummy gate structure 510a. Thereafter, an etching rate modification is performed. In some embodiments, portions of the fin structure 508 exposed from the dummy gate structure 510a are doped, and thus doped regions 508d as shown in FIG. 7A. The doped regions 508d include an etching rate lower than the rest portion of the fin structures 508. In some embodiments, a concentration of the doped regions 508d can be ranged from about 1.8E19 to about 8.16E15, but not limited to this. In some embodiments, the concentration of the doped regions 508d is inwardly reduced from a surface of the fin structure 508.

Figure 7D:
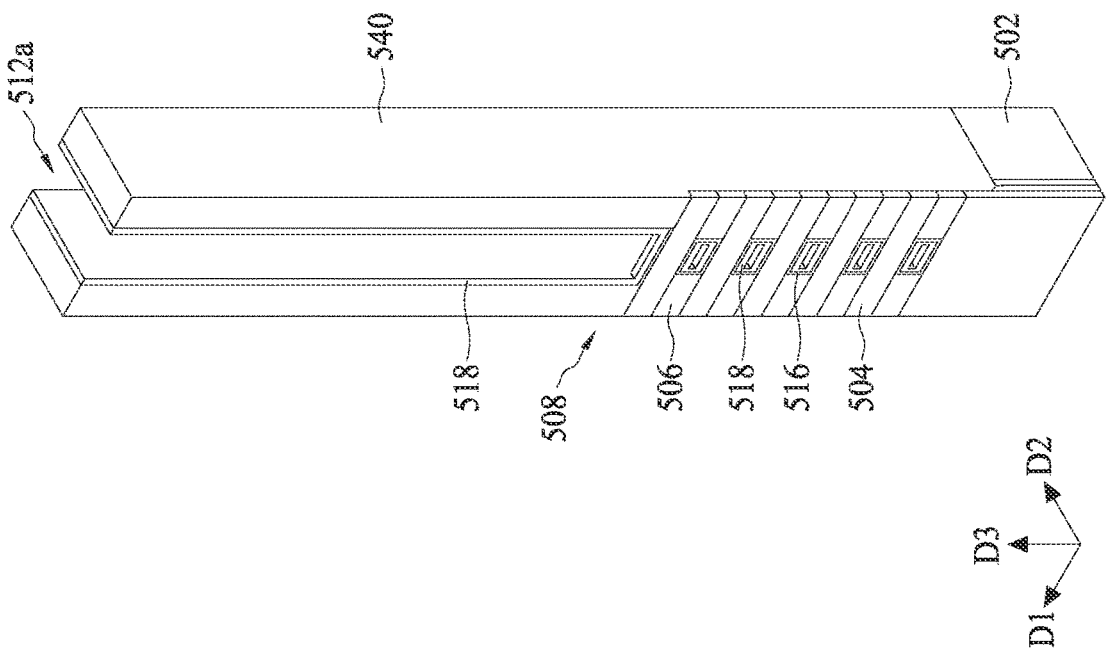
Figure 7C:
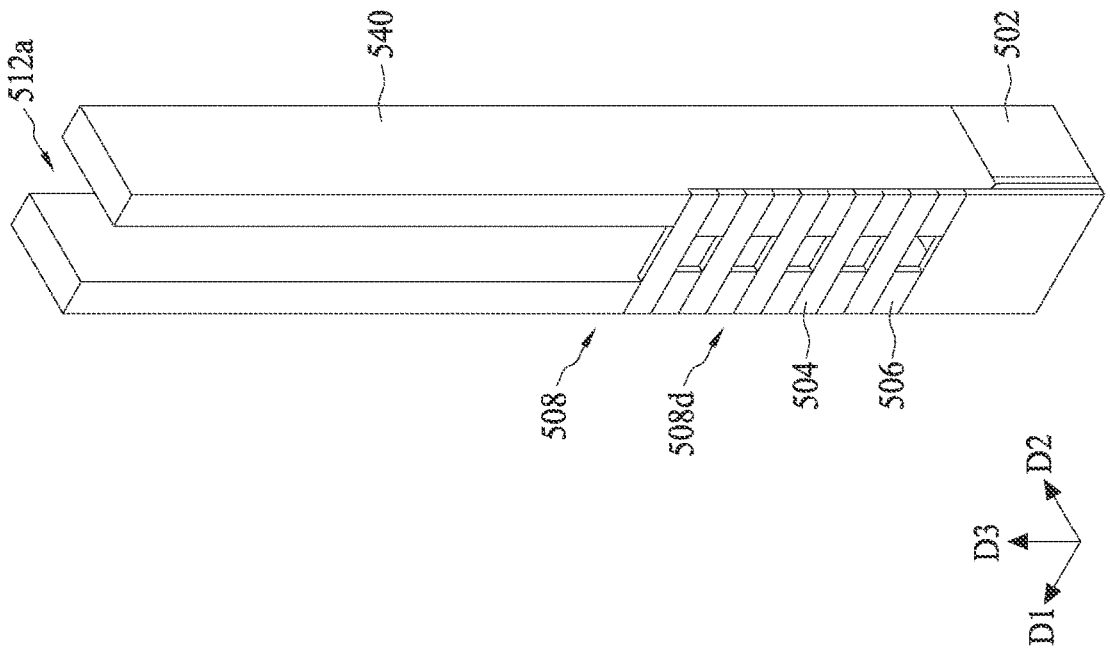

Referring to FIGS. 7B-7C, a sacrificial insulating structure 540 is disposed over the fin structure 508 and the substrate 502 according to operation 204. In some embodiments, the sacrificial insulating structure 540 is formed over the substrate 502 and followed by a planarization process, such as a CMP, thus a top surface of the dummy gate structure 510a is exposed as shown in FIG. 7B.

Next, the dummy gate structure 510a is removed to form a gate trench 512a. Further, the semiconductor layers 506 exposed from the gate trench 512a are then removed. Since the etching rate of the doped regions 508d is modified to be lower as mentioned above, removal of the semiconductor layers 506 can be stopped at the doped regions 508d, as shown in FIG. 7C. Further, the liner disposed over the fin structure 508 can be removed subsequently. Accordingly, a plurality of wires including the semiconductor layers 504 is obtained and exposed from the gate trench 512a as shown in FIG. 7C. In other words, the gate trench 512a is formed in the sacrificial insulating structure 520 with a portion of the fin structure 508 being exposed from the gate trench 512a according to operation 206.

Referring to FIG. 7D, an IL 516 is formed over the semiconductor layers 504 and followed by forming a gate dielectric layer 518 over the fin structure 508 and sidewalls of the gate trench 512a according to operation 208. As shown in FIG. 7D, the IL 516 can be formed over surfaces of the semiconductor layers 504 and 506 in some embodiments. More importantly, the gate dielectric layer 518 is formed to cover all surfaces exposed from the gate trench 512a. Further, the gate dielectric layer 518 can include high-k dielectric material as mentioned above.

Figure 7F:
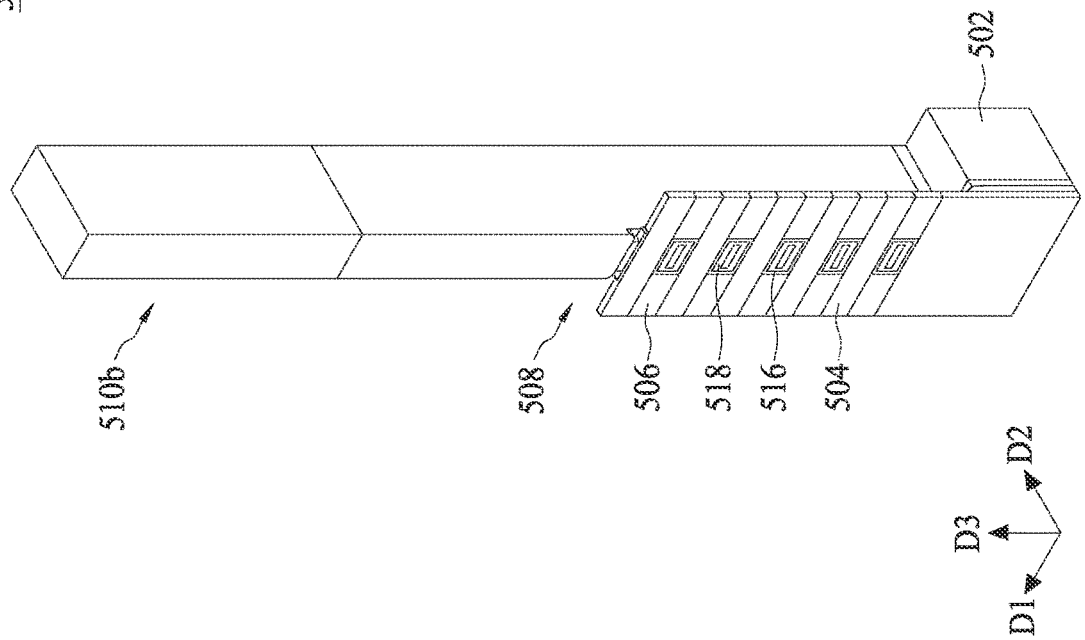
Figure 7E:
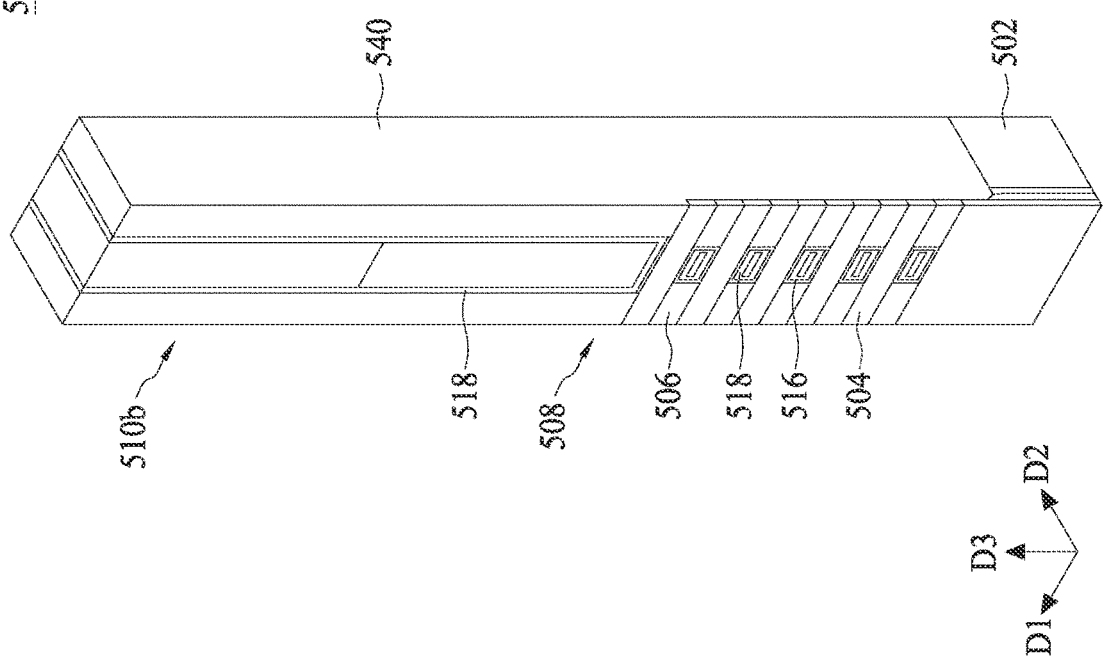

Referring to FIGS. 7E-7F, a dummy gate structure 510b is then formed in the gate trench 512a according to operation 210 and followed by removing the sacrificial insulating structure 540 according to operation 212. As shown in FIG. 7E, the dummy gate structure 510b is formed to fill the gate trench 512a, and a planarization process, such as a CMP can be performed to remove superfluous materials. Further, sidewalls of the dummy gate structure 510b are in contact with the gate dielectric layer 518. Next, at least a portion of the sacrificial insulating structure 540 is removed. More importantly, the gate dielectric layer 518 over the sidewalls of the dummy gate structure 510b is then removed. Consequently, the sidewalls of the dummy gate structure 510b are exposed as shown in FIG. 7F. Further, portions of the fin structure 508 are exposed from the dummy gate structure 510b while another portions of the fin structure 508 is overlapped by the dummy gate structure 510b. As mentioned above, the portions of the fin structure 508 underlying the dummy gate structure 510b may be referred to as the channel region.

Figure 7H:
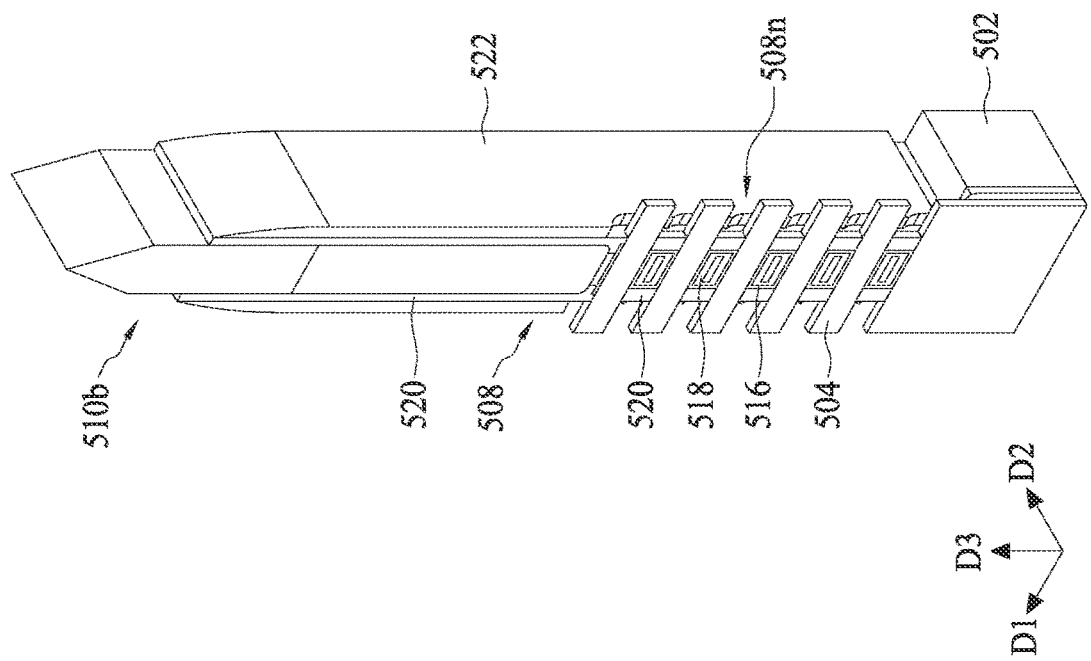
Figure 7G:
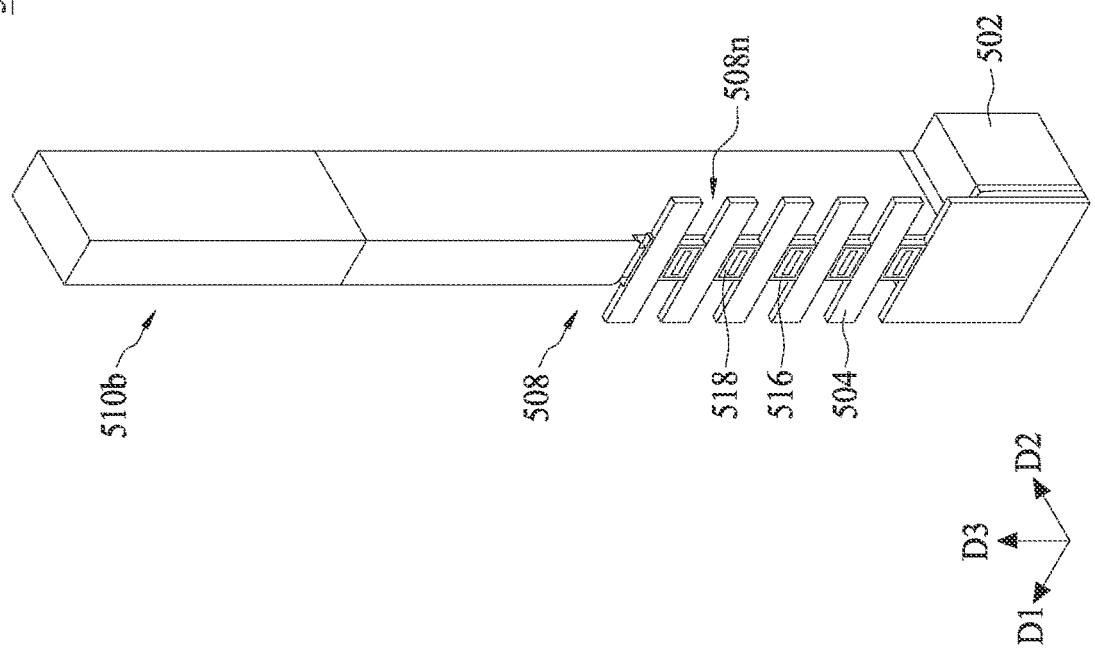

Referring to FIG. 7G, portions of the fin structure 508 such as portions of the semiconductor layers 506 exposed from the dummy gate structure 510b are removed, thereby a plurality of notches 508n is formed in the fin structure 508 as shown in FIG. 7G. In some embodiments, the semiconductor layers 504 are exposed from a top and a bottom of the notches 508n while the IL 518 is exposed from a sidewall of the notches 508n.

Referring to FIG. 7H, inner spacers 520 are then formed in the notches 508n. The inner spacers 520 are formed not only in the notches 508n, but also over the sidewalls of the dummy gate structure 510b. Next, a spacer 522 is formed over the inner spacer 520. In some embodiments, the inner spacer 520 and the spacer 522 include the same insulating material. In some embodiments, the inner spacer 520 and the spacer 522 include different insulating materials. Briefly speaking, insulating spacer (including the inner spacer 520 and the spacer 522) is disposed over the sidewalls of the dummy gate structure 510b while portions of the fin structure 508 are exposed from the insulating spacer 520/522 according to operation 214.

Figure 7J:
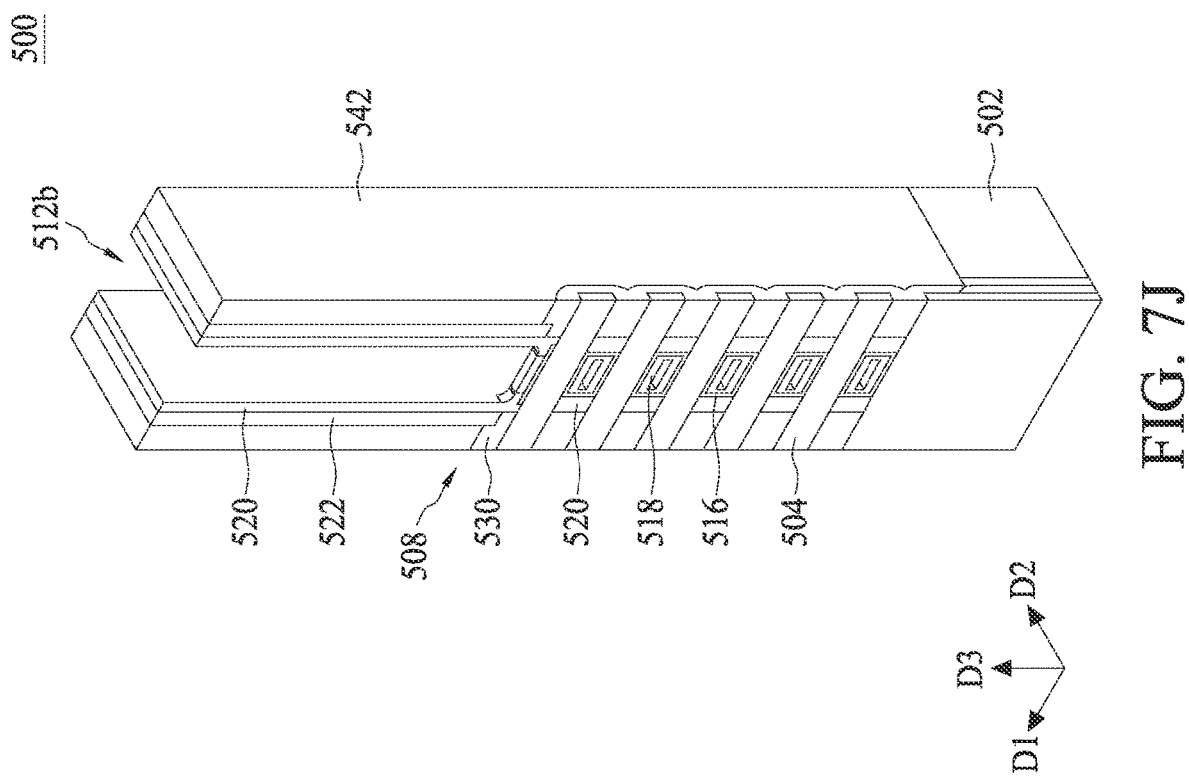
Figure 7I:
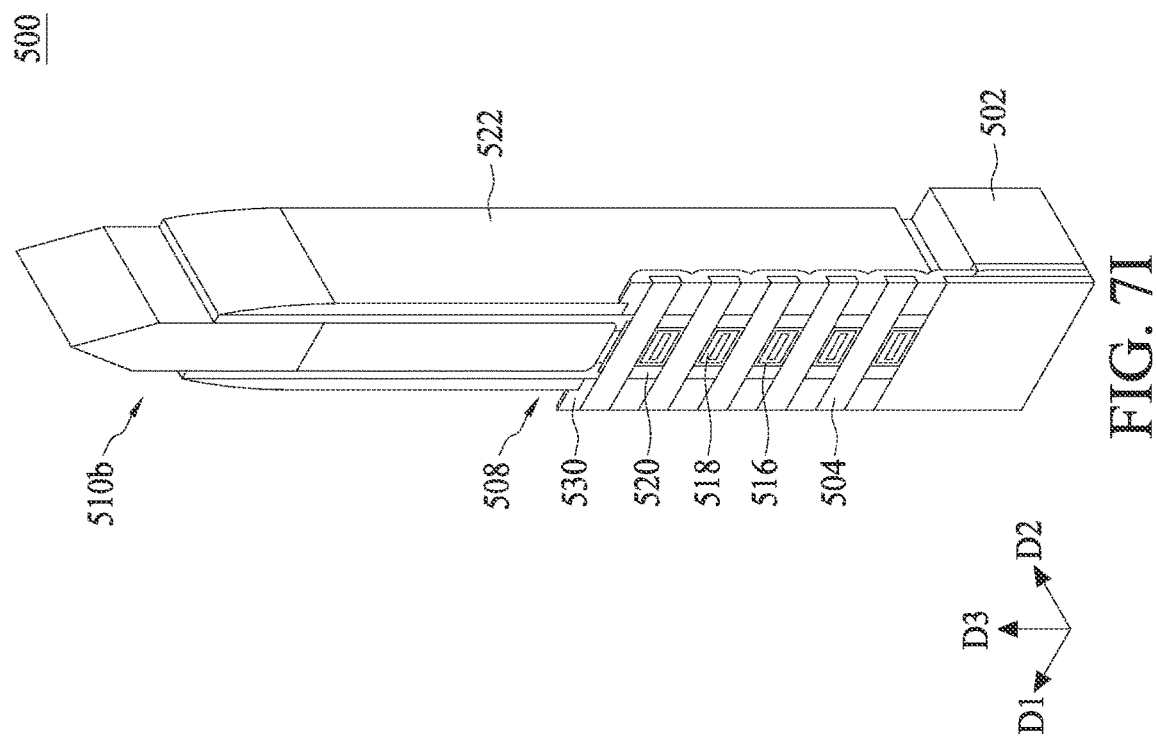

Referring to FIG. 7I, a source/drain region 530 is formed in the exposed portions of the fin structure 508, such as the exposed portions of the semiconductor layers 504. Referring to FIG. 7J, a dielectric structure 542 is disposed over the substrate 502. As mentioned above, the dielectric structure 542 can include an etch-stop layer (e.g., CESL) (not shown) and various dielectric layers (e.g., an ILD layer) (not shown). In some embodiments, after the CESL and the ILD layer are deposited, a planarization process, such as a CMP operation, may be performed to the dielectric structure 542 and to expose a top surface of the dummy gate structure 510b. Still referring to FIG. 7J, the dummy gate structure 510b is removed to form a gate trench 512b in the dielectric structure 542 after forming the dielectric structure 542 according to operation 216. As shown in FIG. 7J, the insulating spacer, such as the inner spacer 520 is exposed from sidewalls of the gate trench 512b. Also, the gate dielectric layer 518 is exposed from the gate trench 512b.

Figure 7K:
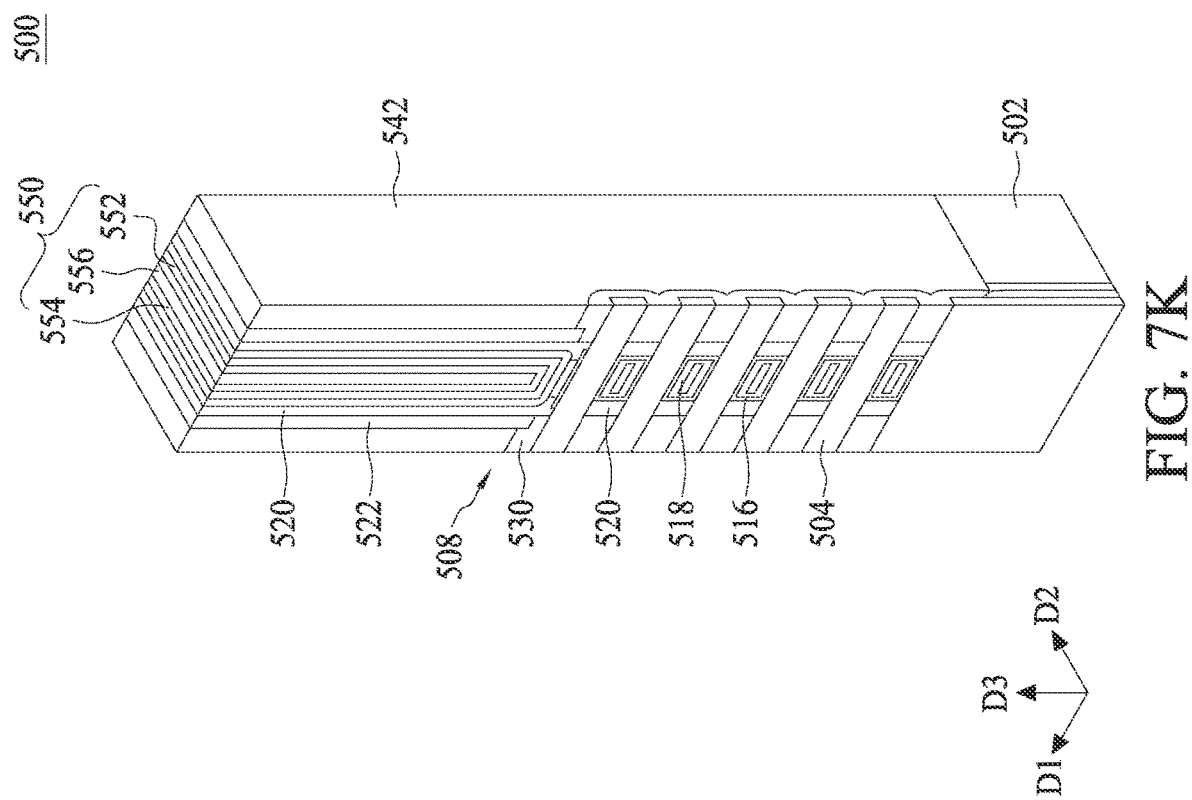

Referring to FIG. 7K, a gate conductive structure 550 is then disposed in the gate trench 512b according to operation 218. In some embodiments, the gate conductive structure 550 is formed over the gate dielectric layer 518. More importantly, sidewalls of the gate conductive structure 550 are in contact with the spacer 520 as shown in FIG. 7K. In some embodiments, the gate structure 550 can include at least a barrier metal layer 552, a work functional metal layer 554 and a gap-filling metal layer 556. Accordingly, the multi-gate semiconductor device 500 is obtained as shown in FIG. 7K. More importantly, sidewalls of the gate conductive structure 550 are in contact with the spacer 520.

FIG. 8A through FIG. 8K illustrates a multi-gate semiconductor device at various fabrication stages constructed according to aspects of the present disclosure in one or more embodiments. It should be noted that elements the same in FIGS. 3A-3N and FIGS. 8A-8K can include same materials, thus those details for the materials are omitted in the interest of brevity.

Figure 8B:
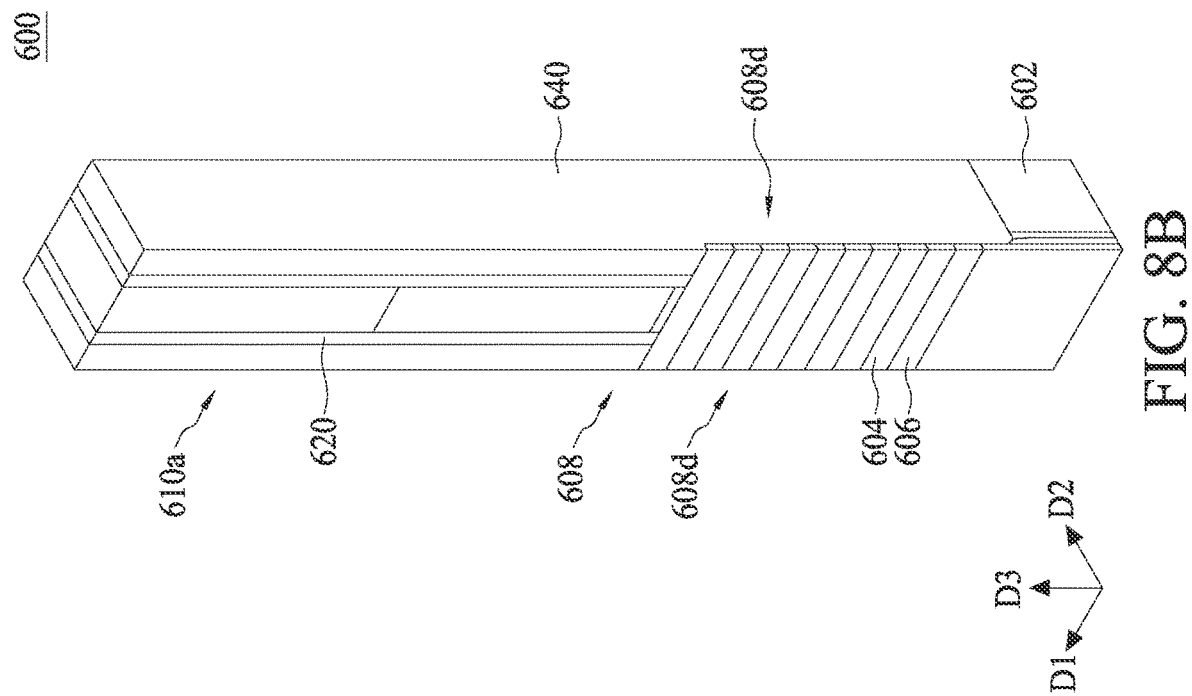
FIG. 8A through FIG. 8K illustrate a multi-gate semiconductor device at various fabrication stages constructed according to aspects of the present disclosure in one or more embodiments.
Figure 8A:
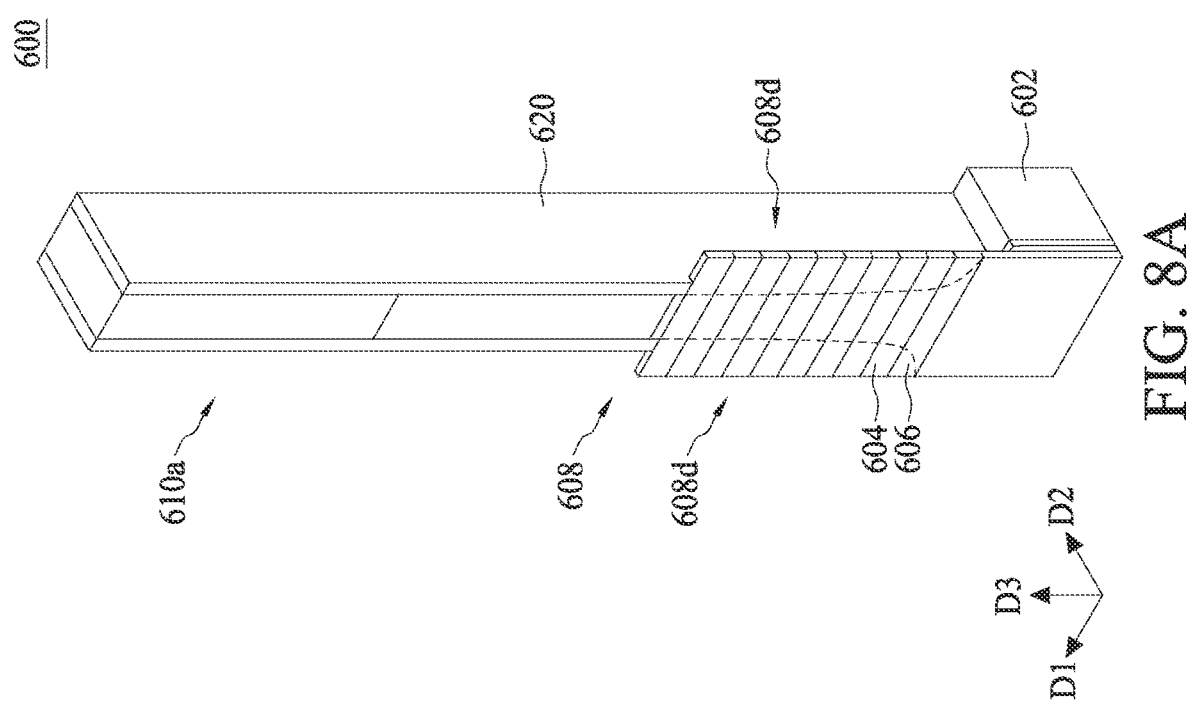

Referring to FIG. 8A, a substrate 602 is provided. In some embodiments, a SRB layer (not shown) can be formed over the substrate 602. A fin structure 608 including semiconductor layers is formed over the substrate 602 or the SRB layer. The fin structure 608 may include alternating layers of different compositions. For example, in some embodiments, the fin structure 608 includes semiconductor layers 604 of a first composition alternating with semiconductor layers 606 of a second composition. As mentioned above, the semiconductor layers 604 and the semiconductor layers 606 may be used to selectively process some of the layers. Accordingly, the compositions may have different oxidation rates, etchant sensitivity, and/or other differing properties. Further, the fin structure 608 can be extended along a first direction D1 as shown in FIG. 8A. Accordingly, the substrate 602 including the at least one fin structure 808 is provided according to operation 202. Further, in some embodiments, a liner (not shown) can be formed over the fin structure 608 and the substrate 602.

Still referring to FIG. 8A, a dummy gate structure 610a is disposed over the fin structure 608 and the substrate 602. In some embodiments, the dummy gate structure 610a is formed over the substrate 602 and is extended along a second direction D2, which is not parallel with the first direction D1. Additionally, the first direction D1 and the second direction D2 are in the same plane. The dummy gate structure 610a at least partially disposed over the fin structure 608, and thus portions of the fin structure 608 are exposed from the dummy gate structure 610a. Thereafter, an etching rate modification is performed. In some embodiments, doped regions 608d including an etching rate lower than the rest portions of the fin structure 608 are formed. A conductive spacer 620 is then formed over the substrate 602. In some embodiments, a conductive layer is conformally disposed over the substrate 602, and followed by a suitable etching operation such as dry etching operation. Thus portions of the conductive layer are removed to form the spacer 620. As shown in FIG. 8A, the sidewalls of the dummy gate structure 610a is covered by the spacer 620 while portions of the fin structure 608 and the substrate 602 are exposed from the spacer 620.

Figure 8D:
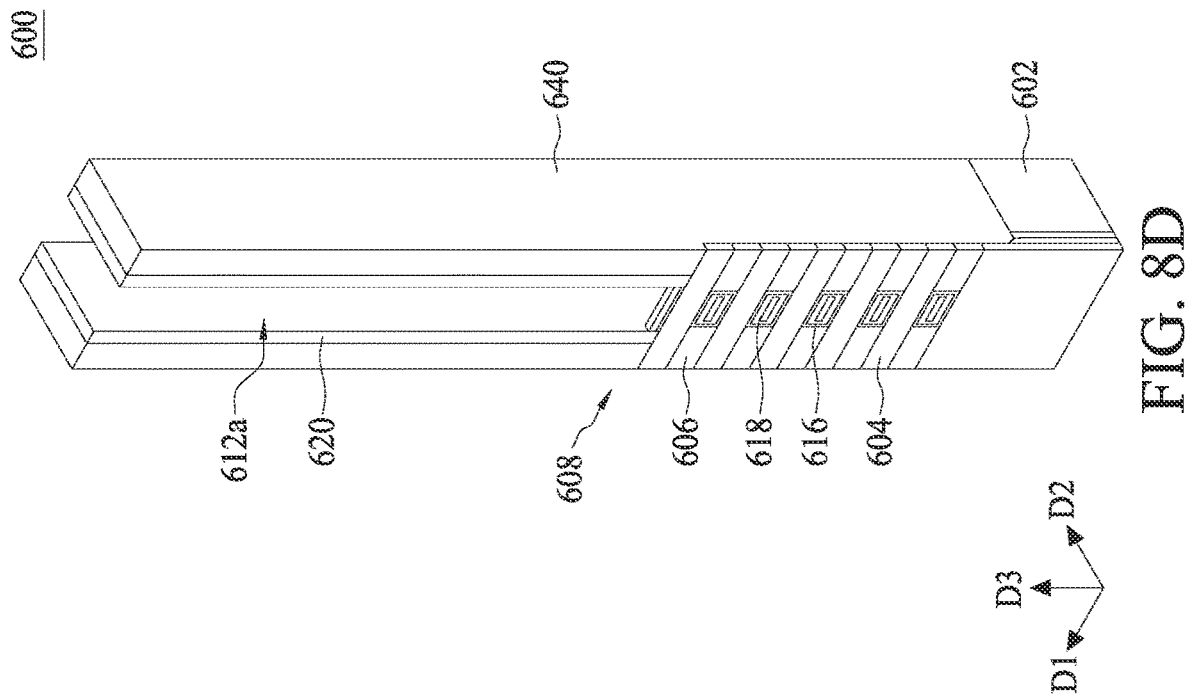
Figure 8C:
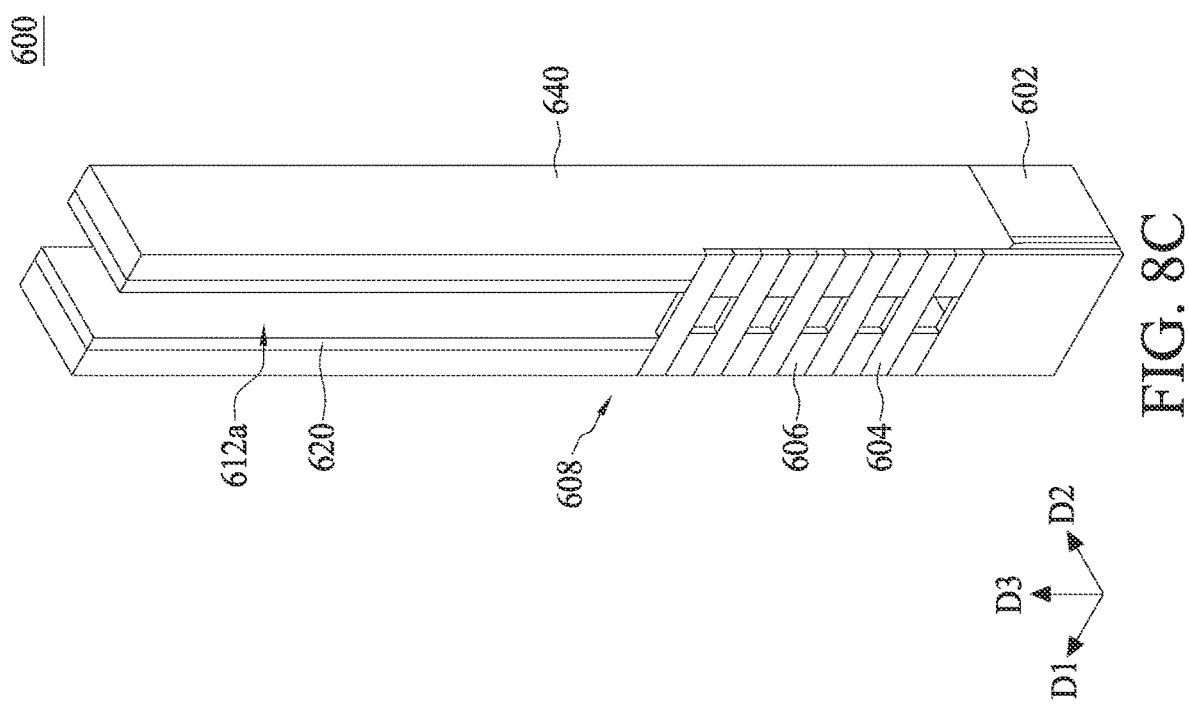

Referring to FIGS. 8B-8C, after forming the spacer 620, a sacrificial insulating structure 640 is disposed over the fin structure 608 and the substrate 602 according to operation 204. In some embodiments, the sacrificial insulating structure 640 is formed over the substrate 602 and followed by a planarization process, such as a CMP, thus a top surface of the dummy gate structure 610a is exposed as shown in FIG. 8B. Next, the dummy gate structure 610a is removed to form a gate trench 612a. Further, the liner disposed over the fin structure 608 can be removed subsequently. Next, the semiconductor layers 606 exposed from the gate trench 612a are then removed. Since the etching rate of the doped regions 608d is modified to be lower as mentioned above, removal of the semiconductor layers 606 can be stopped at the doped regions 608d, as shown in FIG. 8C. Accordingly, a plurality of wires including the semiconductor layers 604 is obtained and exposed from the gate trench 612a as shown in FIG. 8C. In other words, the gate trench 612a is formed in the sacrificial insulating structure 620 with a portion of the fin structure 608 being exposed from the gate trench 612a according to operation 206.

Referring to FIG. 8D, an IL 616 is formed over the semiconductor layers 604 and followed by forming a gate dielectric layer 618 over the fin structure 608 according to operation 208. In some embodiments, a barrier layer (not shown) such as the aforementioned SAM can be formed over the sidewalls of the gate trench 612a, and followed by sequentially forming the IL 616 and the gate dielectric layer 618. Since operations for forming the barrier layer, the IL 616 and the gate dielectric later 618 are similar to those shown in FIGS. 3I-3K or FIGS. 4A-4D, those details are omitted for brevity. Accordingly, the gate dielectric layer 618 is formed over the semiconductor layers 604 while the spacer 620 is still exposed from the sidewalls of the gate trench 612a as shown in FIG. 8D.

Figure 8F:
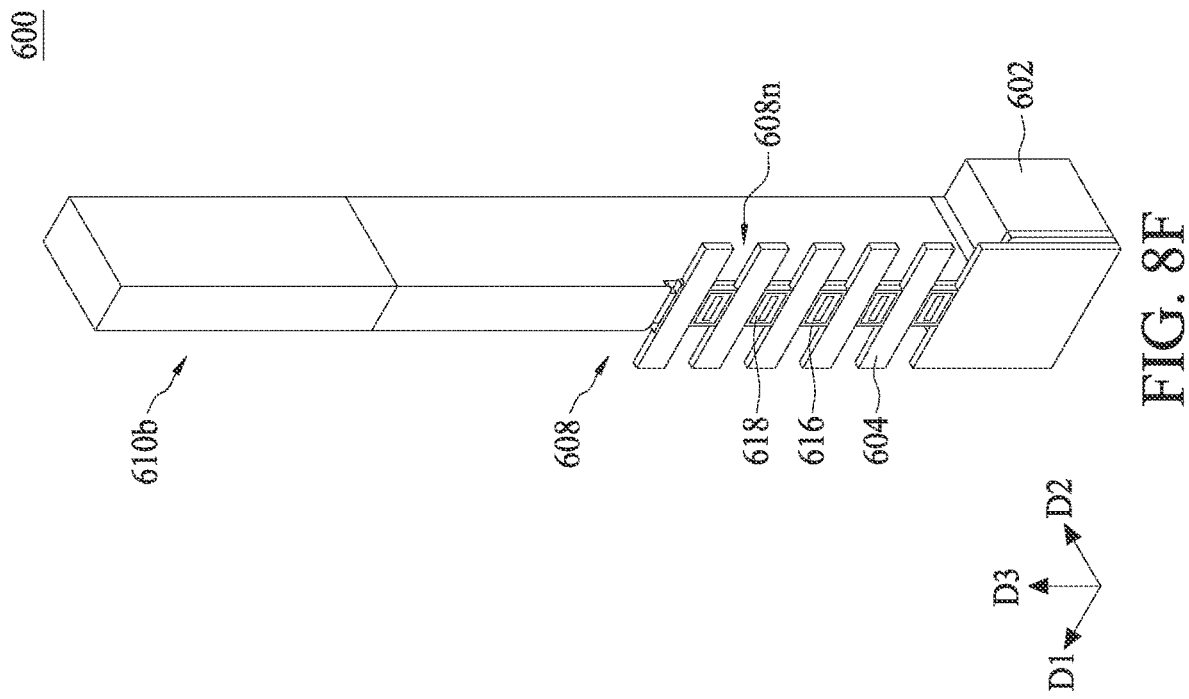
Figure 8E:
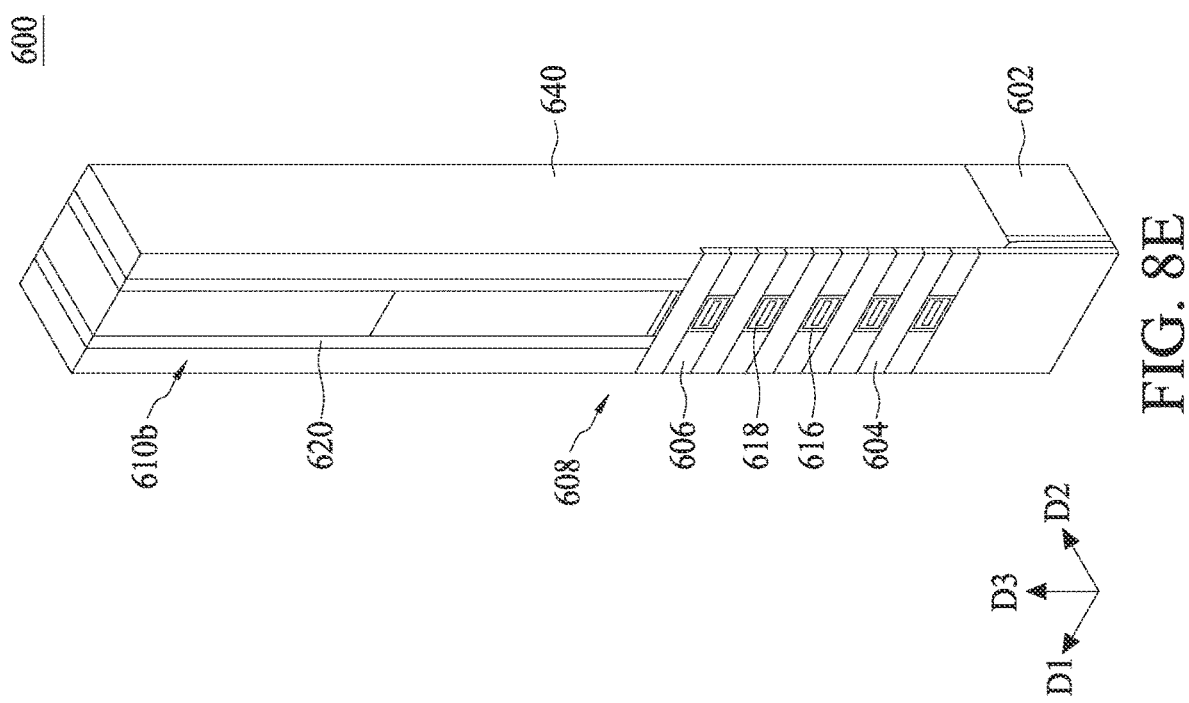

Referring to FIGS. 8E-8F, a dummy gate structure 610b is then formed in the gate trench 612a according to operation 210 and followed by removing the sacrificial insulating structure 640 according to operation 212. As shown in FIG. 8E, the dummy gate structure 610b is formed to fill the gate trench 612a, and a planarization process, such as a CMP can be performed to remove superfluous materials. Sidewalls of the dummy gate structure 610b are in contact with the spacer 620. Next, at least a portion of the sacrificial insulating structure 640 is removed. More importantly, the spacer 620 is removed after removing the dummy insulating structure 640. Consequently, sidewalls of the dummy gate structure 610b are exposed as shown in FIG. 8F. Further, portions of the fin structure 608 are exposed from the dummy gate structure 610b while another portions of the fin structure 608 is overlapped by the dummy gate structure 610b. As mentioned above, the portions of the fin structure 608 underlying the dummy gate structure 610b may be referred to as the channel region. Still referring to Referring to FIG. 8F, the portions of the fin structure 608 such as the portions of the semiconductor layers 606 exposed from the dummy gate structure 610b are removed, thereby a plurality of notch 608n is formed in the fin structure 608. In some embodiments, the semiconductor layers 604 are exposed from a top and a bottom of the notch 608n while the IL 618 is exposed from a sidewall of the notches 608n.

Figure 8G:
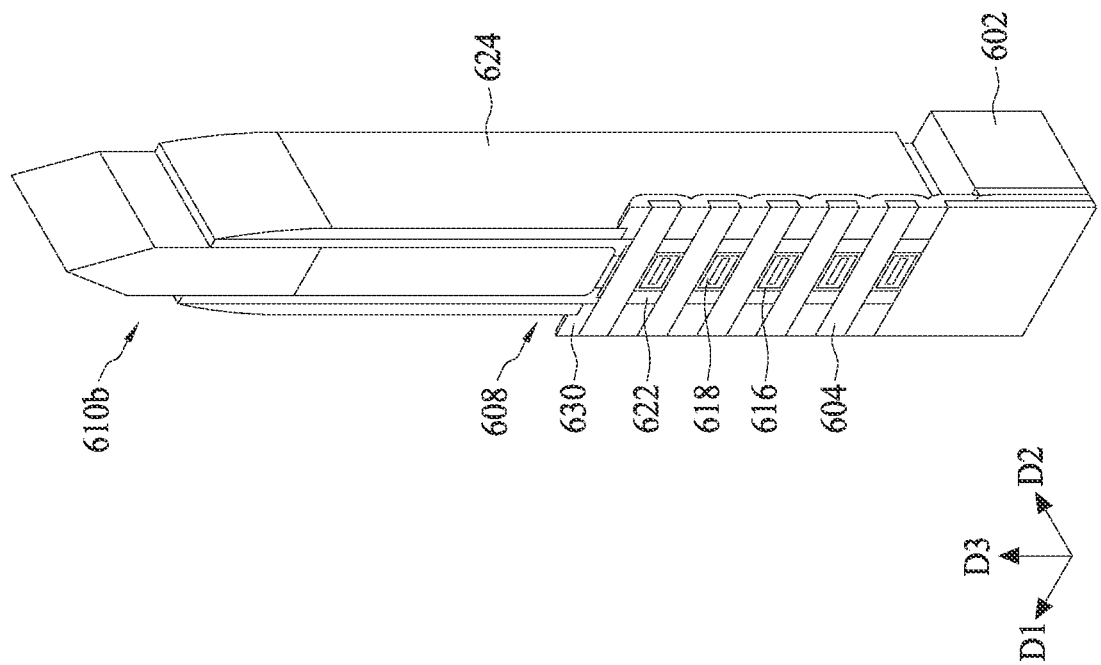

Referring to FIG. 8G, inner spacers 622 are then formed in the notches 608n. The inner spacers 622 are formed not only in the notches 608n, but also over the sidewalls of the dummy gate structure 610b. Next, a spacer 624 is formed over the inner spacer 622. In some embodiments, the inner spacer 622 and the spacer 624 include the same insulating material. In some embodiments, the inner spacer 622 and the spacer 624 include different insulating materials. Briefly speaking, insulating spacer (including the inner spacer 622 and the spacer 624) is disposed over the sidewalls of the dummy gate structure 610b while portions of the fin structure 608 are exposed from the insulating spacer 622/624 according to operation 214.

Figure 8H:
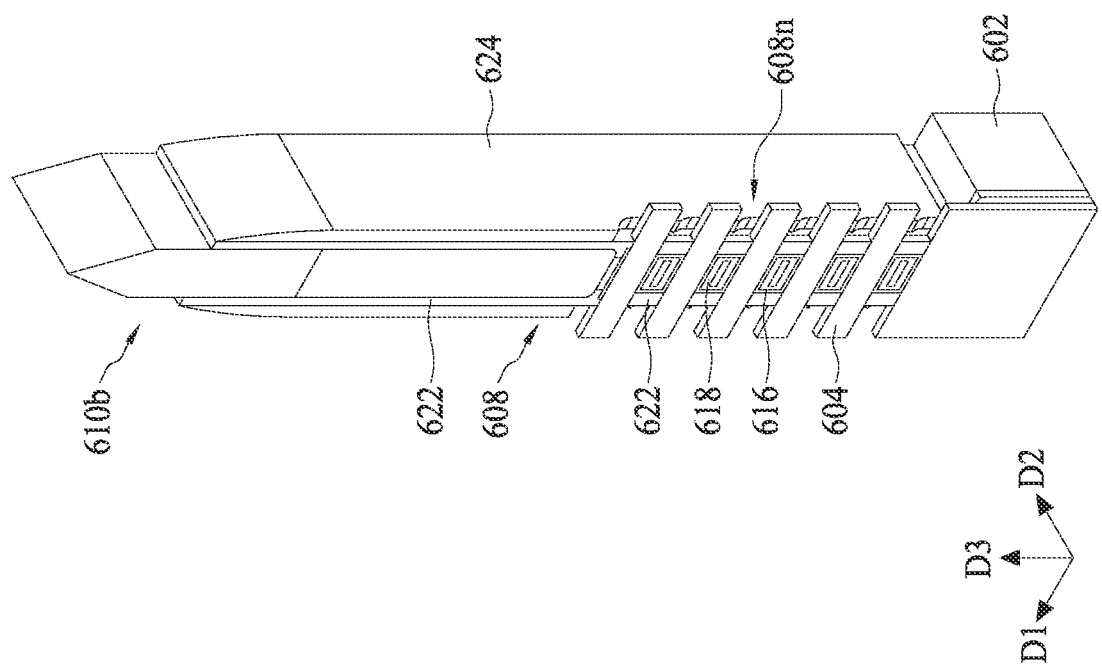

Referring to FIG. 8H, a source/drain region 630 is formed in the portions of the fin structure 608 exposed from the dummy gate structure 610b and the insulating spacers 622/624. As shown in FIG. 8H, the source/drain region 630 wraps the exposed portions of the fin structure 608, such as the exposed portions of the semiconductor layers 604.

Figure 8J:
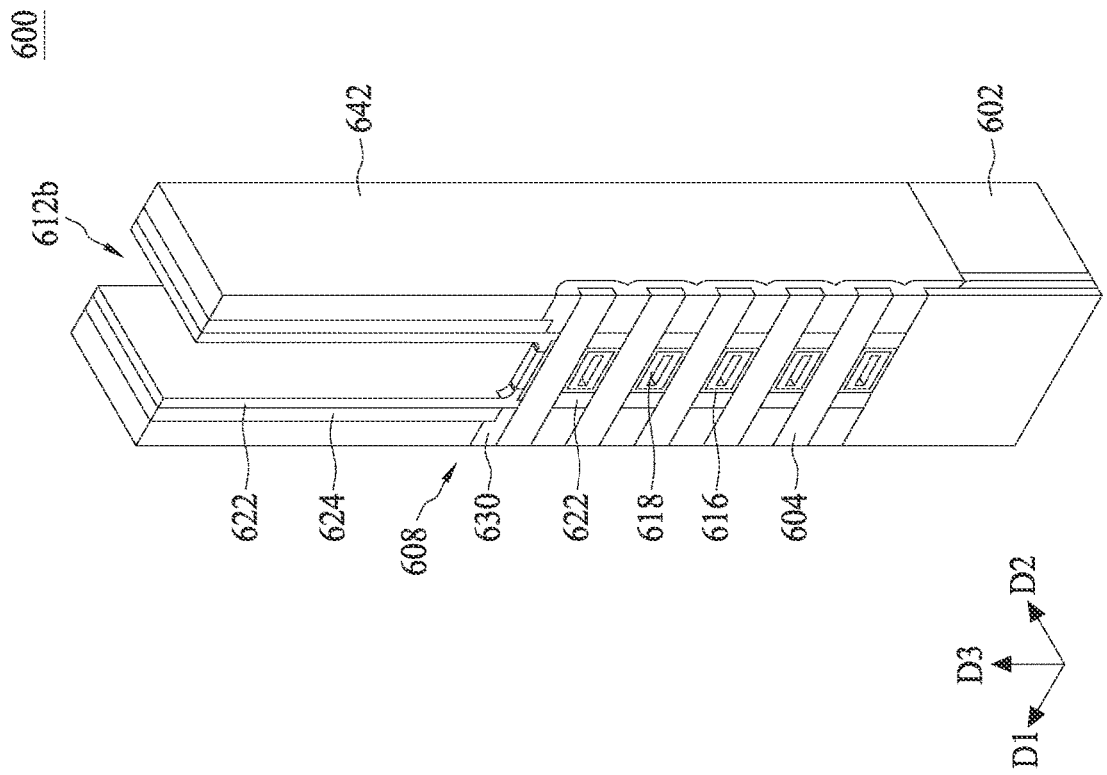
Figure 8I:
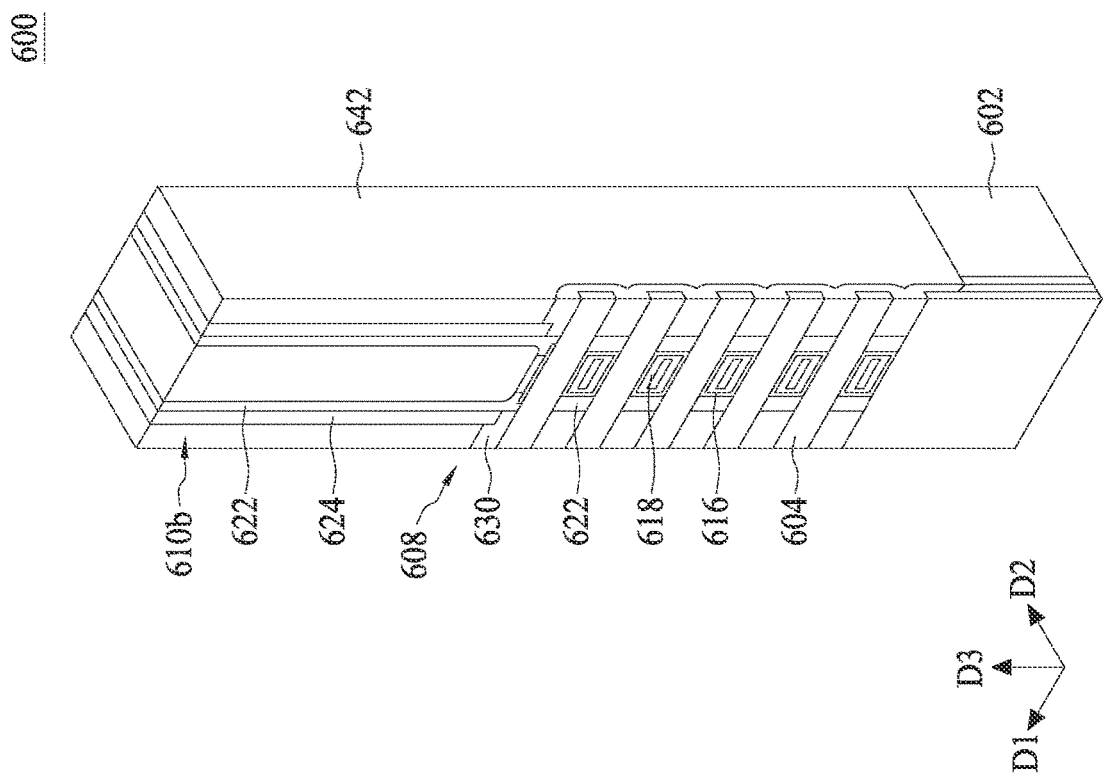

Referring to FIG. 8I, a dielectric structure 642 is disposed over the substrate 642. As mentioned above, the dielectric structure 642 can include an etch-stop layer (e.g., CESL) (not shown) and various dielectric layers (e.g., an ILD layer) (not shown). In some embodiments, after the CESL and the ILD layer are deposited, a planarization process, such as a CMP operation, may be performed to the dielectric structure 642 and to expose a top surface of the dummy gate structure 610b. Referring to FIG. 8J, the dummy gate structure 610b is removed to form a gate trench 612b in the dielectric structure 642 after forming the dielectric structure 642 according to operation 216. As shown in FIG. 8J, the insulating spacer, such as the inner spacer 622 is exposed from sidewalls of the gate trench 612b.

Figure 8K:
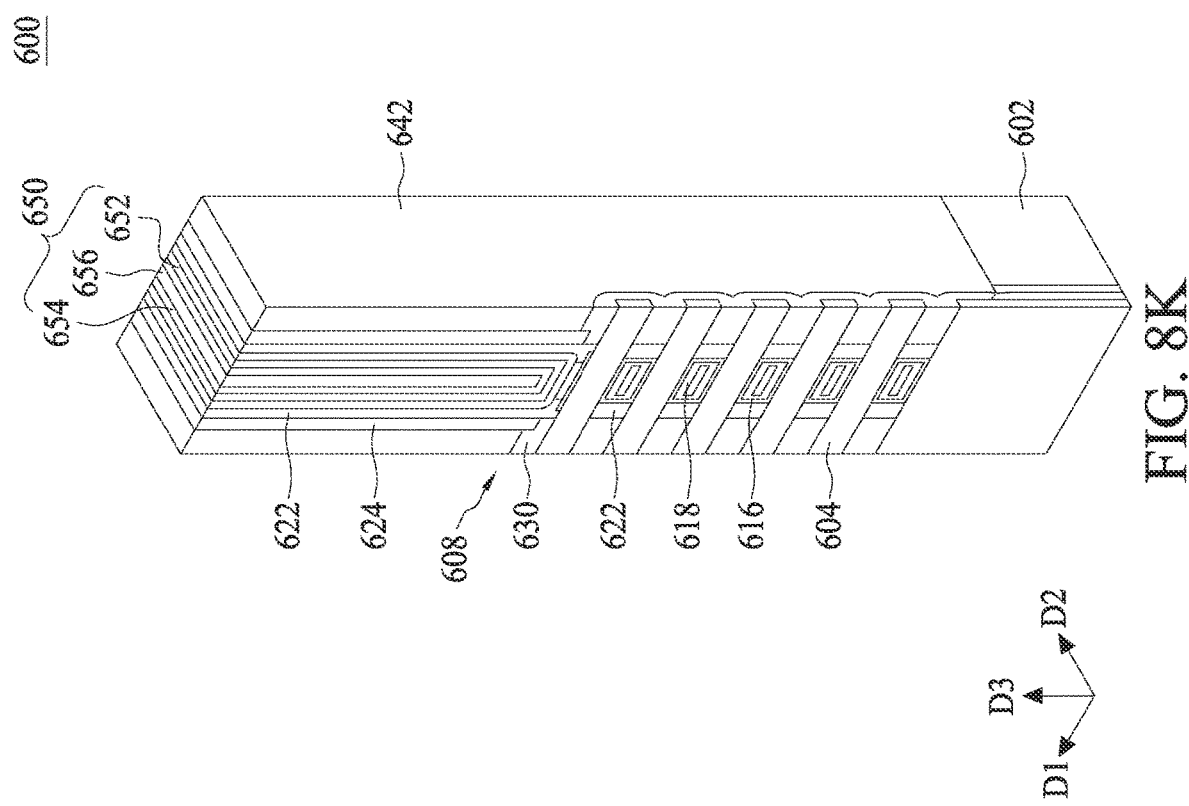

Referring to FIG. 8K, a gate conductive structure 650 is then disposed in the gate trench 612b according to operation 218. In some embodiments, the gate conductive structure 650 is formed on the gate dielectric layer 618. More importantly, sidewalls of the gate conductive structure 650 are in contact with the spacer 622 as shown in FIG. 8K. In some embodiments, the gate structure 650 can include at least a barrier layer 652, a work functional metal layer 654 and a gap-filling layer 656. Accordingly, the multi-gate semiconductor device 600 is obtained as shown in FIG. 8K. More importantly, sidewalls of the gate conductive structure 650 are in contact with the spacer 622.

Figure 9D:
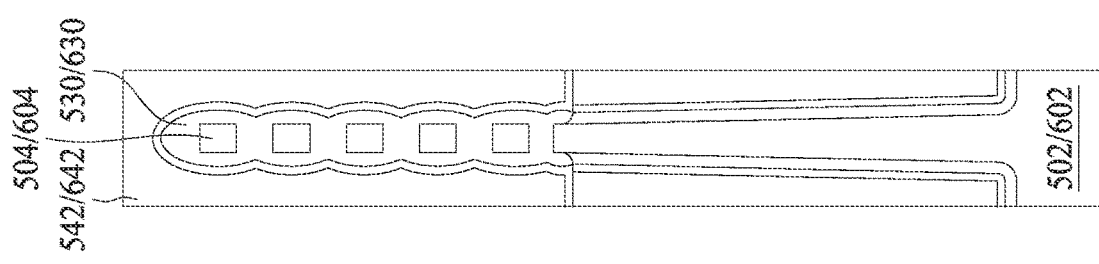
FIG. 9A through FIG. 9D are cross-sectional views of the multi-gate semiconductor device according to aspects of the present disclosure in one or more embodiments.
Figure 9C:
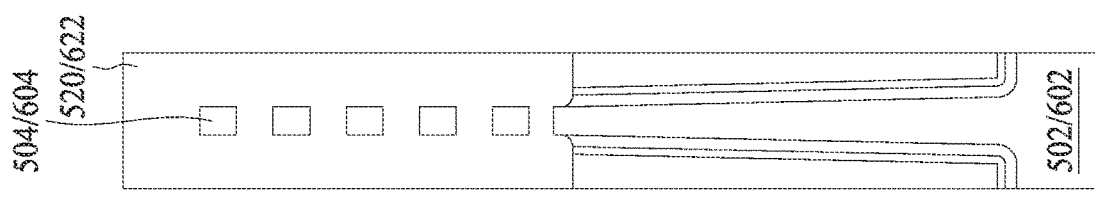
Figure 9B:
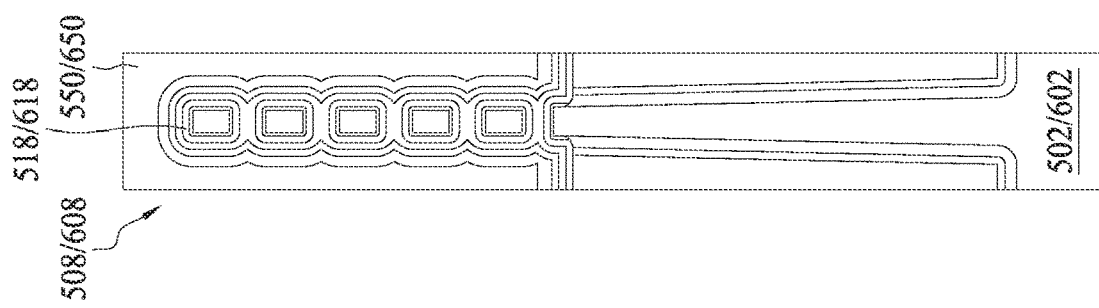
Figure 9A:
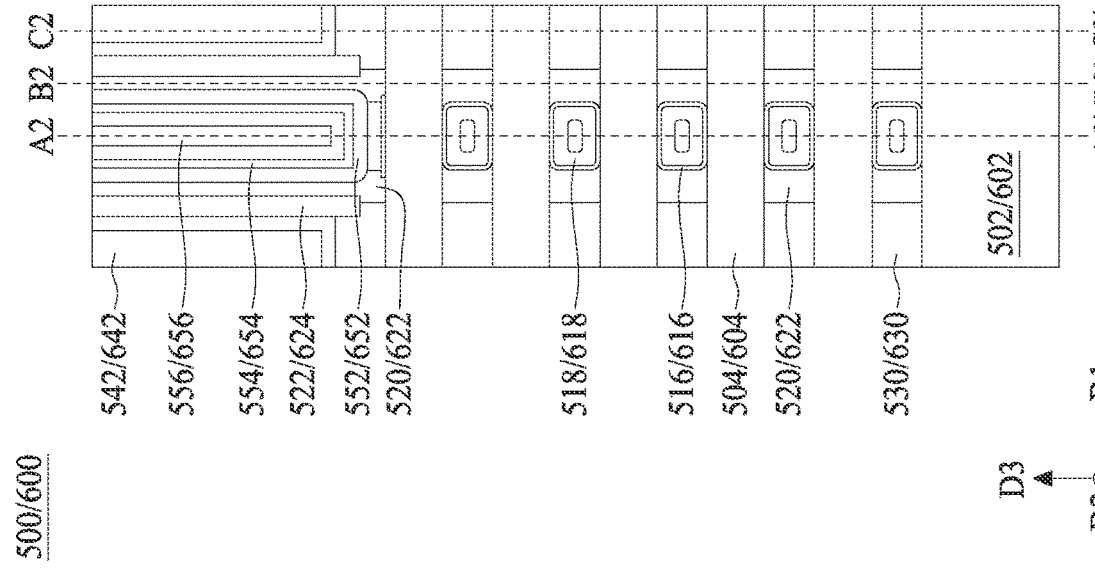

FIG. 9A through FIG. 9D are cross-sectional views of the multi-gate semiconductor device 500 and 600 according to aspects of the present disclosure in one or more embodiments. FIG. 9A is a cross-sectional view of the semiconductor device 500 and 600 taken along the first direction D1, FIG. 9B is a cross-sectional view taken along line A2-A2' of FIG. 9A, FIG. 9C is a cross-sectional view taken along line B2-B2' of FIG. 9A, and FIG. 9D is a cross-sectional view taken along line C2-C2' of FIG. 9A. Referring to FIGS. 9A-9D, a multi-gate semiconductor device 500 and 600 can be provided. The multi-gate semiconductor device 500/600 includes the substrate 502/602, the fin structure 508/608 such as the stacked wire structure 508/608 disposed over the substrate 502/602, a gate wrapping the stacked wire structure, and spacer disposed over two sidewalls of the gate. As shown in FIGS. 9A-9D, the gate includes the gate conductive structure 550/650 and the gate dielectric layer 518/618 sandwiched between the gate conductive structure 550/650 and the stacked wire structure. As shown in FIG. 9B, portions of the semiconductor layers 504/604 (the semiconductors 504/604) are sequentially wrapped by the IL 516/616, the gate dielectric layer 518/618, and the barrier metal layer 552/652 of the gate conductive structure 550/650. As shown in FIG. 9C, another portions of the stacked wire structure are wrapped by the insulating spacer 520/622. As shown in FIG. 9D, still another portions of the 504/604 are wrapped by the source/drain region 530/630. More importantly, the sidewalls of the gate conductive structure 550/650, such as the barrier metal layer 552/652, are in contact with the insulating spacer 520/622.

Figure 10D:
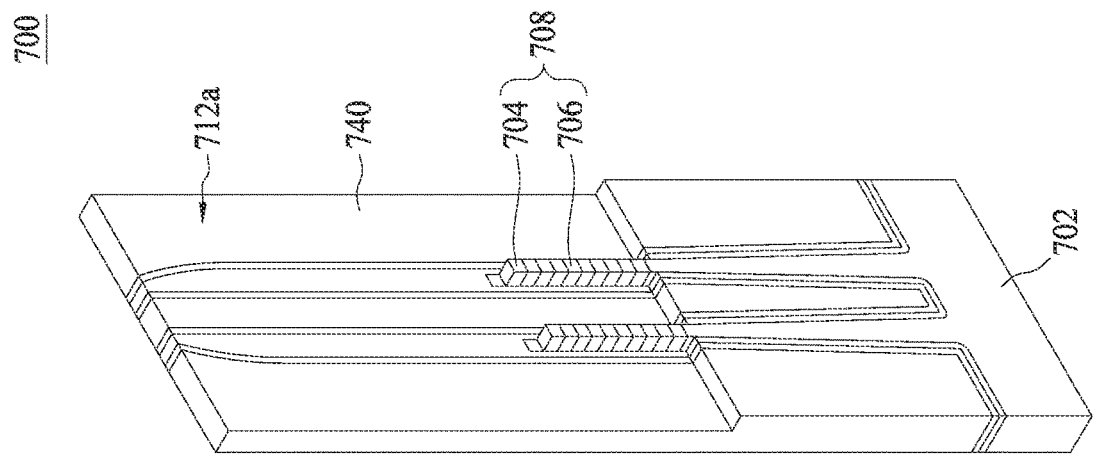
FIG. 10A through FIG. 10O illustrate a multi-gate semiconductor device at various fabrication stages constructed according to aspects of the present disclosure in one or more embodiments.
Figure 10C:
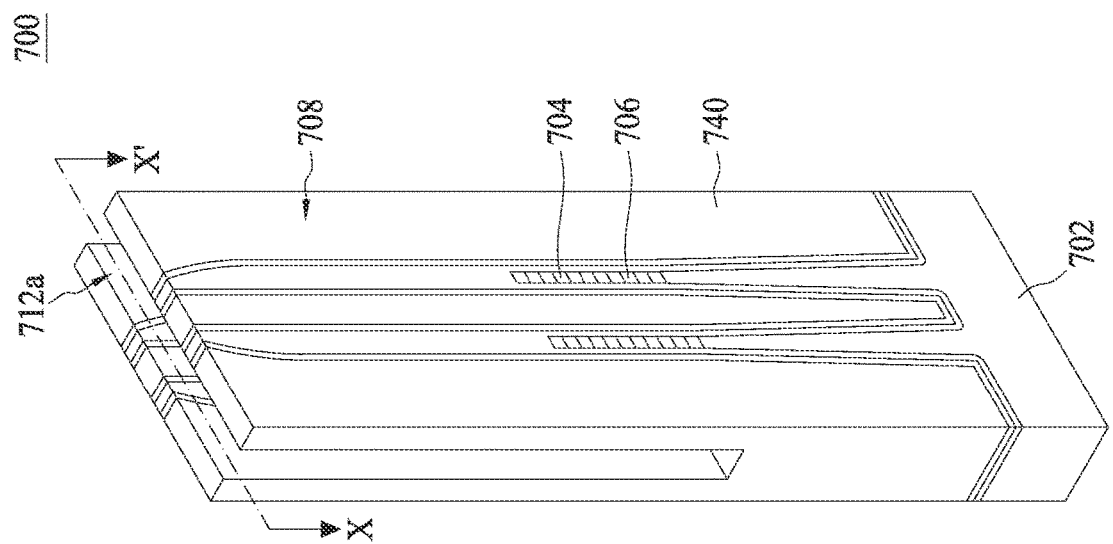
Figure 10F:
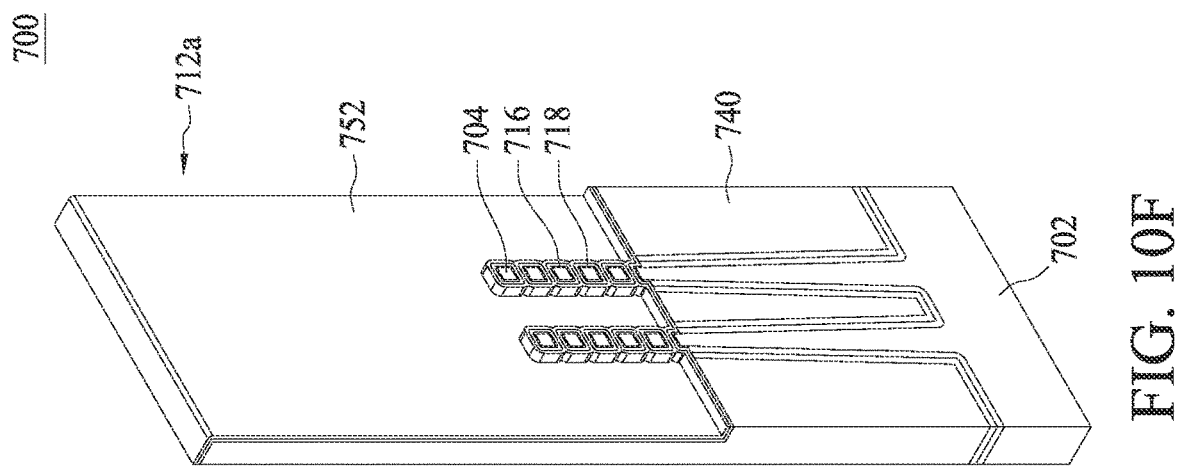
Figure 10E:
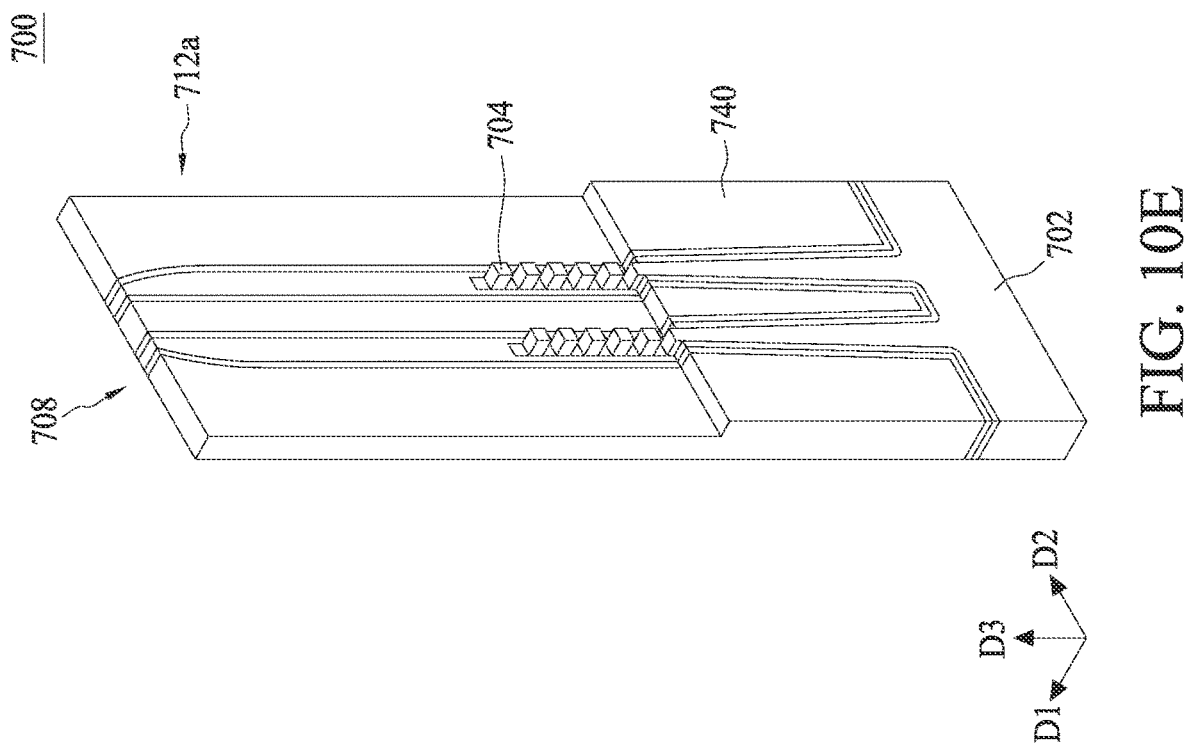
Figure 10H:
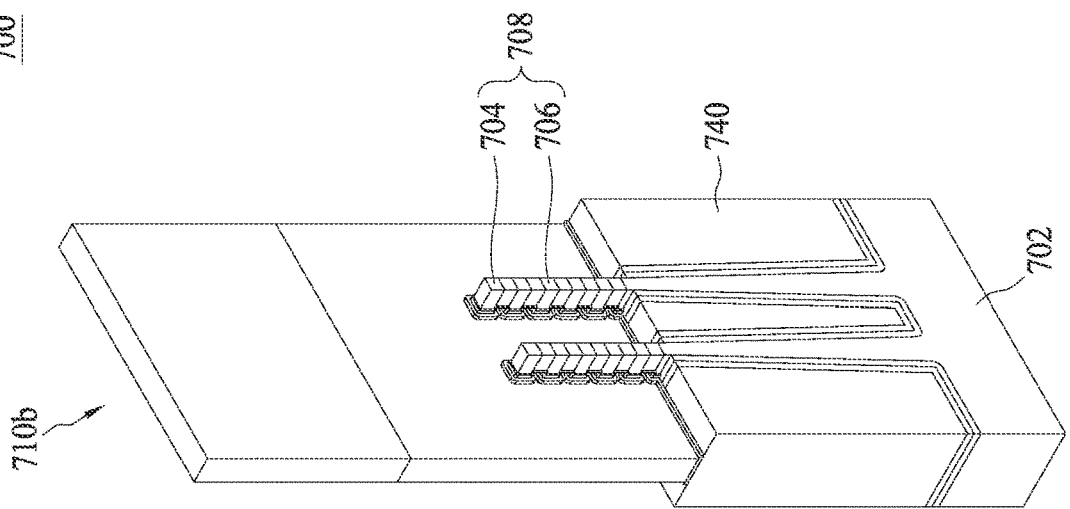
Figure 10G:
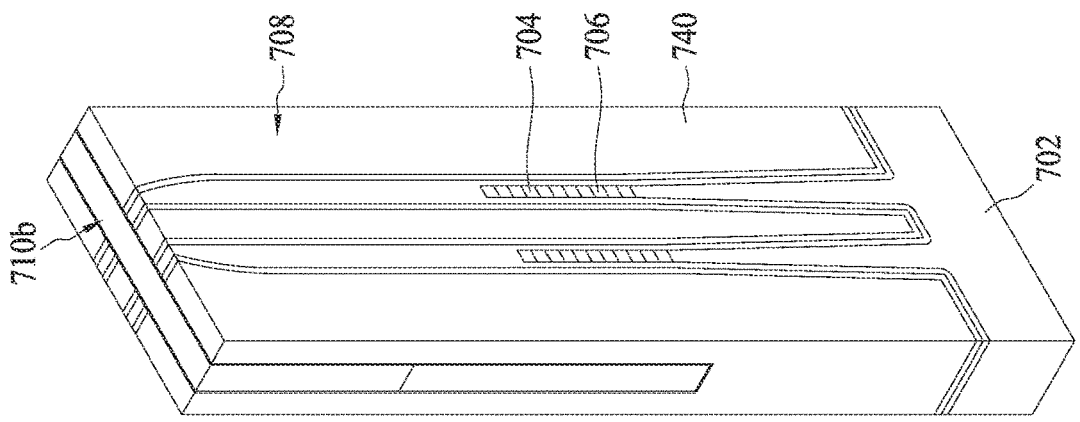
Figure 10I:
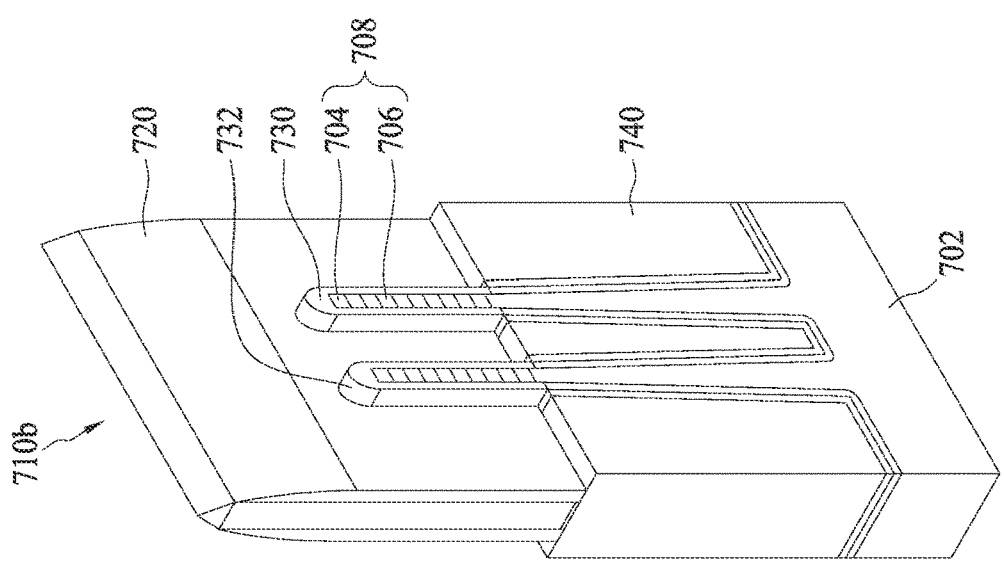
Figure 10J:
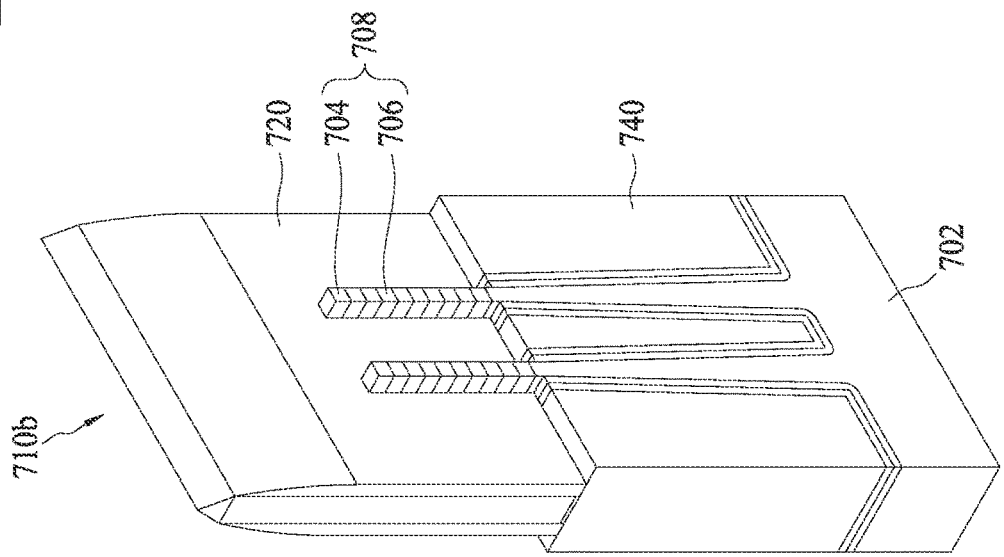
Figure 10L:
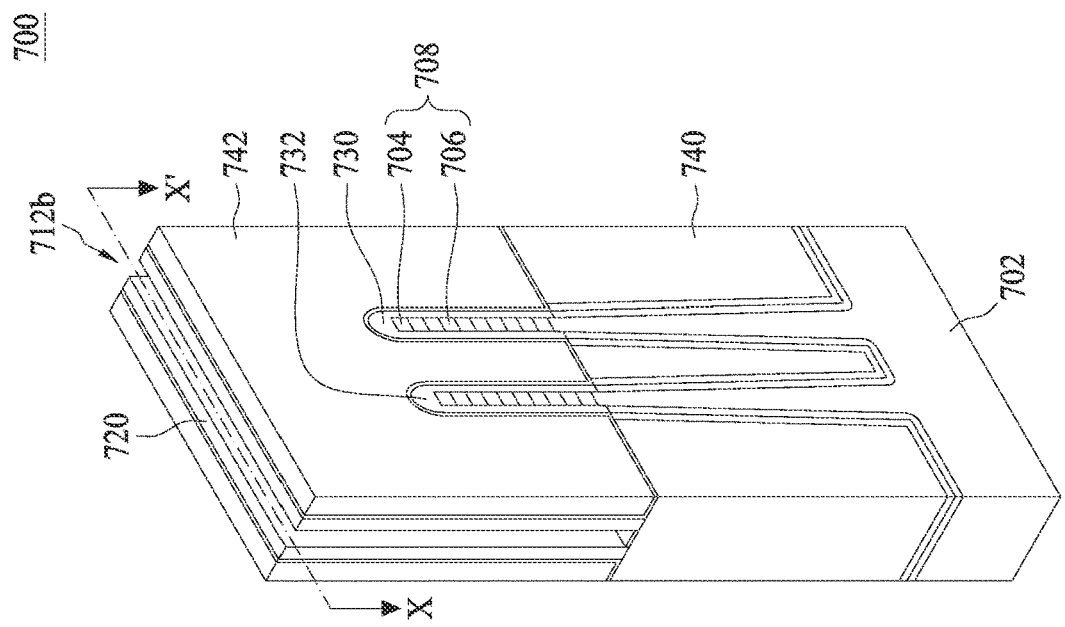
Figure 10K:
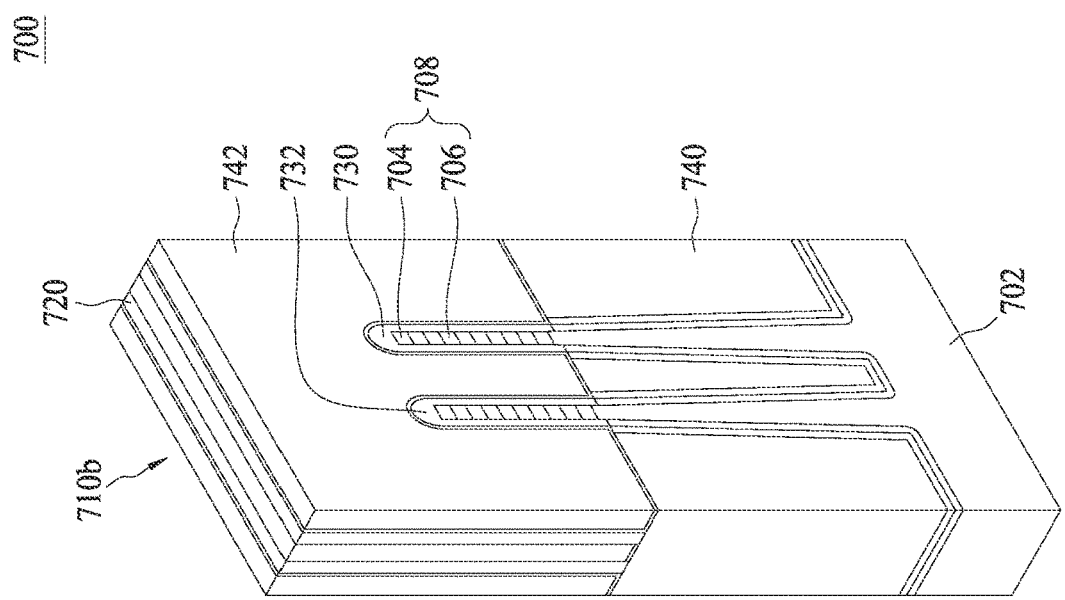
Figure 10N:
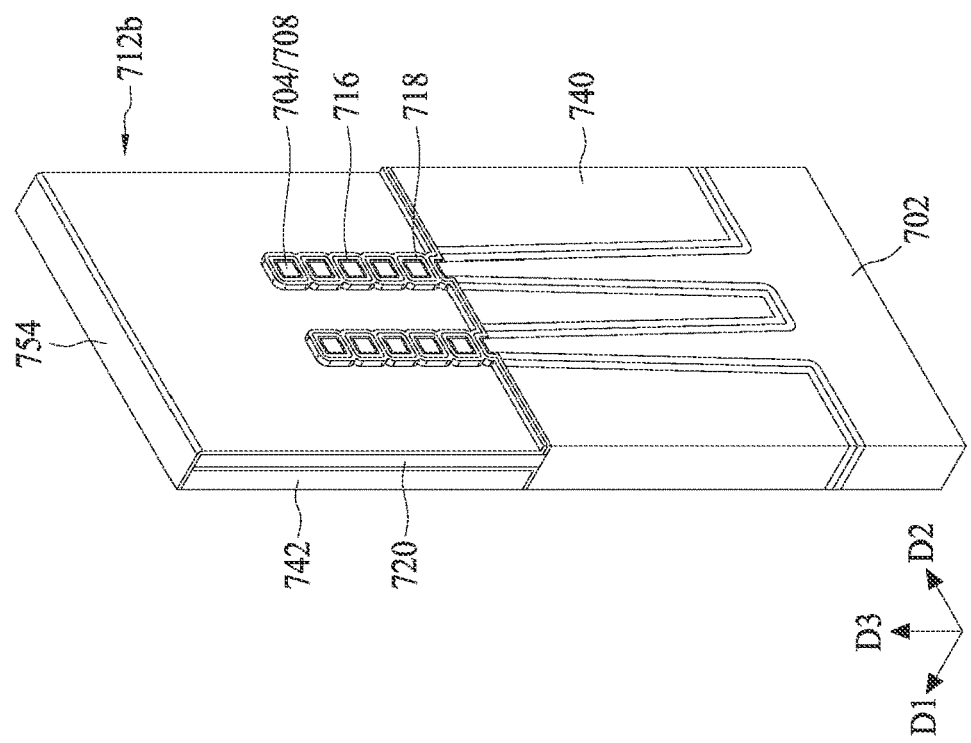
Figure 10M:
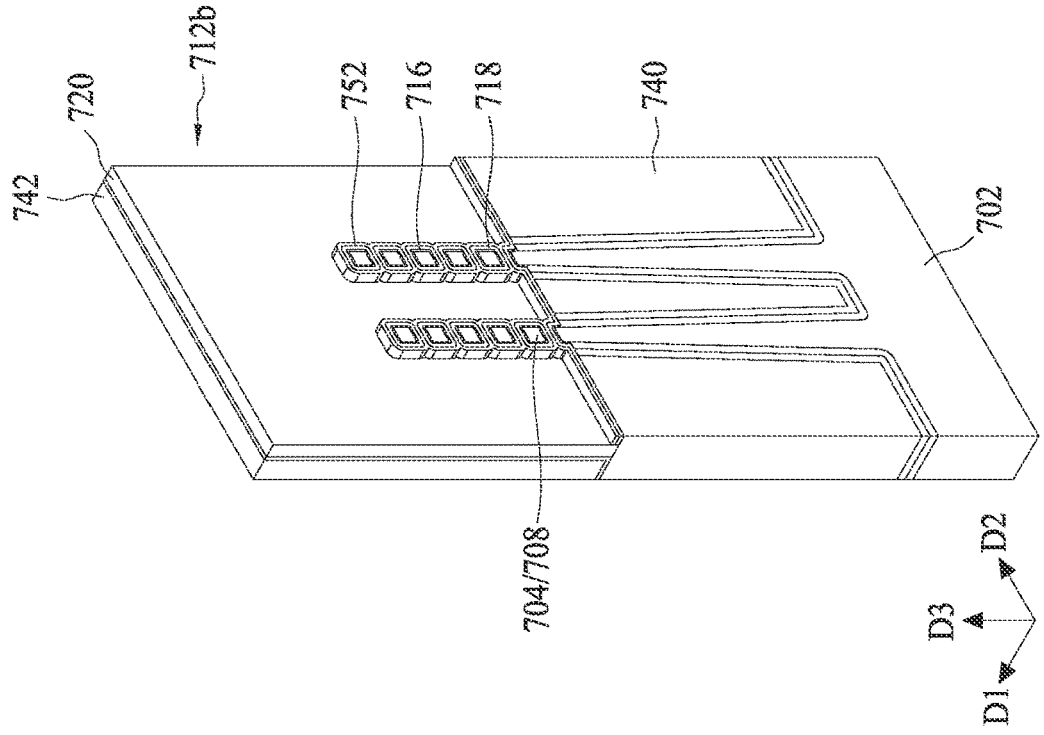
Figure 10O:
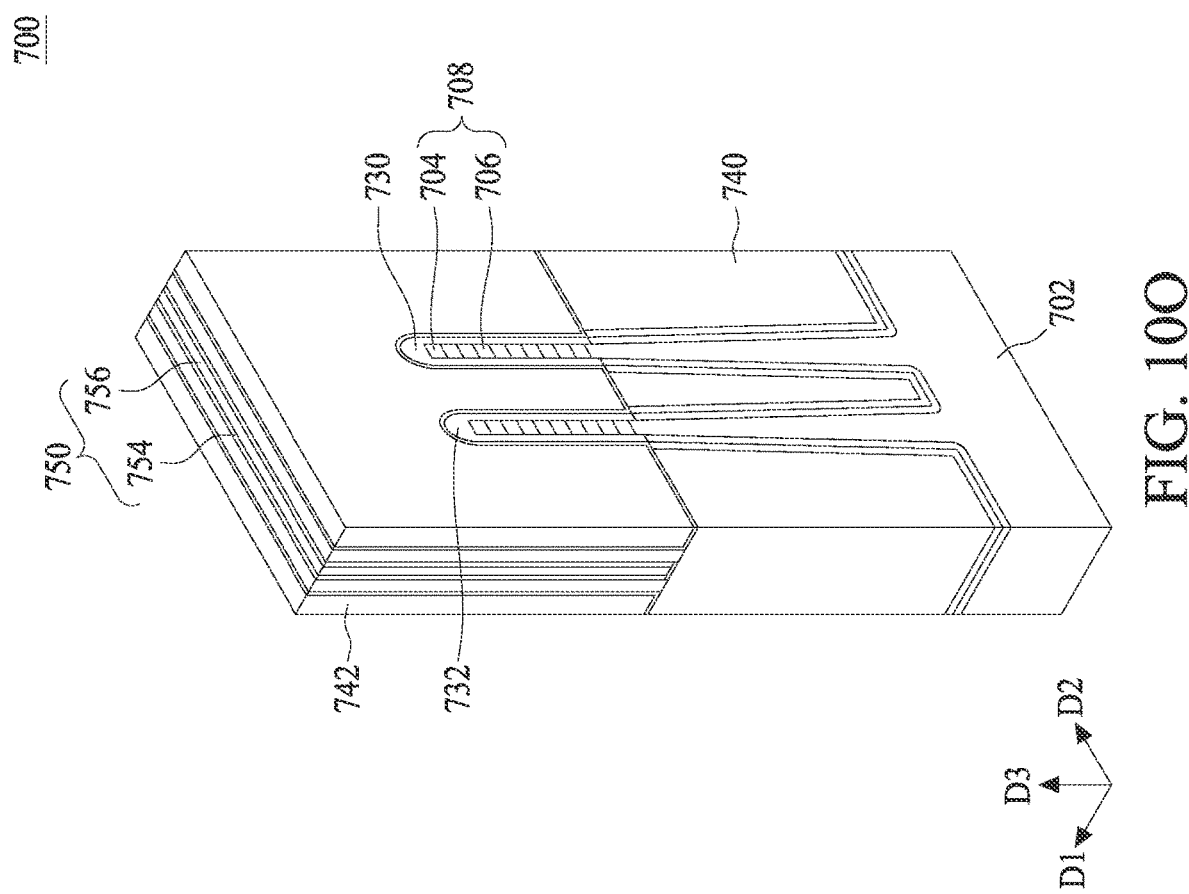

FIG. 10A through FIG. 10O illustrates a multi-gate semiconductor device at various fabrication stages constructed according to aspects of the present disclosure in one or more embodiments. It should be noted that elements the same in FIGS. 3A-3N and FIGS. 10A-10O can include same materials, thus those details for the materials are omitted in the interest of brevity.

Referring to FIG. 10A, a substrate 702 is provided. Fin structures 708 including semiconductor layers is formed over the substrate 702 or a SRB layer. The fin structure 708 may include alternating layers of different compositions. For example, in some embodiments, the fin structure 708 includes semiconductor layers 704 of a first composition alternating with semiconductor layers 706 of a second composition. As mentioned above, the compositions may have different oxidation rates, etchant sensitivity, and/or other differing properties. Further, the fin structure 708 can be extended along a first direction D1 as shown in FIG. 10A. Accordingly, the substrate 702 including the at least one fin structure 708 is provided according to operation 202. Referring to FIG. 10B, a sacrificial insulating structure 740 is disposed over the fin structures 708 and the substrate 702 according to operation 204.

Referring to FIGS. 10C and 10D, a gate trench 712a is formed in the sacrificial insulating structure 740 according to operation 206. Additionally, FIGS. 10D-10F are cut views corresponding line X-X' of FIG. 10C. As shown in FIG. 10D, a portion of the fin structures 708 is exposed from the gate trench 712a. In some embodiments, the gate trench 712a is formed correspondingly to region where channels are to be formed.

Referring to FIG. 10E, the semiconductor layers 706 exposed from the gate trench 712a are then removed. Accordingly, a plurality of wires including the semiconductor layers 704 is obtained and exposed from the gate trench 712a as shown in FIG. 10E. Referring to FIG. 10F, an IL 716 is formed over the semiconductor layers 704 and followed by forming a gate dielectric layer 718 over the semiconductor layers 708 and sidewalls of the gate trench 712a according to operation 208. In some embodiments, a barrier metal layer 752 can be formed over the gate dielectric layer as shown in FIG. 10F. The barrier metal layer 752 can be a part of a gate conductive structure in some embodiments.

Referring to FIGS. 10G-10H, after forming the barrier metal layer 752, a dummy gate structure 710b is then formed in the gate trench 712a according to operation 210 and followed by removing the sacrificial insulating structure 740 according to operation 212. As shown in FIG. 10G, the dummy gate structure 710b is formed to fill the gate trench 712a, and sidewalls of the dummy gate structure 710b are in contact with the barrier metal layer 752. Next, at least a portion of the sacrificial insulating structure 740 is removed. More importantly, the barrier metal layer 752 and the gate dielectric layer 718 over the sidewalls of the dummy gate structure 710b are both removed. Consequently, the sidewalls of the dummy gate structure 710b are exposed as shown in FIG. 10H. Further, portions of the fin structure 708 are exposed from the dummy gate structure 710b while another portions of the fin structures 708 is overlapped by the dummy gate structure 710b. As mentioned above, the portions of the fin structures 708 underlying the dummy gate structure 710b may be referred to as the channel region.

Referring to FIG. 10I, a spacer 720 is then formed over the substrate 702. As shown in FIG. 10I, the spacer 720 covers the sidewalls of the dummy gate structure 710b and exposes the portions of the fin structures 708. Referring to FIG. 10J, a source/drain region 730 and a source/drain region 732 are formed in the portions of the fin structures 708 exposed from the dummy gate structure 710b and the insulating spacers 720. In some embodiments of the present disclosure, the multi-gate semiconductor device 700 is a CMOS device, therefore the source/drain region 730 can be formed for a pFET and the source/drain region 732 can be formed for an nFET.

Referring to FIG. 10K, a dielectric structure 742 is disposed over the substrate 702. As mentioned above, the dielectric structure 742 can include an etch-stop layer (e.g., CESL) (not shown) and various dielectric layers (e.g., an ILD layer) (not shown). In some embodiments, after the CESL and the ILD layer are deposited, a planarization process, such as a CMP operation, may be performed to the dielectric structure 742 and to expose a top surface of the dummy gate structure 710b as shown in FIG. 10K.

Referring to FIGS. 10L-10N, wherein FIGS. 10M-10N are cut views corresponding line X-X' of FIG. 10L, the dummy gate structure 710b is removed to form a gate trench 712b in the dielectric structure 742 after forming the dielectric structure 742 according to operation 216. Since the barrier metal layer 752 is removed from the sidewalls of the gate trench 712b as mentioned above, the insulating spacer 720 is exposed from the sidewalls of the gate trench 712b as shown in FIGS. 10L and 10M. It is noted that the semiconductor layers 704 wrapped by the IL 716, the gate dielectric layer 718 and the barrier metal layer 752 are exposed in the gate trench 712b as shown in FIG. 10M. Next, a gate conductive structure 750 is disposed in the gate trench 712b according to operation 218. As shown in FIG. 10N, a work function metal layer 754 can be formed in the gate trench 712b, and the work function metal layer 754 is in contact with the spacer 720. A gap-filling metal layer 756 is then formed to fill the gate trench 712b and followed by a planarization. Accordingly, the gate conductive structure 750 is obtained as shown in FIG. 10O. More importantly, sidewalls of the gate conductive structure 750, that is the work function metal layer 754, are in contact with the spacer 720 as shown in FIG. 10O.

Figure 11D:
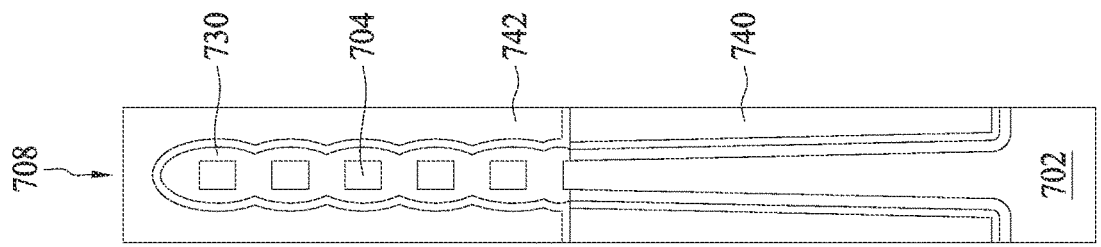
FIG. 11A through FIG. 11D are cross-sectional views of the multi-gate semiconductor device according to aspects of the present disclosure in one or more embodiments.
Figure 11C:
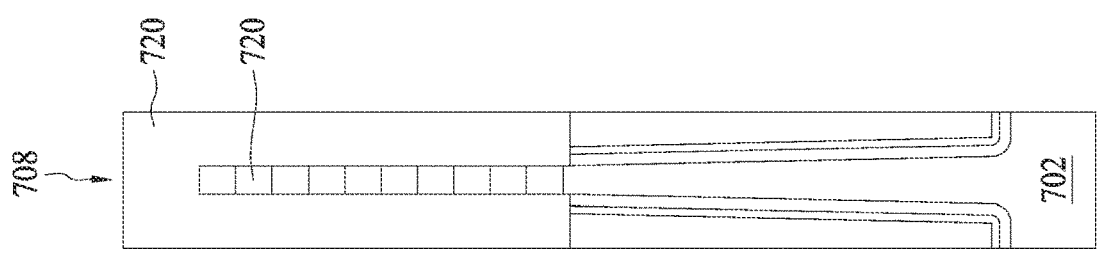
Figure 11B:
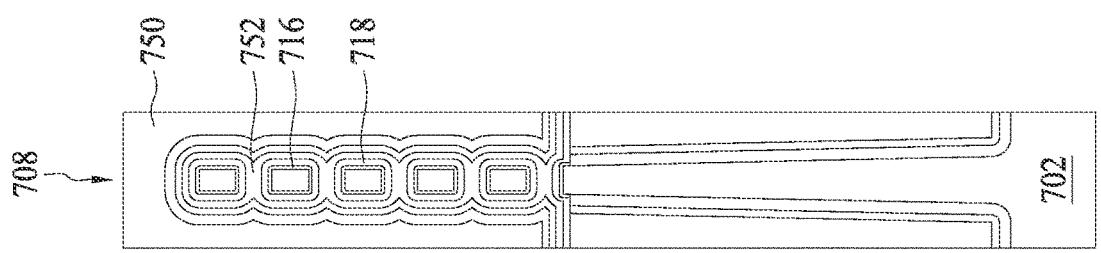
Figure 11A:
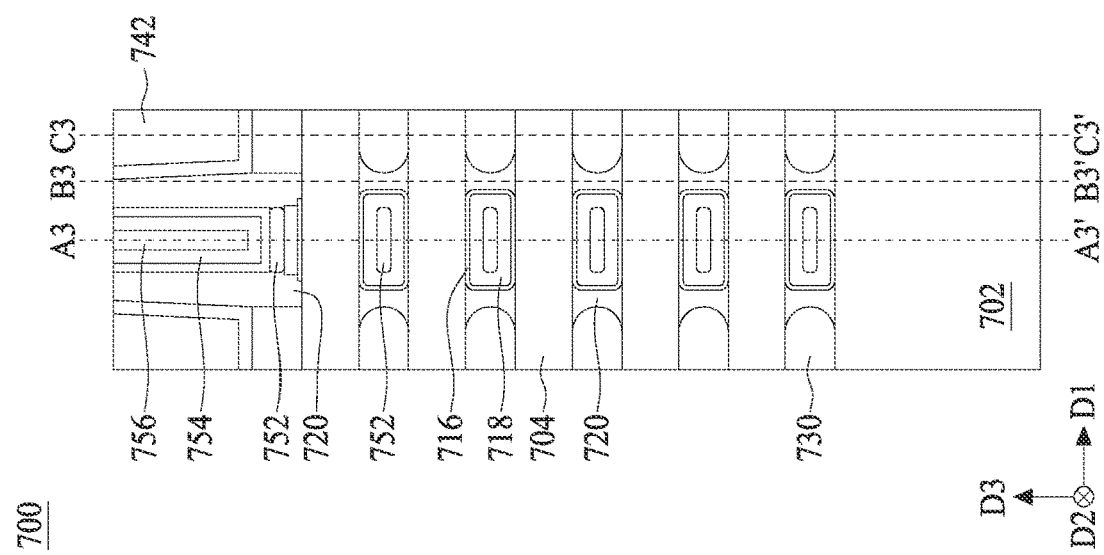

FIG. 11A through FIG. 11D are cross-sectional views of the multi-gate semiconductor device 700 according to aspects of the present disclosure in one or more embodiments. FIG. 11A is a cross-sectional view of the semiconductor device 700 taken along the first direction D1, FIG. 11B is a cross-sectional view taken along line A3-A3' of FIG. 11A, FIG. 11C is a cross-sectional view taken along line B3-B3' of FIG. 11A, and FIG. 11D is a cross-sectional view taken along line C3-C3' of FIG. 11A. Referring to FIGS. 11A-11D, a multi-gate semiconductor device 700 can be provided. The multi-gate semiconductor device 700 includes the substrate 702, the fin structure 708 such as the stacked wire structure 708 disposed over the substrate 702, a gate wrapping the stacked wire structure, and spacer disposed over two sidewalls of the gate. As shown in FIGS. 11A-11D, the gate includes the gate conductive structure 750 and the gate dielectric layer 718 sandwiched between the gate conductive structure 750 and the stacked wire structure. As shown in FIG. 11B, portions of the semiconductor layers 704 are sequentially wrapped by the IL 716, the gate dielectric layer 718, and the barrier metal layer 752 of the gate conductive structure 750. As shown in FIG. 11C, another portions of the stacked wire structure are wrapped by the insulating spacer 720. As shown in FIG. 11D, still another portions of the 704 are wrapped by the source/drain region 730. More importantly, the sidewalls of the gate conductive structure 750, such as the work function metal layer 754, are in contact with the insulating spacer 720.

It will be appreciated that in the forgoing method, operations are taken to form a bottom-up gate dielectric layer. In other words, sidewalls of the gate conductive structure are in contact with the insulating or conductive spacers instead of the gate dielectric layer. Since the gate dielectric layer is not formed over the sidewalls of the gate trench, the gate trench is wider and thus it is easier to form the barrier metal layer, the work function metal layer and the gap-filling metal layer in the gate trench. Consequently, the gate trench filling result is improved even the gate length is scaled down, and device performance can be further improved.

In some embodiments, a multi-gate semiconductor device is provided. The multi-gate semiconductor device includes a plurality of nanostructures vertically stacked over a substrate, a gate dielectric layer wrapping around the plurality of nanostructures, a gate conductive structure over the gate dielectric layer, and a first insulating spacer alongside the gate conductive structure and over the plurality of nanostructures. The first insulating spacer is in direct contact with the gate conductive structure and the gate dielectric layer.

In some embodiments, a multi-gate semiconductor device is provided. The multi-gate semiconductor device includes a stacked wire structure over a substrate, and a gate over the stacked wire structure. The gate includes an interfacial layer wrapping around the stacked wire structure, a gate dielectric layer wrapping around the interfacial layer, and a gate conductive structure wrapping around the gate dielectric layer. The multi-gate semiconductor device also includes an insulating spacer along a sidewall of the gate conductive structure and in direct contact with the sidewall of the gate conductive structure.

In some embodiments, a method for forming a multi-gate semiconductor device is provided. The method includes providing a substrate comprising at least a fin structure, disposing a sacrificial insulating structure over the fin structure and the substrate, forming a first gate trench in the sacrificial insulating structure, wherein a portion of the fin structure is exposed from the first gate trench, disposing a gate dielectric layer over the fin structure, disposing a first dummy gate structure in the first gate trench, removing the sacrificial insulating structure to expose sidewalls of the first dummy gate structure and portions of the fin structure, disposing an insulating spacer over the sidewalls of the first dummy gate structure, removing the first dummy gate structure to form a second gate trench, and disposing a gate conductive structure in the second gate trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A multi-gate semiconductor device, comprising:
   a plurality of nanostructures vertically stacked over a substrate;
   a gate dielectric layer including a first portion wrapping around the plurality of nanostructures and a second portion over the plurality of nanostructures;
   a gate conductive structure over the gate dielectric layer;
   an interfacial layer wrapping around the plurality of nanostructures, wherein the first portion of the gate dielectric layer surrounds the interfacial layer; and
   a first insulating spacer alongside the gate conductive structure and over the plurality of nanostructures, wherein a top surface of the gate conductive structure and a top surface of the second portion of the gate dielectric layer are at different levels.

2. The multi-gate semiconductor device of claim 1, wherein the gate conductive structure comprises a barrier metal layer, a work function metal layer over the barrier metal layer, and a gap-filling metal layer over the work function metal layer, wherein the barrier metal layer includes a vertical portion in direct contact with the first insulating spacer and a horizontal portion in direct contact with the gate dielectric layer.

3. The multi-gate semiconductor device of claim 2, wherein the first insulating spacer includes a portion extending directly below the horizontal portion of the barrier metal layer.

4. The multi-gate semiconductor device of claim 1, further comprising:
   a plurality of inner spacers interposing between the plurality of nanostructures, wherein the plurality of inner spacers is separated from the gate dielectric layer by the interfacial layer.

5. The multi-gate semiconductor device of claim 4, wherein the first insulating spacer and the plurality of inner spacers are made of a continuous dielectric material.

6. The multi-gate semiconductor device of claim 1, further comprising:
   a second insulating spacer alongside the first insulating spacer and over the plurality of nanostructures, wherein the first insulating spacer includes a portion extending directly below the second insulating spacer.

7. The multi-gate semiconductor device of claim 6, further comprising:
   a source/drain region surrounding the plurality of nanostructures, wherein the source/drain region is in direct contact with the first insulating spacer and the second insulating spacer.

8. The multi-gate semiconductor device of claim 1, wherein the gate conductive structure is interfaced with the first insulating spacer.

9. A multi-gate semiconductor device, comprising:
   a stacked nanostructure over a substrate;
   a gate over the stacked nanostructure, the gate comprising:
   an interfacial layer wrapping around the stacked nanostructure;
   a gate dielectric layer wrapping around the interfacial layer, wherein the interfacial layer includes a portion above the stacked nanostructure, the gate dielectric layer includes a portion above the stacked nanostructure, and the portion of the interfacial layer laterally extends beyond an end of the portion of the gate dielectric layer; and
   a gate conductive structure wrapping around the gate dielectric layer; and an insulating spacer along a sidewall of the gate conductive structure and in direct contact with the sidewall of the gate conductive structure.

10. The multi-gate semiconductor device of claim 9, wherein the insulating spacer is further in direct contact with the interfacial layer and the gate dielectric layer.

11. The multi-gate semiconductor device of claim 9, wherein the insulating spacer includes a portion extending between the interfacial layer and the gate dielectric layer.

12. The multi-gate semiconductor device of claim 9, wherein the stacked nanostructure includes a plurality of semiconductor layers vertically stacked and spaced apart from one another.

13. The multi-gate semiconductor device of claim 12, wherein the insulating spacer surrounds four sides of one the plurality of semiconductor layers.

14. The multi-gate semiconductor device of claim 12, further comprising:
a doped epitaxial material surrounding the plurality of semiconductor layers.

15. A multi-gate semiconductor device, comprising:
a plurality of semiconductor layers vertically staked over a substrate;
a barrier metal layer surrounding four sides of each of the semiconductor layers, wherein the barrier metal layer includes a first portion above the plurality of semiconductor layers;
a gate dielectric layer between the barrier metal layer and the plurality of semiconductor layers, wherein the gate dielectric layer includes a first portion above the plurality of semiconductor layers; and
a spacer above the plurality of semiconductor layers and alongside the first portion of the barrier metal layer, wherein the first portion of the gate dielectric layer has a first sidewall interfaced with the spacer, and the first portion of the barrier metal layer vertically overlaps the first sidewall of the first portion of the gate dielectric layer, wherein a portion of the spacer is vertically overlaid with the first portion of the barrier metal layer.

16. The multi-gate semiconductor device of claim 15, further comprising:
a work function metal layer nested within the barrier metal layer; and
a gap-filling metal layer nested within the work function metal layer.

17. The multi-gate semiconductor device of claim 15, wherein the spacer includes a first insulating layer and a second insulating layer between the first insulating layer and the barrier metal layer.

18. The multi-gate semiconductor device of claim 15, further comprising:
a source/drain region surrounding the plurality of semiconductor layers, wherein the source/drain region is in contact with the first insulating layer and the second insulating layer of the spacer.

19. The multi-gate semiconductor device of claim 15, further comprising:
an interfacial layer along the four sides of each of the semiconductor layers, wherein the interfacial layer includes a first portion above the plurality of semiconductor layers, and in a horizontal direction, the first portion of the interfacial layer is longer than the first portion of the gate dielectric layer.

* * * * *